(12) United States Patent
Ooshima

(10) Patent No.: US 6,888,706 B2
(45) Date of Patent: May 3, 2005

(54) MAGNETIC SENSING ELEMENT HAVING HARD BIAS LAYER FORMED ON BIAS UNDERLAYER AND PROCESS FOR MANUFACTURING THE SAME

(75) Inventor: Masahiro Ooshima, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 285 days.

(21) Appl. No.: 10/211,670

(22) Filed: Aug. 2, 2002

(65) Prior Publication Data

US 2003/0030947 A1 Feb. 13, 2003

(30) Foreign Application Priority Data

Aug. 8, 2001 (JP) .......................................... 2001-241079
Aug. 10, 2001 (JP) .......................................... 2001-244312

(51) Int. Cl.[7] .............................................. G11B 5/127
(52) U.S. Cl. ................................................. 360/324.12
(58) Field of Search ........................ 360/324.12, 324.2, 360/324.1, 324.11, 324.3, 327.1, 327.2, 327.23, 126, 119

(56) References Cited

U.S. PATENT DOCUMENTS

| | | | |
|---|---|---|---|
| 5,883,763 A | * | 3/1999 | Yuan et al. .................. 360/324 |
| 5,959,810 A | | 9/1999 | Kakihara et al. |
| 6,128,167 A | | 10/2000 | Saito et al. |
| 6,219,212 B1 | * | 4/2001 | Gill et al. ................. 360/324.2 |
| 6,415,500 B1 | * | 7/2002 | Han et al. ................. 29/603.14 |
| 6,549,384 B1 | * | 4/2003 | Saito et al. ............. 360/324.11 |
| 6,700,752 B1 | * | 3/2004 | Dimitrov et al. ........... 360/317 |
| 2003/0011948 A1 | * | 1/2003 | Saito et al. ............. 360/324.11 |

* cited by examiner

*Primary Examiner*—Allen Cao
(74) *Attorney, Agent, or Firm*—Brinks Hofer Gilson & Lione

(57) ABSTRACT

A trapezoid-like resistive multilayer is formed on a substrate with both side faces as continuous inclined faces. The bias underlayer is formed at a level halfway of each inclined face of the resistive multilayer, and the entire surface of an underlayer of a bias layer is in contact with the bias underlayer. The bias layer is formed on the bias underlayer by being lifted up at a level of a free magnetic layer. The magnetic sensing element comprises a gap layer an antiferromagnetic layer, a pinned magnetic layer and an amorphous conductive layer is formed in each side area of the antiferromagnetic layer, the bias underlayer and bias layer are formed on the amorphous conductive layer from the bottom in this order, and the bias layer is formed as a underlayer of each side area of the antiferromagnetic layer, amorphous conductive layer and bias layer.

29 Claims, 29 Drawing Sheets

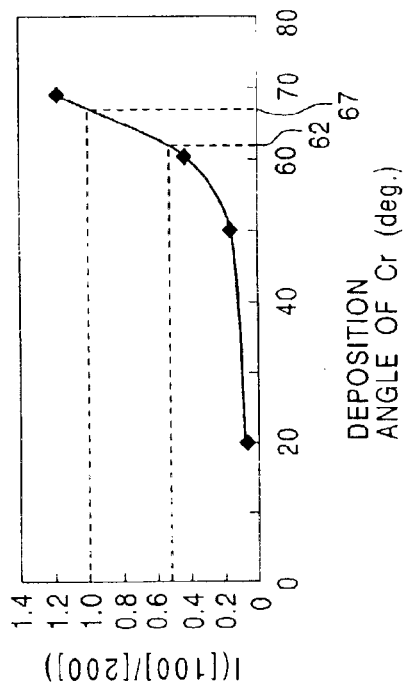
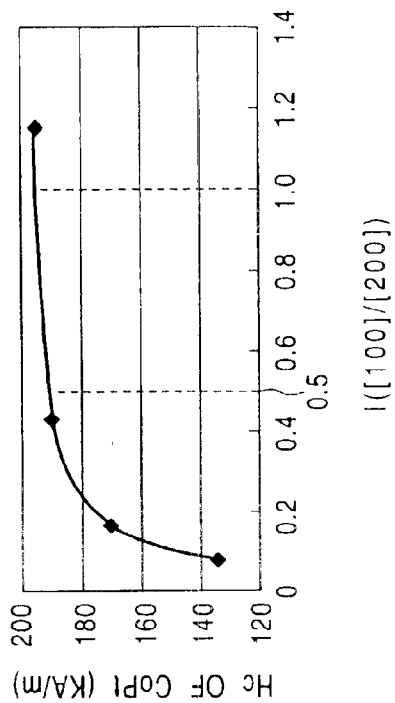
FIG. 5A
| DEPOSITION ANGLE OF Cr | I([100]/[200]) |
|---|---|
| 20 | 0.08 |
| 50 | 0.17 |
| 60 | 0.44 |
| 70 | 1.15 |
FIG. 5C
| I([100]/[200]) | Hc (KA/m) OF CoPt |
|---|---|
| 0.08 | 136 |
| 0.17 | 171 |
| 0.44 | 191 |
| 1.15 | 197 |

FIG. 27A
| DEPOSITION ANGLE OF Cr | I([100]/[200]) |
|---|---|
| 20 | 0.08 |
| 50 | 0.17 |
| 60 | 0.44 |
| 70 | 1.15 |
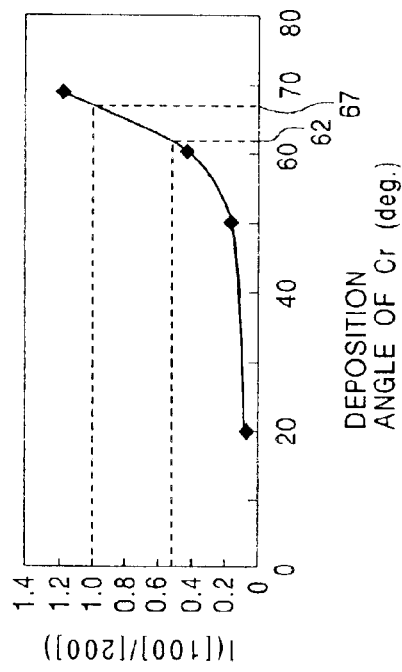
FIG. 27B
FIG. 27C
| I([100]/[200]) | Hc (KA/m) OF CoPt |
|---|---|
| 0.08 | 136 |
| 0.17 | 171 |
| 0.44 | 191 |
| 1.15 | 197 |
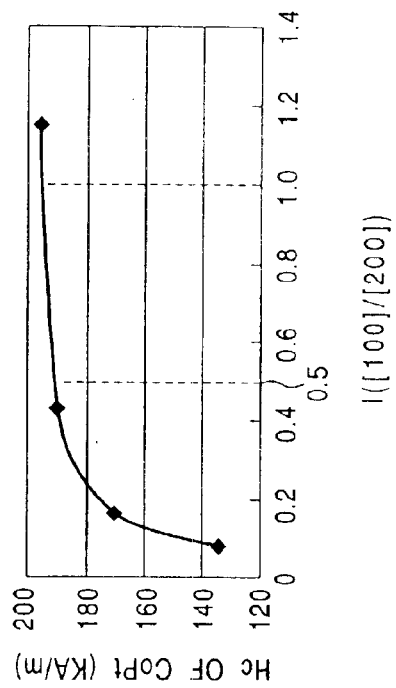
FIG. 27D

MAGNETIC SENSING ELEMENT HAVING HARD BIAS LAYER FORMED ON BIAS UNDERLAYER AND PROCESS FOR MANUFACTURING THE SAME This application claims the benefit of priority to Japanese Patent Applications 2001-241079, filed on Aug. 8, 2001 and 2001-244312, filed on Aug. 10, 2001.

BACKGROUND OF THE INVENTION

1. Field of the Invention

The present invention relates to a magnetic sensing element and a process for manufacturing the same.

2. Description of the Related Art

A magnetic sensing element, for example a spin-valve type magnetic sensing element, comprises at least an antiferromagnetic layer, a pinned magnetic layer, a nonmagnetic conductive layer and a free magnetic layer constituting a resistive multilayer, and a bias layer and an electrode layer are provided in both side areas of the resistive multilayer in the track width direction.

Magnetization of the pinned magnetic layer is aligned to be orthogonal to magnetization of the free magnetic layer in this spin-valve type magnetic sensing element, and the electrical resistance of the resistive multilayer changes in response to magnetization of the pinned magnetic layer when magnetization of the free magnetic layer fluctuates by being influenced by a signal magnetic field from a magnetic recording medium, thereby enabling recorded data on the magnetic recording medium to be regenerated.

FIG. 16 shows a cross section of a spin-valve type magnetic sensing element viewed from an opposed face (ABS face) to a recording medium. In the spin-valve type magnetic sensing element shown in FIG. 16, an antiferromagnetic layer 102 is formed on a gap layer 113 formed on a lower shield layer 112 in a track width direction (the X-direction in FIG. 16), and a pinned magnetic layer 103, a nonmagnetic conductive layer 104, a free magnetic layer 105 and a protective layer 106 are formed on the antiferromagnetic layer 102. A resistive multilayer 107 is composed of a laminate of these layers.

The antiferromagnetic layer 102 is formed of a platinum-manganese (Pt—Mn) alloy in this spin-valve type magnetic sensing element. The magnetization of the pinned magnetic layer 103 is pinned in a height direction (the Y-direction in FIG. 16) by an exchange coupling magnetic field generated at the interface between the antiferromagnetic layer 102 and pinned magnetic layer. The pinned magnetic layer 103 and the free magnetic layer 105 are formed of a nickel-iron (Ni—Fe) alloy, cobalt (Co), an iron-cobalt (Fe—Co) alloy or an iron-cobalt-nickel (Fe—Co—Ni) alloy. The nonmagnetic conductive layer 104 is formed of a nonmagnetic conductive material having a low electrical resistance such as copper (Cu). The resistive multilayer 107 is laminated in the Z-direction as shown in FIG. 16.

A bias underlayer 108 formed of chromium (Cr) and the like is formed on the antiferromagnetic layer 102, and a hard bias layer 109 formed of, for example, a cobalt-platinum (Co—Pt) alloy is laminated on the bias underlayer 108. The reference numeral 110 denotes an electrode formed on the hard bias layer 109.

The bias layer 109 is magnetized in the X-direction (track width direction), the magnetic direction of the free magnetic layer 105 is aligned in the same X-direction by a bias magnetic field from the bias layer 109 in the X-direction.

The bias underlayer 108 is provided for improving magnetic properties of the bias magnetic field generated from the hard bias layer 109. Since the bias layer 109 also serves for aligning the magnetic direction of the free magnetic layer 105, the bias magnetic field applied from the bias layer 109 to the free magnetic layer 105 should be adjusted to its maximum.

Accordingly, terraces 103a are formed in both side areas of the pinned magnetic layer 103 located below the free magnetic layer 105 in the conventional magnetic sensing element shown in FIG. 16, in order to allow thick portions of the bias layers 109 to have direct contact with the free magnetic layer 105.

Since the thick portion of the hard bias layer 109 makes direct contact with the free magnetic layer 105 in the structure shown in FIG. 16, the bias magnetic field may be effectively applied from the hard bias layer 109 to the free magnetic layer 105. However, desired magnetic characteristics may be not always sufficient.

Technical considerations of the phenomena described above will be presented hereinafter. While the bias underlayer 108 is provided in order to improve magnetic properties of the bias layer 109, no bias underlayer 108 is formed under the hard bias layer 109 on the terrace 103a when the terrace 103a of the pinned magnetic layer 103 is noticed.

The hard bias layer 109 is directly bonded to the free magnetic layer 105 on the terrace 103a of the pinned magnetic layer 103, and a bias magnetic field is applied to the free magnetic layer 105 from the bias layer 109 due to the bias magnetic field generated at the interface between them. Consequently, improvements of the magnetic properties of the hard bias layer 109 on the terrace 103a of the pinned magnetic layer 103, where the bias magnetic field is generated, should be particularly emphasized.

However, the expected characteristics cannot be obtained in the conventional example shown in FIG. 16, because no bias underlayer 108, which is to be formed corresponding to the portion where the bias magnetic field is generated, is formed on the terrace 103a of the pinned magnetic layer 103, and the magnetic properties are not improved due to deteriorated coercive force of the hard bias layer 109 at the portion where the bias magnetic field is generated.

FIG. 30 is a cross section of a conventional spin-valve type magnetoresistive element viewed from an opposed face (ABS face) to a recording medium. In the spin-valve type magnetoresistive element shown in the drawing (a first comparative example), an antiferromagnetic layer 102 formed on an underlayer 101 is elongated in a track with Tw direction (the X-direction), and the antiferromagnetic layer 102 at the center of the track width region (referred to as a center in the X-direction for convenience' sake) is projected with an elevation denoted by d1. A pinned magnetic layer 103, a nonmagnetic conductive layer 104, a free magnetic layer 105 and a protective layer 106 are formed on the projected antiferromagnetic layer 102, forming a multilayer 107 comprising the layers from the underlayer 101 through the protective layer 106.

The antiferromagnetic layer 102 is formed of a platinum-manganese (Pt—Mn) alloy layer in the spin-valve type thin film element in a second comparative example. The magnetization of the pinned magnetic layer 103 is pinned in the height direction (Y-direction) due to an exchange coupling magnetic field generated at the interface between the antiferromagnetic layer 102 and pinned magnetic layer. The pinned magnetic layer 103 and the free magnetic layer 105 are formed of a nickel-iron (Ni—Fe) alloy, cobalt, an iron-cobalt (Fe—Co) alloy, an iron-cobalt-nickel (Fe—Co—Ni) alloy and the like. The nonmagnetic conductive layer 104 is formed of a nonmagnetic conductive material having a low electrical resistance such as copper (Cu). The layers are laminated in the Z-direction.

A bias underlayer 108 formed of chromium and the like that serve as buffer layer and orientation layer is formed on each side face from the antiferromagnetic layer 102, formed by being elongated in the X-direction, through side faces on the multilayer 107. A hard bias layer (hard magnetic layer) 109 formed of, for example, a cobalt-platinum (Co—Pt) alloy is laminated on each bias underlayer 108.

The hard bias layer 109 is magnetized in the X-direction (track width direction), and the magnetization of the free magnetic layer 105 is aligned in the same X-direction due to a bias magnetic field in the X-direction from the hard bias layer 109. The hard bias layer 108 enhances the bias magnetic field generated from the hard bas layer 109.

An electrode layer 110 is laminated on the hard bias layer 109 with chromium (Cr), gold (Au), tantalum (Ta) or tungsten (W).

The bias magnetic field generated from the hard bias layer 109 is amplified by forming the bias underlayer 108 from the antiferromagnetic layer 102 through each side face on the multilayer 107. While the hard bias layer 109 is provided in order to align the magnetic direction of the free magnetic layer 105, it is necessary to increase the bias magnetic field generated from the hard bias layer (hard magnetic layer) 109 in the vicinity of the free magnetic layer 105.

In the spin-valve type thin film element having the construction as described above, or having a construction in which the bias underlayer 108 and the hard bias layer 109 are laminated on each antiferromagnetic layer 102 at each side of the central region of the antiferromagnetic layer 102, crystals of the hard bias layer 109 on the antiferromagnetic layer 102 tend to be oriented in a non-preferential direction, thereby arising a trouble by which the magnetic property of the hard bias layer is deteriorated to cause linearity and stability of regenerated waveform to be deteriorated.

In other words, while biasing characteristics of the hard bias layer 109 are strongly dependent on the crystal orientation of the bias underlayer 108 formed during deposition thereof, the crystal orientation of the bias underlayer 108, for example a Cr layer, is conjectured to be changed from its intrinsic crystal orientation by being restricted to the crystal orientation of the antiferromagnetic layer 102 due to the lamination structure with the antiferromagnetic layer 102a located just under the bias underlayer. As a result, the coercive force of the hard bias layer 109 laminated on the bias underlayer 108 is decreased.

Therefore, in the spin-valve type thin film element shown in FIG. 29 (a third comparative example), a multilayer 107 formed on a lower shield layer 112 and lower gap layer 113 is excessively milled before depositing an electrode layer 110 and a hard bias layer 109. In other words, the portions of the antiferromagnetic layer 102 elongating to both sides of the multilayer 107 as well as a part of the lower gap layer 113 located just under the antiferromagnetic layer are removed by over-etching, followed by laminating a bias underlayer 108.

Although good hard bias characteristics may be obtained in the spin-valve type thin film element having the construction as described above, the bias layer 109 is tapered toward the side face of the multilayer 107 (the hard bias layer 109 is thinned in the vicinity of a free magnetic layer 105). Consequently, the hard bias layer 109 cannot be formed with a desired thickness in the vicinity of each side face of the free magnetic layer 105, making it difficult to effectively apply a bias magnetic field generated from the hard bias layer (hard magnetic layer) 109 in the vicinity of the free magnetic layer 105.

Accordingly, it is preferable to remove at least the entire multilayer 107 by milling at both side areas of the multilayer 107, or to apply a more deeper ion-milling (over-etching) of the lower gap layer 113. However, when the both sides of the multilayer are completely removed or a more deeper ion-milling is applied to the lower gap layer, the hard bias layer 109 becomes more tapered to make it difficult to apply an effective magnitude of the bias magnetic layer to the free magnetic layer 105, thereby resulting in deficiency of linearity and stability of the regenerated waveform.

SUMMARY OF THE INVENTION

Accordingly, it is a first object of the present invention to provide a magnetic sensing element in which a bias layer is made to have direct contact with a free magnetic layer without providing a terrace on a pinned magnetic layer to improve magnetic properties of the hard bias layer at the portion in contact with the free magnetic layer, and a process for manufacturing the magnetic sensing element.

It is a second object of the present invention in view of the situations described above to provide a magnetic sensing element having excellent linearity and stability of regeneration waveform.

The present invention for attaining the first object provides a magnetic sensing element comprising a gap layer formed on a substrate, at least an antiferromagnetic layer, a pinned magnetic layer, a nonmagnetic conductive layer and a free magnetic layer that constitute a resistive multilayer laminated on the deposition surface of the gap layer and have a trapezoid-like shape, and bias underlayers and hard bias layers continuously formed in this order from the bottom on both side areas at inclined face sides in both side areas of the trapezoid-like resistive multilayer. The bias underlayer has a bcc crystal structure with a preferential orientation of at least a [211] or [200] face in the direction perpendicular to the layer surface, and is formed with an elevation halfway of the level of the inclined face of the resistive multilayer. The entire bottom face of the hard bias layer is in contact with the bias underlayer, and the hard bias layer is formed on the bias underlayer by being lifted to be flush with the free magnetic layer.

The hard bias layer may be formed of a magnetic material with a preferential orientation of at least the [100] face in the direction perpendicular to the layer surface. The hard bias layer is more preferentially oriented in the [100] face than in the [002] face, and the X-ray diffraction peak height ratio [100]/[002] face of the hard bias layer is desirably 0.5 or more.

The thick portion of the hard bias layer may be formed to be in direct contact with the free magnetic layer when the bias underlayer and hard bias layer have the crystal structures with preferential orientations as described above. Otherwise, the bias underlayer layer may be interposed between the thick portion of the hard bias layer and the free magnetic layer.

It is desirable that amorphous layers are formed in both side areas of the antiferromagnetic layer, and the hard bias layer may be formed by being lifted to be flush with the free magnetic level by two layers of the amorphous phase formed under the hard bias layer and the hard bias layer, when the antiferromagnetic layer has at least both side areas elongating at both sides in track width directions of the resistive multilayer.

Desirably, the antiferromagnetic layer is thinner in both side areas than in the track width region, and the amorphous layer is formed on the both side areas of the antiferromagnetic layer with a desired thickness.

The resistive multilayer may have a structure comprising the antiferromagnetic layer, pinned magnetic layer, nonmagnetic conductive layer and free magnetic layer from the bottom in this order, wherein the pinned magnetic layer comprises a pair of ferromagnetic layers formed with interposition of a nonmagnetic intermediate layer between them, and the magnetic directions of a pair of the ferromagnetic layers are in an antiparallel relation with each other. Alternatively, the resistive multilayer may have a structure comprising the antiferromagnetic layer, pinned magnetic layer, nonmagnetic intermediate layer and free magnetic layer, wherein the free magnetic layer comprises a pair of the ferromagnetic layers formed with interposition of a nonmagnetic intermediate layer between them, and the magnetic directions of a pair of the ferromagnetic layers are in an antiparallel relation with each other.

A seed layer may be formed between the gap layer and antiferromagnetic layer.

The present invention also provides a process for manufacturing a magnetic sensing element comprising the steps of (a) forming a resistive multilayer comprising at least an antiferromagnetic layer, a pinned magnetic layer, a nonmagnetic conductive layer and free magnetic layer on a gap layer of a substrate, (b) patterning the resistive multilayer so as to have a trapezoid-like shape having inclined faces continuously formed from the antiferromagnetic layer through the free magnetic layer, (c) forming bias underlayers in both side areas in a track width direction of the patterned resistive multilayer having a trapezoid-like shape at a level near the elevation of the resistive multilayer, (d) removing the bias underlayer to a depth halfway of the inclined face of the resistive multilayer with masking of the resistive multilayer, and (e) making the entire bottom face of the hard bias layer to contact the bias underlayer by laminating a hard bias layer on the residual bias underlayer while forming the thick portion of the hard bias layer in opposed relation to the free magnetic layer.

The bias underlayer may be deposited by controlling the deposition angle of the bias underlayer comprising a bcc crystal structure so that at least a [211] face or a [200] face is preferentially oriented in the direction perpendicular to the layer surface in the step for forming the bias underlayer. The deposition angle of the bias underlayer is desirably 62° or more.

Preferably, the tapered bias underlayer formed by creeping up the inclined face of the resistive multilayer as a result of the controlled deposition angle of the bias underlayer is completely removed in the step for forming the bias underlayer, thereby removing the bias underlayer to a depth halfway of the inclined face of the resistive multilayer.

The bias underlayer may be removed to a depth halfway of the inclined face of the resistive multilayer, by removing a part of the tapered bias underlayer formed by creeping up the inclined face of the resistive multilayer as a result of the controlled deposition angle of the bias underlayer in the step for forming the bias underlayer.

The deposition angle of the hard bias layer may be controlled at an angle that allows a preferential orientation of at least the [100] face in a direction perpendicular to the layer surface in the step for forming the bias underlayer.

The present invention for attaining the second object also provides a magnetic sensing element comprising a gap layer formed on a substrate, at least an antiferromagnetic layer, a pinned magnetic layer, a nonmagnetic conductive layer and a free magnetic layer, which are formed on the gap layer and constituting a resistive multilayer, and bias underlayers and hard bias layers formed on both side faces in the tack width direction of the free magnetic layer, nonmagnetic conductive layer and pinned magnetic layer of the resistive multilayer. The antiferromagnetic layer has both side areas elongating in both track width directions at least out of the free magnetic layer, nonmagnetic conductive layer and pinned magnetic layer of the resistive multilayer. Amorphous conductive layers are formed on both side areas of the antiferromagnetic layer, and the bias underlayer and hard bias layer are formed on each amorphous conductive layer from the bottom in this order. Each hard bias layer is formed to be flush with the free magnetic layer on both side areas of the antiferromagnetic layer by being lifted up with each amorphous conductive layer and bias underlayer.

It is desirable that the bias underlayer has a bcc crystal structure, and at least a [211] face or [200] face thereof is oriented in the direction perpendicular to the layer surface. The hard bias layer is desirably formed of a magnetic material in which the [100] face is oriented in the direction perpendicular to the layer surface. The hard bias layer may be interposed between the bias underlayer and free magnetic layer.

The amorphous conductive layer is desirably formed of a nonmagnetic material. The amorphous conductive layer may be formed of a Co—T—Z alloy, wherein T is an element comprising at least one of Zr and Hf, and Z is an element comprising at least one of Ta and Nb. Alternatively, the amorphous conductive layer may be formed of a Ni—X alloy, wherein X is an element comprising at least P.

The thickness of each side area on the antiferromagnetic layer is desirably smaller than the thickness of the track width area, and each amorphous conductive layer formed on each side area of the antiferromagnetic layer desirably has a predetermined thickness. Desirably, the amorphous conductive layer has a thickness of 60 Å or more and 300 Å or less.

Otherwise, the resistive multilayer may comprise the antiferromagnetic layer, pinned magnetic layer, nonmagnetic conductive layer and free magnetic layer from the bottom in this order, the pinned magnetic layer may comprise a pair of ferromagnetic layers with interposition of a nonmagnetic intermediate layer between them, and the magnetic directions of a pair of the ferromagnetic layers may be in an antiparallel relation with each other. A seed layer is desirably formed between the gap layer and antiferromagnetic layer.

Or, the resistive multilayer may comprise the antiferromagnetic layer, pinned magnetic layer, nonmagnetic conductive layer and free magnetic layer from the bottom in this order, the free magnetic layer may comprise a pair of ferromagnetic layers with interposition of a nonmagnetic intermediate layer between them, and the magnetic directions of a pair of the ferromagnetic layers may be in an antiparallel relation with each other.

The present invention also provides a process for manufacturing a magnetic sensing element comprising the steps of forming a resistive multilayer comprising at least an antiferromagnetic layer, a pinned magnetic layer, a nonmagnetic conductive layer and a free magnetic layer on a gap layer on a substrate; patterning the conductive multilayer by etching with over-etching of both side faces of the antiferromagnetic layer; forming amorphous conductive layers on both side areas of the over-etched antiferromagnetic layer;

forming bias underlayers on respective amorphous conductive layers; and forming bias layers on respective bias underlayers.

It is desirable to deposit the bias underlayer by controlling the deposition angle of the bias underlayer comprising a bcc crystal structure in the step for forming the bias underlayer so that at least a [211] face or [200] face is oriented in the direction parallel to the layer surface.

Alternatively, the hard bias layer is desirably deposited by controlling the deposition angle of the hard bias layer in the step for forming the hard bias layer so that at least a [100] face is oriented in the direction perpendicular to the layer surface.

BRIEF DESCRIPTION OF THE DRAWINGS

FIG. 5A is a table showing numerical relations between deposition angles of the Cr bias underlayer and X-ray diffraction (XRD) peak ratios of the Co—Pt hard bias layer;

FIG. 5B is a graphic representation of the numeral relations shown in FIG. 5A;

FIG. 5C is a table showing numerical relations between the X-ray diffraction (XRD) peak ratios of the Co—Pt hard bias layer and coercive forces (Hc) of the Co—Pt hard bias layer;

FIG. 5D is a graphic representation of the numeral relations shown in FIG. 5C;

FIG. 27A is a table showing numerical relations between deposition angles of the Cr bias underlayer and XRD peak ratios of the Co—Pt hard bias layer;

FIG. 27B is a graphic representation of the numeral relations shown in FIG. 27A;

FIG. 27C is a table showing numerical relations between the XRD peak ratios of the Co—Pt hard bias layer and coercive forces (Hc) of the Co—Pt hard bias layer;

FIG. 27D is a graphic representation of the numeral relations shown in FIG. 27C;

DESCRIPTION OF THE PREFERRED EMBODIMENTS

Embodiments of the present invention will be described hereinafter with reference to the attached drawings.

Figure 1:
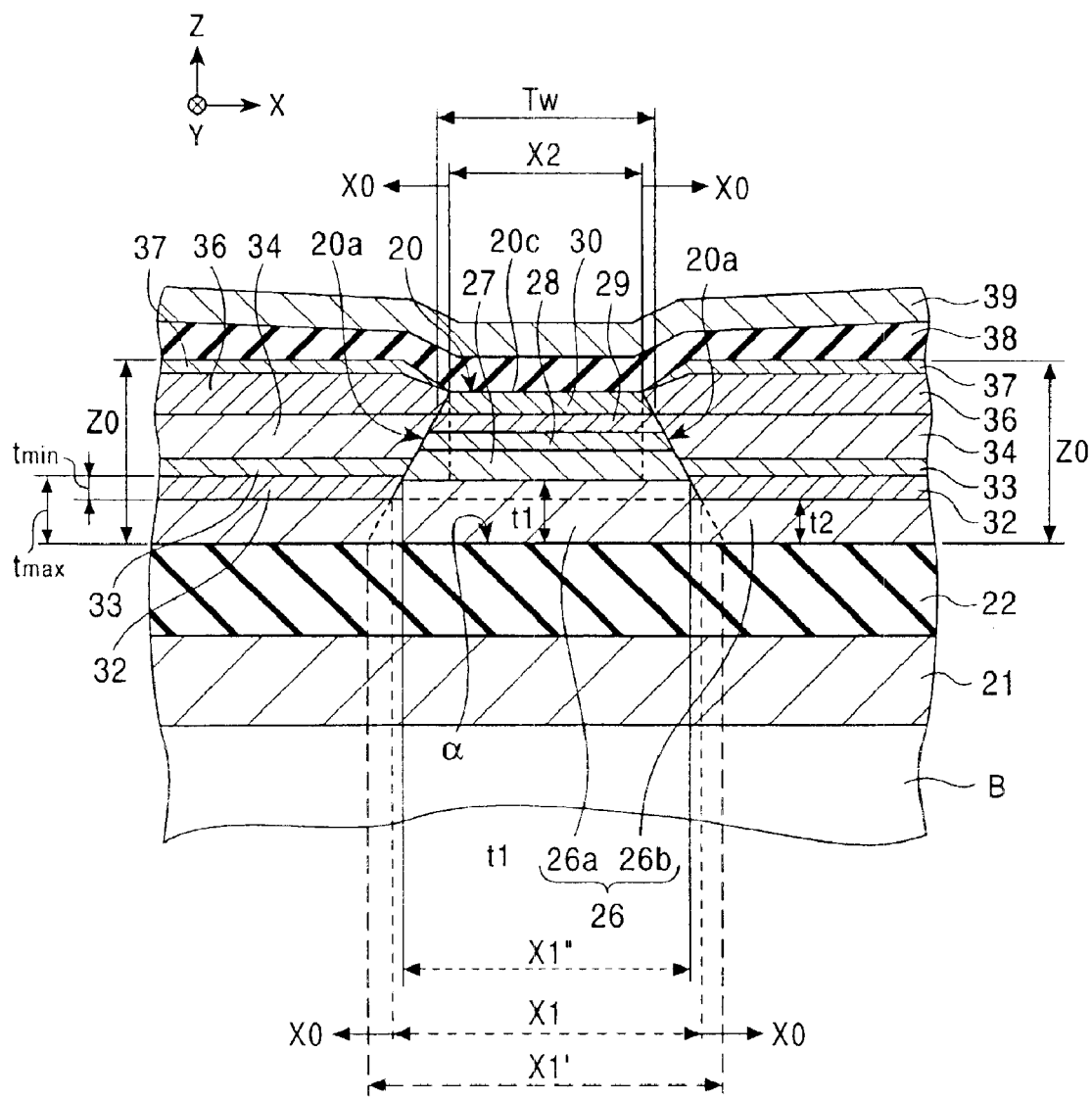
FIG. 1 is a partial cross section of a magnetic sensing element according to the first embodiment of the present invention viewed from an opposed face side to a recording medium.
Figure 2:
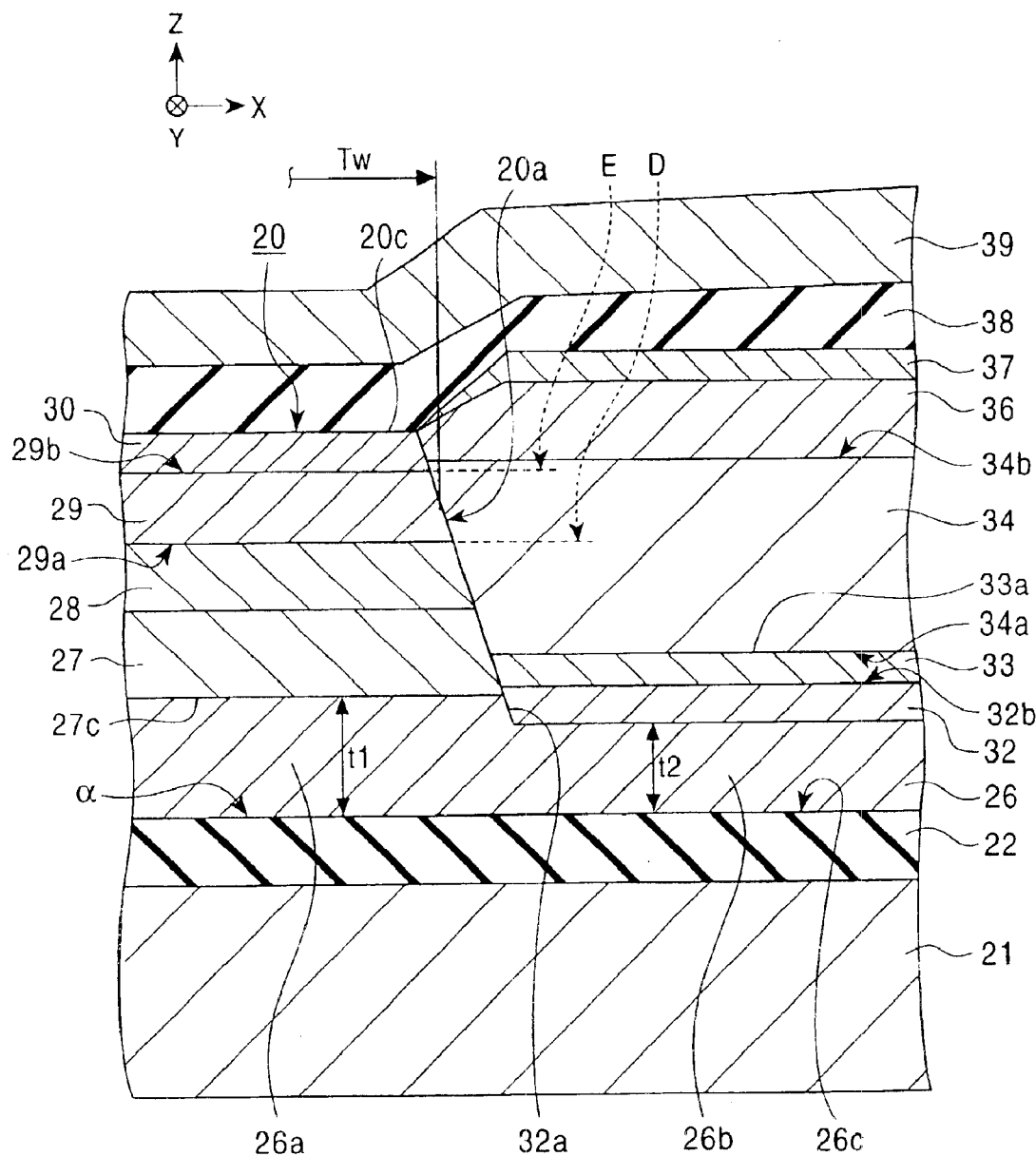
FIG. 2 is a magnified partial cross section at the right side of the magnetic sensing element shown in FIG. 1.

FIG. 1 is a partial cross section of a magnetic sensing element according to the first embodiment of the present invention viewed from an opposed face (ABC face) side to a recording medium, and FIG. 2 is a magnified partial cross section at the right side thereof.

The magnetic sensing element according to the first embodiment is a giant magnetoresistive element for regenerating recorded data on a recording medium. The magnetic sensing element is used for a regenerative magnetic head. Electrical resistance of a resistive multilayer to be described hereinafter changes in accordance with a signal magnetic field from the recording medium, and the recorded data are regenerated by taking advantage of the resistance changes.

While the magnetic sensing element to be used for the regenerative magnetic head is disclosed in FIG. 1, a recording inductive head may be laminated in the Z-direction in FIG. 1 on the resistive multilayer 20 of the magnetic sensing element. The inductive head comprises a core layer formed of a magnetic material and a coil layer wound on the core layer, so that data are written in the recording medium using a magnetic field generated in the core layer by flowing a recording current through the coil layer.

The magnetic sensing element in FIG. 1 to be used for the regenerative magnetic head is provided at a trailing edge face of a slider made of, for example, alumina-titanium carbide ($Al_2O_3$—TiC). This slider is bonded to a flexibly deformable suspension made of a stainless steel material at a back face side of an opposed face to the recording medium, and a magnetic head is constructed with these members.

The magnetic sensing element comprises a lower shield layer 21 made of a magnetic material such as a Ni—Fe alloy or sendust formed on a substrate B, a lower gap layer 22 made of an insulating material such as $Al_2O_3$ or $SiO_2$ formed on the lower shield layer 21, and a resistive multilayer 20 formed on the deposition face α of the lower gap layer 22.

The resistive multilayer 20 is a so-called spin-valve type resistive multilayer. Layers constituting the resistive multilayer 20 will be described hereinafter.

An antiferromagnetic layer 26 is formed on the deposition surface α located on the surface of the lower gap layer 22. This antiferromagnetic layer 26 is formed of, for example, an antiferromagnetic material comprising an element X (X represents at least one of Pt, Pd, Ir, Rh, Ru and Os) and Mn, or an antiferromagnetic material comprising an alloy of elements X and X' (X' represents at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare earth elements) and Mn. The antiferromagnetic layer 26 is usually formed of a Pt—Mn (platinum-manganese) alloy. Both side areas 26b of the antiferromagnetic layer 26 are formed to have a smaller thickness t2 than the thickness t1 in the track width region 26a, and the antiferromagnetic layer 26 is formed to be projected at the central portion on the gap layer 22.

The antiferromagnetic material to be used herein is excellent in corrosion resistance with a high blocking temperature, and is capable of generating a large bias magnetic field at the interface between the antiferromagnetic layer 26 and a pinned magnetic layer 27 formed thereon.

The pinned magnetic layer 27 is formed on the antiferromagnetic layer 26. The pinned magnetic layer 27 is formed of a Ni—Fe alloy, Co—Fe alloy or Co—Ni—Fe alloy. The magnetic direction of the pinned magnetic layer 27 is aligned in the height direction (Y-direction in FIG. 1) by a bias magnetic field generated at the interface between the pinned magnetic layer 27 and antiferromagnetic layer 26 by annealing in a magnetic field applied in the height direction (Y-direction in FIG. 1) after forming the pinned magnetic layer 27 on the antiferromagnetic layer 26. The pinned magnetic layer 27 is formed with a thickness of, for example, about 20 Å or more and about 60 Å or less.

A nonmagnetic conductive layer 28 is formed on the pinned magnetic layer 27. This nonmagnetic conductive layer 28 is formed of a conductive material having low conductivity suck as Cu. The nonmagnetic conductive layer 28 has a thickness of, for example, about 25 Å.

A free magnetic layer 29 is formed on the nonmagnetic conductive layer 28. The free magnetic layer 29 is formed of, for example, a Ni—Fe alloy, Co—Fe alloy, Co or Co—Ni—Fe alloy. The width of the free magnetic layer 29 in the X-direction is formed with a track width Tw that is a dimension corresponding to magnetic regeneration. The free magnetic layer 29 has a thickness of about 20 Å or more and about 40 Å or less. The free magnetic layer 29 may have a Co or Co—Fe layer formed on the side in opposed relation to the nonmagnetic conductive layer 28. This layer serves for preventing metal elements from diffusing at the interface between the free magnetic layer and nonmagnetic conductive layer 28, thereby enabling the rate of change of resistance (ΔGMR) to be increased.

A protective layer 30 is formed on the free magnetic layer 29. The protective layer 30 comprising Ta and the like has a thickness of about 30 Å.

A projection 20c of the resistive multilayer 20 comprising the layers from the antiferromagnetic layer 26 through the protective layer 30—the area having a trapezoid-like shape as viewed from the ABS face (an opposed face to a recording medium) direction, or an area of each layer having a width of X1 at the bottom and a width of X2 at the top (referred to as a track area hereinafter)—is formed to have continuous inclined faces from the upper face level of the antiferromagnetic layer 26 through the upper face level of the protective layer 30 on both side faces 20a and 20a in both track width directions (X-direction in FIG. 1).

The dimension of the track width area changes depending on the amount of over-etching of the antiferromagnetic layer 26. For example, when the amount of over-etching of the antiferromagnetic layer 26 is in maximum, or when the both side areas 26b of the antiferromagnetic layer 26 are completely removed, an amorphous layer 32 to be described hereinafter has a maximum thickness ($t_{max}$), and the track width area has a maximum width of X1'.

When the amount of over-etching of the antiferromagnetic layer 26 is minimum, on the other hand, the amorphous layer 32 to be described hereinafter has a minimum thickness ($t_{min}$), and the track width area has a minimum width of X1". Consequently, both side areas 26b and 26b of the antiferromagnetic layer 26 are formed with elongation in both sides out of the track width Tw of the free magnetic layer 29 in the track width direction.

It has been technically confirmed that the rate of change of electrical resistance of the resistive multilayer 20 tends to be increased when the amount of over-etching of the antiferromagnetic layer 26 is increased to be as large as possible.

The resistive multilayer 20 is formed by forming a lift-off resist (resist R in FIG. 8) only on the central portion of the resistive multilayer 20 after depositing each layer on the deposition surface α of the lower gap layer 22, followed by removing both side areas of the resistive multilayer 20 that are not covered with the resist by etching such as ion-milling. Then, the both side faces 20a and 20a of the projection 20c of the resistive multilayer 20 are etched as continuous inclined faces (each of the both side faces 20a and 20a are represented by an inclined face 20a), which form a trapezoid-like convex shape.

A part of the antiferromagnetic layer 26 is left behind, and all of the remaining layers thereon are removed to form a convex portion having a trapezoid-like shape as shown in FIG. 1 in this embodiment with respect to each layer located at outside of the inclines faces (both side faces) 20a and 20a of the projection 20c of the trapezoid-like resistive multilayer 20, or each layer located from the remotest area through the closest area to the track width area in the track width direction and in the area simultaneously satisfying the widths X0 and Z0 (referred to as both side areas hereinafter). The track region of the antiferromagnetic layer 26 is formed into a convex shape by over-etching, and amorphous layers 32 are formed on the over-etched portions at both sides of the convex shape antiferromagnetic layer 26 in the track width direction.

The antiferromagnetic layer 26 at both side areas may be completely removed, as will be described hereinafter, by over-etching so that the deposition face α of the lower gap layer 22 is exposed at both side areas of the convex shape antiferromagnetic layer 26. As shown in FIG. 1, amorphous layers 32, bias underlayers 33, hard bias layers 34, electrode layers 36 and protective layers 37 are formed from the bottom in this order in both side areas of the resistive multilayer 20 having a trapezoid-like convex shape. Each layer will be described mainly with reference to FIG. 2.

FIG. 2 is a partially enlarged cross section of the right side part of the magnetic sensing element shown in FIG. 1. As shown in FIG. 2, the amorphous layer 32 is formed on each side area of the convex shape antiferromagnetic layer 26 of the resistive multilayer 20, particularly on each side area 26b after over-etching, and the side face 32a at the resistive multilayer 20 side of the amorphous layer 32 is formed to be in contact with one of the both side faces (inclined faces) 20a of the resistive multilayer 20. The amorphous layer 32 is also formed on each side area 26b of the antiferromagnetic layer 26 having a smaller thickness t2 than the thickness t1 of the antiferromagnetic layer in the track area 26a, thereby ensuring a desired thickness. The amorphous layer 32 desirably has a thickness of 60 Å or more and 300 Å or less.

The amorphous layer 32 is provided so that the crystal orientation of each of the bias underlayer 33 and hard bias layer 34 formed on the amorphous layer is not adversely affected by crystal orientation characteristics of the antiferromagnetic layer 26 located just under the amorphous layer 32. In other words, the amorphous layer 32 in an amorphous state, in which the crystal orientation is not ordered, functions so that the crystal orientation of the antiferromagnetic layer 26 does not adversely affect the crystal orientation of the bias underlayer 33 by interposition of the amorphous layer between the antiferromagnetic layer and bias underlayer. However, no amorphous layer 32 will be needed when the crystal orientation of the antiferromagnetic layer 26 has no effect on the crystal orientation of the bias underlayer 33.

The amorphous layer 32 also functions as a lift-up base of the bias underlayer 33 and hard bias layer 34 as will be described hereinafter. The hard bias layer 34 formed with interposition of the amorphous layer may be formed by being lifted up in both side areas 20a of the projection 20c of the resistive multilayer 20, thereby allowing each hard bias layer 34 to face each side of the free magnetic layer 29 with a sufficient volume. The amorphous layer 32 is formed with a thickness in the range of 60 to 300 Å so as not to adversely affect the crystal orientation of the bias underlayer 33. However, the bias underlayer 33 and hard bias layer 34 may be elevated at the level of the free magnetic layer 29 by a different layer in place of the amorphous layer 32, when the crystal orientation of the antiferromagnetic layer 26 does not affect the crystal orientation of the bias underlayer 33. Since the bias underlayer 33 is formed at the bottom surface 34a of the hard bias layer 34 formed so as to face the interface between the hard bias layer 34 for generating a bias magnetic field and the free magnetic layer 29, the coercive force of the hard bias layer 34 is improved at the portion where the bias magnetic field is generated, thereby enabling the magnetic properties to be improved with desired magnetic characteristics.

The amorphous layer 32 is deposited by ion beam irradiation from an approximately perpendicular direction to the antiferromagnetic layer 26 on the deposition face α of the lower gap layer 22 in a sputtering-deposition step in the manufacturing process to be described hereinafter. The amorphous layer 32 is in particular deposited by an ion-beam sputtering method, a long-throw-sputtering method or a collimation sputtering method. Since a part of the amorphous layer 32 is adhered on the inclined face 20a of the projection 20c of the resistive multilayer 20 by sputtering so as to creep up the inclined face forming a taper, the tapered excessive amorphous layer 20 adhered on the inclined face 20a of the projection 20c of the resistive multilayer 20 by creeping up the inclined face is removed by etching. However, the tapered amorphous layer 32 on the inclined face 20a is not always required to be removed particularly when the amorphous layer 32 is conductive.

The upper face 32b of the amorphous layer 32 is preferably located at a higher level than the lower face 27c of the pinned magnetic layer 27 (Z-direction in FIG. 1). This enables the hard bias layer 34 to be formed by being lifted up at the elevation of the free magnetic layer 29 in both side areas of the projection 20c of the conductive multilayer 20, thereby enabling the thick portion of each hard bias layer 34 to face both sides of the free magnetic layer 29 with a sufficient volume.

The bias underlayer 33 is formed on the amorphous layer 32. At least the [211] or [200] face of the bias underlayer 33 comprising a bcc crystal structure is preferentially oriented in the direction perpendicular to the layer surface, and is formed at a level halfway of the elevation of the inclined face 20a of the projection 20c of the resistive multilayer 20. The entire surface of the lower face 34a of the hard bias layer 34 is formed on the bias underlayer 33 to be in contact with the upper face 33a of the bias underlayer 33 so that the hard bias layer 34 is formed by being lifted up to the elevation of the free magnetic layer 29 on the bias underlayer 33. The hard bias layer 34 is formed on the bias underlayer 33 with a preferential orientation of at least the [100] face in the direction perpendicular to the layer surface.

Figure 3:
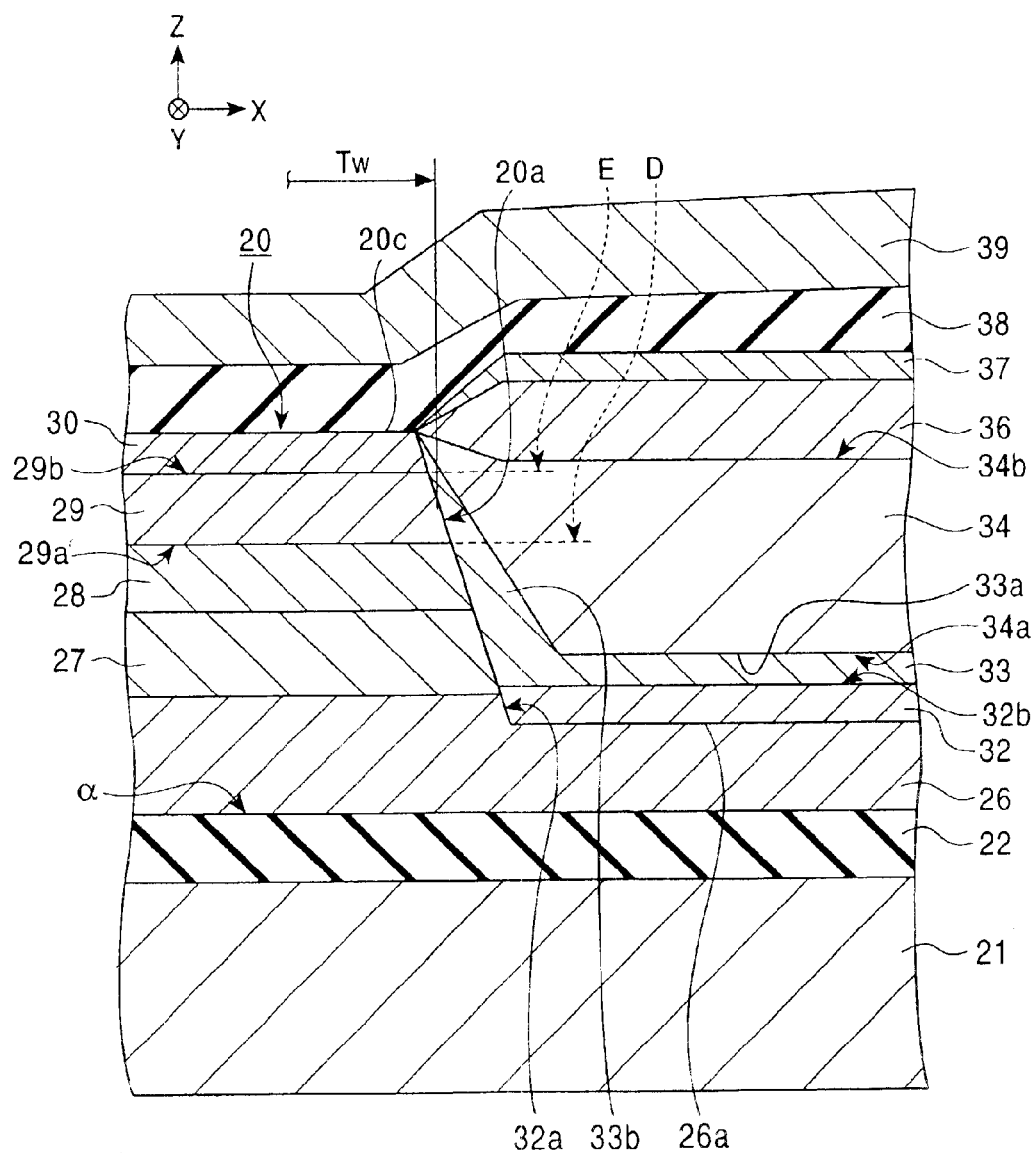
FIG. 3 is a magnified partial cross section at the right side of the magnetic sensing element according to the second embodiment of the present invention.

When the bias underlayer 33 and hard bias layer 34 have the crystal structure with the preferential orientations as described above, the thick portion of the hard bias layer 34 may be formed in direct contact with the free magnetic layer 29 as shown in FIGS. 1 and 2. In addition, the tapered bias underlayer 33b, which creeps up the inclined face 20a of the projection 20c of the resistive multilayer 20, may be formed so as to interpose between the thick portion of the hard bias layer 34 and free magnetic layer 29 as shown in FIG. 3. In the structure in which the thick portion of the hard bias layer 34 is in direct contact with the free magnetic layer 29 as shown in FIGS. 1 and 2, on the other hand, a large bias magnetic field is efficiently applied to the free magnetic layer 29 by a ferromagnetic coupling between the hard bias layer 34 and free magnetic layer 29.

The relation between the preferential orientations of the bias underlayer 33 and hard bias layer 34, and the coercive force (Hc) of the hard bias layer 34 will be described hereinafter with reference to FIGS. 4A to 4C, and FIGS. 5A to 5D.

The X-ray diffraction (XRD) peak ratio dependent on the deposition angle of the bias underlayer 33 was experimentally verified with respect to the bias underlayer 33 made of Cr and the hard bias layer 34 made of the Co—Pt alloy.

Figure 4A:
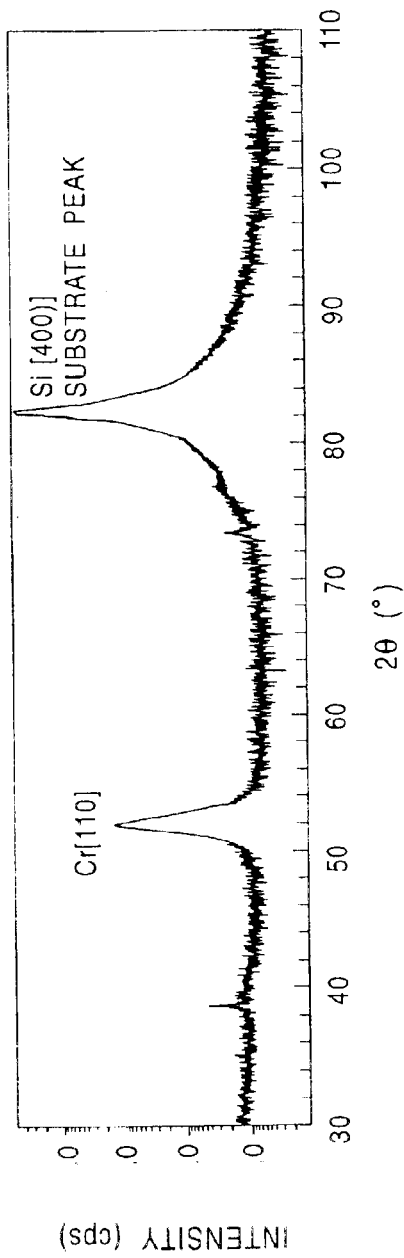
FIG. 4A is a X-ray diffraction diagram showing an orientation of a Cr layer deposited at an angle of 20°.
Figure 4B:
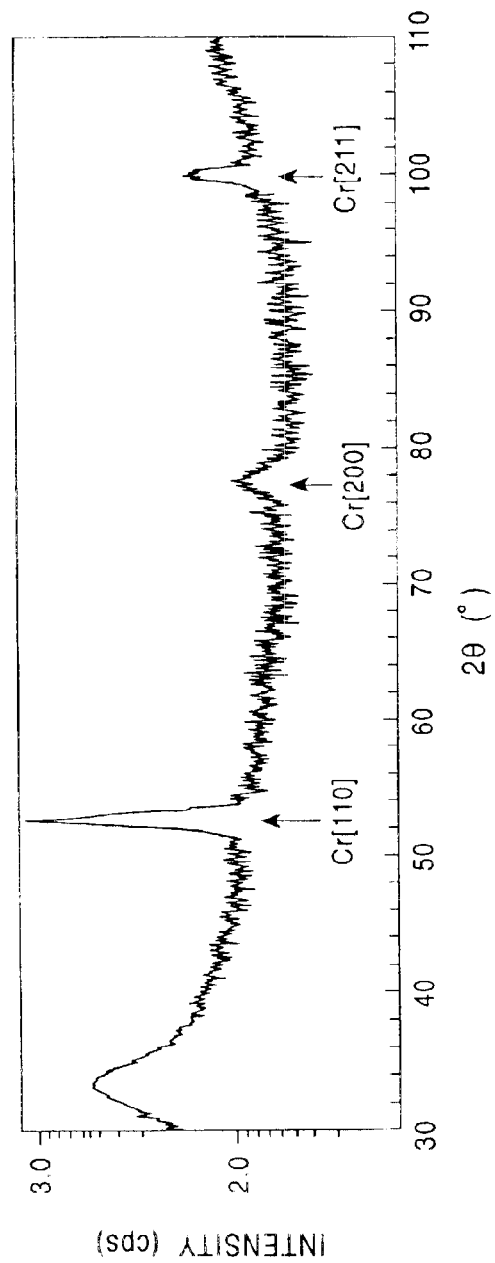
FIG. 4B is a X-ray diffraction diagram showing an orientation of a Cr layer deposited at an angle of 50°.
Figure 4C:
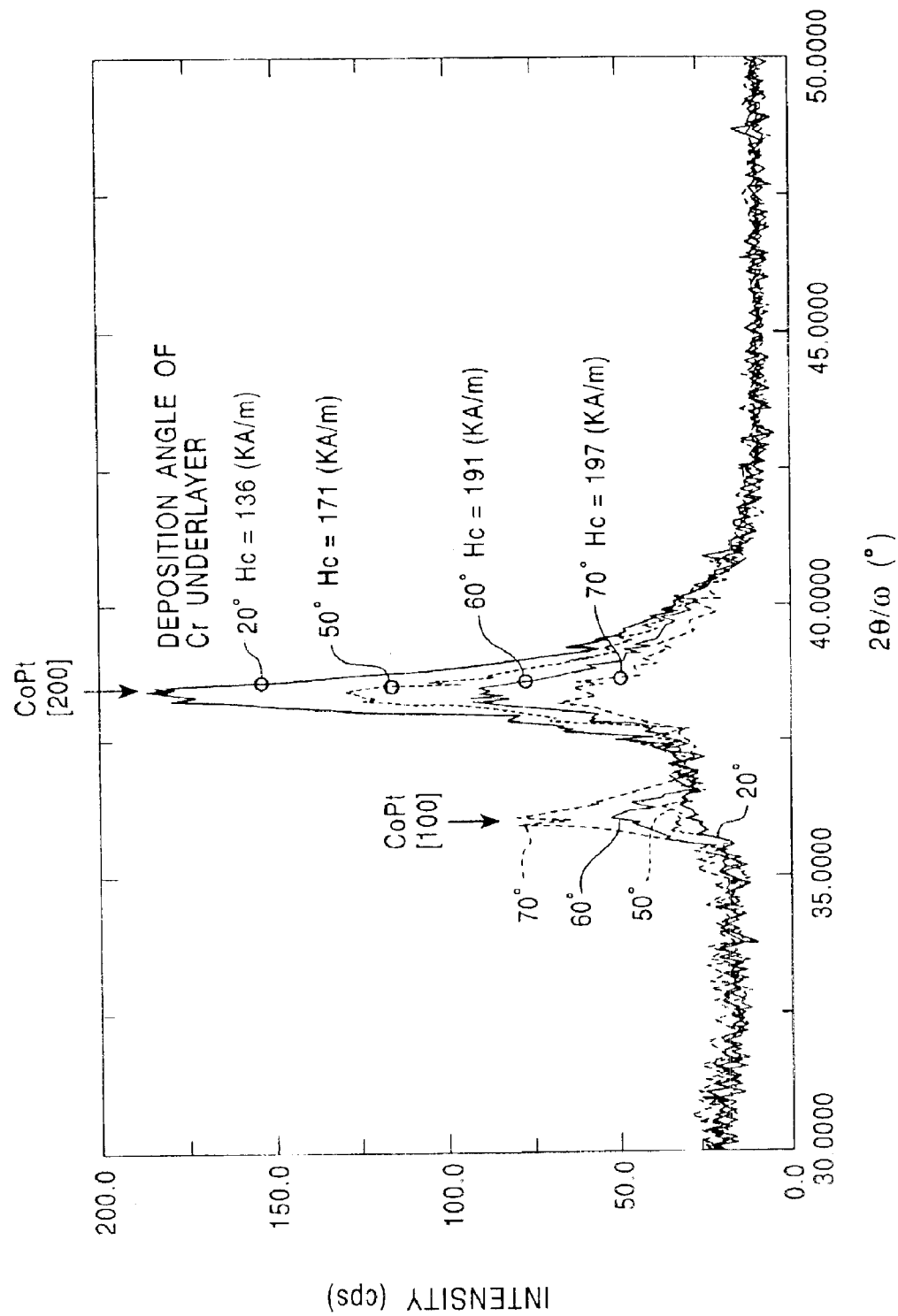
FIG. 4C is a multi-recording X-ray diffraction diagram showing orientations and coercive forces of the Co—Pt alloy layer dependent on deposition angles of the Cr layer.

FIG. 4A is a X-ray diffraction diagram showing the orientation of the Cr layer (the bias underlayer 33) deposited at an angle of 20°, and FIG. 4B is a X-ray diffraction diagram showing an orientation of the Cr layer(the bias underlayer 33) deposited at an angle of 50°. FIG. 4C is a multi-recording X-ray diffraction diagram showing the orientations and coercive forces of the Co—Pt alloy layer (hard bias layer 34) dependent on the deposition angles of the Cr layer (bias underlayer 33). FIG. 5A is a table showing the numerical relations between the deposition angles of the Cr layer used as the bias underlayer 33 and X-ray diffraction (XRD) peak ratios between the [200] face and [100] face of the Co—Pt alloy layer used as the hard bias layer 34. FIG. 5B is a graphic representation of the numeral relations shown in FIG. 5A. FIG. 5C is a table showing numerical relations between the X-ray diffraction (XRD) peak ratios between the [200] face and [100] face of the Co—Pt layer used as the hard bias layer 34 and the coercive forces (Hc) of the hard bias layer 34 comprising the Co—Pt alloy. FIG. 5D is a graphic representation of the numeral relations shown in FIG. 5C.

Figure 10:
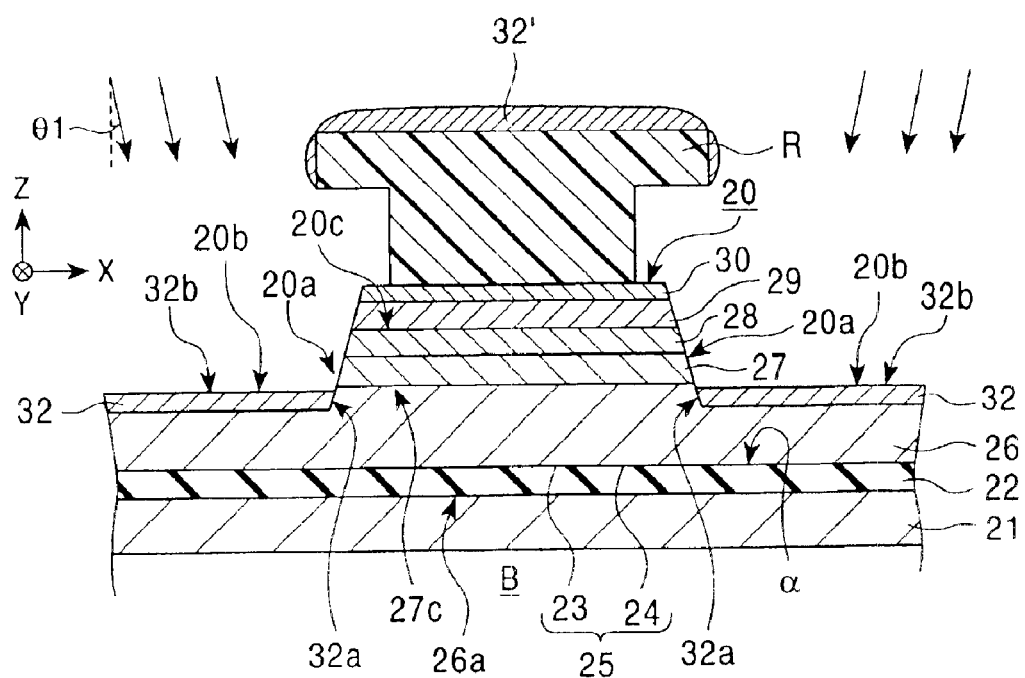
FIG. 10 shows a third step of the process for manufacturing the magnetic sensing element shown in FIG. 1.
Figure 11:
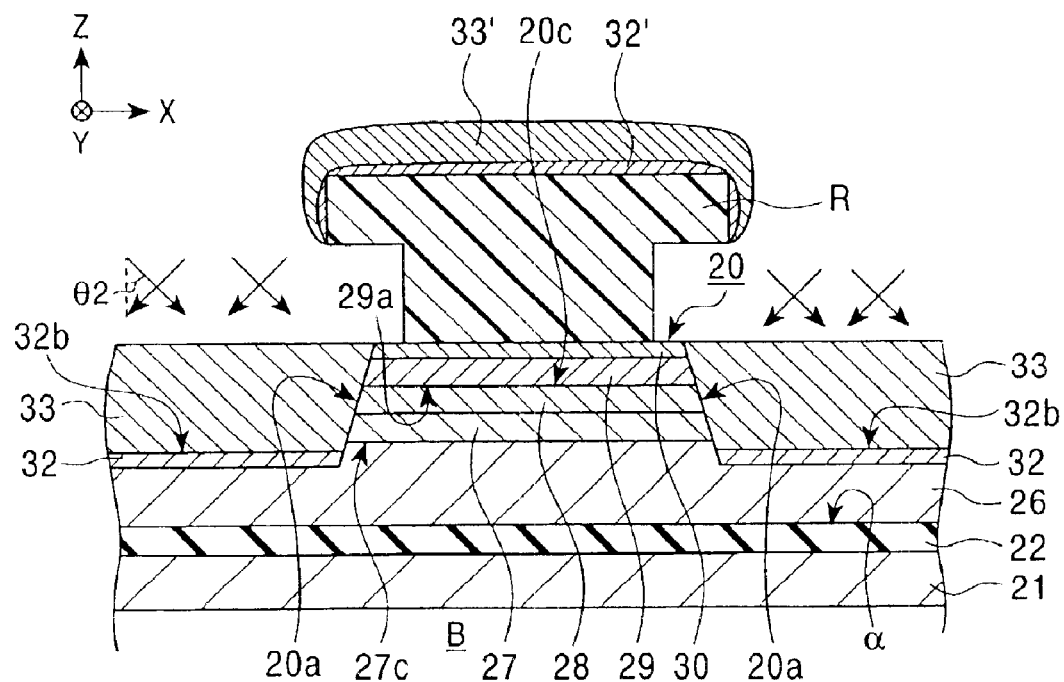
FIG. 11 shows a forth step of the process for manufacturing the magnetic sensing element shown in FIG. 1.

The deposition angle of the bias underlayer 33 comprising the Cr layer and the deposition angle of the bias underlayer 34 comprising the Co—Pt alloy layer are set at an incident angle of the sputtering particles relative to the direction perpendicular to the substrate B (correspond to θ1 and θ2 in FIGS. 10 and 11, respectively). The deposition angle of the Co—Pt alloy layer is controlled to be set at an angle of 20°. The coercive force (Hc) retained by the Co—Pt alloy layer as the hard bias layer 34 is related to the orientation peak ratio (I([100]/[200])) between the [100] face and [200] face of the oriented Co—Pt layer. The inventors of the present invention have verified the relations as shown in FIG. 4C, wherein coercive force (Hc) of the Co—Pt layer increases by decreasing the orientation peak of the [200] face with an increase of the orientation peak of the [100] face and, on the contrary, coercive force (Hc) of the Co—Pt layer decreases by increasing the orientation peak of the [200] face with a decrease of the orientation peak of the [100] face.

As shown in FIG. 4A, the Cr layer is only oriented with the [110] face perpendicular to the layer surface when the Cr layer as the bias underlayer 33 is deposited at an angle of 20°. Then, the peak ratio (I([100]/[200]) between the [100] face and [002] face of the Co—Pt layer (the hard bias layer 34) decreases with a decrease of the coercive force (Hc; 136 KA/m) of the Co—Pt layer as shown in FIGS. 5C and 5D.

When the deposition angle of the Cr layer as the bias underlayer 34 is set an angle of 50°, or the incident angle of the Cr particles is tilted toward the substrate B side, as shown in FIG. 4B, on the other hand, the [110] face and [211] face of the Cr layer are preferentially oriented in addition to the [110] face to consequently increase the peak ratio (I([100]/[200]); 0.15) between the [100] face and [200] face of the Co—Pt layer as shown in FIGS. 5A and 5B, thereby enabling the coercive force (Hc) of the Co—Pt layer to be increased (171 KA/m) as shown in FIGS. 5C and 5D.

When the deposition angle of the Cr layer as the bias underlayer 34 is set at an angle of 60°, or the incident angle of the Cr particles are tilted toward the substrate B side (horizontal face side), the [200] face and [211] face as well as the [110] face of the Cr layer are preferentially oriented in addition to consequently increase the peak ratio (I([100]/[200]); 0.44) between the [100] face and [200] face as shown in FIGS. 5A and 5B, thereby enabling the coercive force (Hc) of the Co—Pt layer to be increased (191 KA/m) as shown in FIGS. 5C and 5D.

When the deposition angle of the Cr layer as the bias underlayer 34 is set at an angle of 70°, or the incident angle of the Cr particles are further tilted toward the substrate B side (horizontal face side), the [200] face and [211] face as well as the [110] face of the Cr layer are preferentially oriented to consequently increase the peak ratio (I([100]/[200]); 1.15) between the [100] face and [200] face as shown in FIGS. 5A and 5B, thereby enabling the coercive force (Hc) of the Co—Pt layer to be increased (197 KA/m).

A coercive force (Hc) of the Co—Pt layer of 160 KA/m or more as the hard bias layer 34 is sufficient for practical uses. The inventors of the present invention have verified that the coercive force of the hard bias layer 34 can be enhanced by controlling the Cr layer as the bias under layer 33 to be deposited so that at least the [200] face or [211] face of the bias underlayer 33 is preferentially oriented in the direction perpendicular to the layer surface, and by controlling the Co—Pt layer as the hard bias layer 34 to be deposited so that at least the [100] face of the hard bias layer 34 is preferentially oriented in the direction perpendicular to the layer surface. The coercive force of the hard bias layer 34 is increased in the construction of the present invention based on the results as hitherto described, wherein the bias underlayer 33 comprises a bcc crystal structure with at least the [211] face and [200] face preferentially oriented in the direction perpendicular to the layer surface, and at least the [100] face of the hard bias layer 34 is preferentially oriented in the direction perpendicular to the layer surface.

The peak ratio (I[100]/[200]) between the [100] face and [200] face of the Co—Pt layer as the hard bias layer 34 is preferably 0.5 or more as shown in FIG. 5D. The ratio in the range described above permits a stable coercive force (Hc) of about 190 KA/m or more to be obtained to enable a sufficient bias magnetic field to be supplied to the free magnetic layer 29. The deposition angle corresponding to the conditions above is preferably 62° or more. More preferably, the peak ratio (I[100]/[200]) is 1.0 or more. The coercive force (Hc) of the hard bias layer may be increased by preferential orientation of the [100] face to the [200] face. Accordingly, the peak ratio (I[100]/[200]) between the [100] face and [200] face of the Co—Pt alloy layer as the hard bias layer 34 is preferably 1.0 or more, because the ratio in this range permits a coercive force (Hc) of about 197 KA/m to be obtained, thereby enabling a sufficient bias magnetic field to be supplied to the free magnetic layer 29 to be obtained. The preferable deposition angle for obtaining the coercive force in the range as described is 67° or more.

The Co—Pt layer was used as the hard bias layer 34 in the foregoing descriptions, which may be valid for the materials to be described hereinafter. Not only the Cr layer but also other materials may be used for the bias underlayer 33, and any materials may be principally used so long as they have the bcc crystal structure suitable for use as the bias underlayer 33. It is also confirmed that the hard bias layer 34 may be deposited at around the angles of 5° to 40°.

It is proposed in the present invention that, when the bias underlayer 33 and hard bias layer 34 have the preferentially oriented crystal structure as hitherto described, the thick portion of the hard bias layer 34 may be formed in direct contact with the free magnetic layer 29 as shown in FIGS. 1 and 2. Furthermore, the tapered bias underlayer 33b formed by creeping up the inclined face 20a of the projection 20c of the resistive multilayer 20 may interpose between the thick portion of the hard bias layer 34 and free magnetic layer 29.

The reason above will be described hereinafter. For example, when the bias underlayer 33 comprising the Cr layer is deposited with a large deposition angle, or when the bias underlayer 33 is deposited from an angle tilted toward the substrate B side, the sputtering particles tend to be deposited as a tapered shape creeping up the inclined face 20a of the projection 20c of the resistive multilayer 20 (see FIG. 3). Since the tapered hard bias layer 33b is formed with a preferential orientation of at least the [200] face or [211] face with a large inclination angle (an angle inclined in the substrate B side), the coercive force (Hc) of the hard bias layer 34 may be increased by interposition of the bias underlayer 33b between the thick portion of the hard bias layer 33 and free magnetic layer 34 as shown in FIG. 3.

Accordingly, the tapered bias underlayer 33b creeping up the inclined face 20a of the resistive multilayer 20 may interpose between the thick portion of the hard bias layer 34 and free magnetic layer.

The coercive force (Hc) of the hard bias layer 34 increases by allowing the entire surface of the lower face 34a of the hard bias layer 34 to contact the upper face 33a of the bias underlayer 33, and by forming the bias underlayer 33 under the hard bias layer 34 at the interface between the thick portion of the hard bias layer 34 for forming a bias magnetic field and the free magnetic layer 29. Accordingly, the hard bias layer 34 can retain a sufficient coercive force by forming a direct bond between the thick portion of the hard bias layer 34 and free magnetic layer 29, after removing the tapered bias underlayer 33b, which is formed by creeping up the inclined face 20a of the projection 20c of the resistive multilayer 20, by etching.

Accordingly, the thick portion of the hard bias layer 34 may be formed in direct contact with the free magnetic layer 29 as shown in FIGS. 1 and 2, when the bias underlayer 33 and hard bias layer 34 has the preferentially oriented crystal structures. A large bias magnetic field is applied to the free magnetic layer 29 by a ferromagnetic coupling between the hard bias layer 34 and free magnetic layer 29, when the thick portion of the hard bias layer 34 is formed in direct contact with the free magnetic layer 29.

More preferably, the upper face 34b of the hard bias layer 34 on the bias underlayer 33 is located to be approximately flush with the upper face 29b of the free magnetic layer 29, or at above (in the Z-direction of) the upper face 29b of the free magnetic layer 29. This configuration permits only the tapered portion 33b of the bias underlayer 33 and the hard bias layer 34 to be present within the area between two virtual lines D and E at both side areas of the resistive multilayer 20, when the virtual lines D and E are drawn from the lower face 29a and upper face 29b of the free magnetic layer 29 in the direction parallel to the deposition surface α as shown in FIG. 3. Or, only the hard bias layer 34 exists between the virtual lines D and E as shown in FIG. 2. Consequently, a sufficient bias magnetic field may be supplied to the free magnetic layer 29 from the thick portion of the hard bias layer 34.

When the tapered bias underlayer 33b interposes between the hard bias layer 34 and free magnetic layer 29, the bias magnetic field from the hard bias layer 34 is not so extremely reduced, and a sufficient magnitude of the bias magnetic field may be supplied to the free magnetic layer 29.

The construction above permits a proper magnitude of the bias magnetic field to be supplied from the hard bias layer 34 to the free magnetic layer 29, thereby allowing magnetization of the free magnetic layer 29 to be properly put in a single magnetic domain state in the X-direction as shown in FIG. 1.

An electrode layer 36 is formed on the hard bias layer 34, and a protective layer 37 made of Ta and the like is formed on the electrode layer 36.

Materials for the amorphous layer 32 and the bias underlayer 33 will be described hereinafter.

The amorphous layer 32 has an action for blocking the effect of orientation characteristics of the antiferromagnetic layer due to its amorphous nature even when the antiferromagnetic layer 26 is formed just under the amorphous layer. The amorphous layer 32 is preferably formed of a nonmagnetic material.

When the amorphous layer 32 is made of a Co—T—Z alloy, T is an element comprising at least Zr and Hf, and Z is an element comprising at least Ta and Nb. When the amorphous layer 32 is made of a Ni—X alloy, on the other hand, X is an element comprising at least P. The amorphous layer 32 may be made of $Al_2O_3$, or may be an amorphous conductive layer. The amorphous layer 32 is formed with a thickness of 60 Å or more and 300 Å or less.

The bias underlayer 33 desirably comprises a metal layer having a bcc (body-centered cubic) crystal structure. The bias underlayer 33 is deposited so that at least the [211] face or [200] face is oriented in the direction perpendicular to the layer surface by controlling the deposition directions.

The bias underlayer 33 is formed at least one of Cr, W, Mo, V, Mn, Nb and Ta.

Since the amorphous layer 32 is formed under the bias underlayer 33, and the antiferromagnetic layer 26 makes direct contact with the bias underlayer 33 as hitherto described, the bias underlayer 33 may be appropriately adjusted to have a crystal structure comprising a body-centered cubic (bcc) structure. The bias underlayer 33 is formed of a metal layer having the crystal structure and crystal orientation as hitherto described, in order to enhance the coercive force (Hc) and squareness ratio (S) of the hard bias layer 34 formed on the bias underlayer 33.

The hard bias layer 34 is formed of a Co—Pt alloy, Co—Pt—Cr alloy and the like. These alloys have a hexagonal close-packing (hcp) crystal structure.

The bias underlayer 33 comprising a metal layer having the bcc structure is related to the hcp structure of the Co—Pt based alloy constituting the hard bias layer 34. For example, the c-axis of the hard bias layer 34 having the hcp structure is oriented in the layer surface due to lattice matching with the bias underlayer 33. Since this orientation is advantageous as the hard bias layer 34 magnetized in the layer surface, the layer is able to have a large coercive force as well as a good squareness ratio.

The metal layer of the bias underlayer 33 having the body-centered cubic (bcc) crystal structure is preferably formed of at least one of the element of Cr, W, Mo, V, Mn, Nb and Ta, more preferably Cr, because the Cr layer has an excellent function for aligning the crystal orientation of the hard bias layer 34 while properly increasing the coercive force of the hard bias layer 34. When at least the [211] face or [200] face is oriented in the direction perpendicular to the layer surface by using the bias underlayer 33 as described above, the Co—Pt alloy layer as the hard bias layer 34 formed thereon may be made to orient in the [100] face.

An upper gap layer 38 is formed using an insulation material on the resistive multilayer 20 formed on the deposition surface α of the gap layer 22 as shown in FIG. 1, and an upper shield layer 39 is formed using a magnetic material on the upper gap layer 38.

The second embodiment of the present invention will be described hereinafter with reference to FIG. 6. The magnetic sensing head in this embodiment is also used for the magnetic head for regenerating data recorded on a magnetic recording medium. While only the magnetic sensing element is shown in the drawing, a recording inductive head may be provided on the magnetic head comprising the magnetic sensing element.

This embodiment differs from the first embodiment in that a seed layer 25 is provided between an antiferromagnetic 26 and gap layer 22 of a resistive multilayer 20. In other words, the seed layer 25 is provided on the gap layer 22 formed on a lower shield layer 21. The other constructions are the same as those in the embodiment shown in FIG. 1.

The seed layer 25 comprises an underlayer 23 and an orientation layer 24 made of a nonmagnetic or magnetic material in which a [111] face of a face-centered cubic crystal or a [110] face of a body-centered cubic crystal is preferentially oriented in the direction parallel to the interface between the underlayer and an antiferromagnetic layer 26.

Although the seed layer 25 may comprise only the orientation layer 24 formed of a monolayer of the nonmagnetic or magnetic material, it is preferable to form the underlayer 23 in order to align the crystal orientation of the orientation layer 24.

The underlayer 23 is preferably formed of at least one of Ta (tantalum), Hf (hafnium), Nb (niobium), Zr (zirconium), Ti (titanium), Mo (molybdenum) and W (tungsten). While the orientation layer 24 is formed of a magnetic material or a nonmagnetic material as described above, the material preferably has a high resistivity. The orientation layer 24 is preferably formed of a Ni—Fe—Y alloy (wherein Y is at least one element selected from Cr, Rh, Ta, Hf, Nb, Zr and Ti). The orientation layer 24 is more preferably formed of a Ni—Fe—Cr alloy, because the [111] face of the orientation layer 24 may be more properly oriented in the direction parallel to the interface between the antiferromagnetic layer 26 and the orientation layer while making the resistivity higher. The orientation layer 24 may be formed of Cr to enable a uniform and dense crystal orientation to be obtained thanks to wettability of the Cr layer.

It is possible to suppress a sense current flowing out from an electrode layer 36 to be described hereinafter from shunting to the seed layer 25 when the orientation layer 24 has a high resistivity, thereby enabling the rate of change of resistance (ΔGMR) to be improved and the Barkhausen noise to be reduced.

The underlayer 23 of the seed layer 25 has a thickness of more than 0 Å and 50 Å or less, while the orientation layer 24 is formed with a thickness of about 10 Å or more and 100 Å or less.

While the antiferromagnetic layer 26 is formed on the seed layer 25, this construction is the same as that in the first embodiment. The antiferromagnetic layer 26 has an excellent corrosion resistance as well as a high blocking temperature, and is able to generate a large exchange coupling magnetic field at the interface between the antiferromagnetic layer 26 and a pinned magnetic layer 27 formed thereon. The antiferromagnetic layer 26 preferably formed with a thickness of 50 Å or more and 250 Å or less.

Since the [111] face of the face-centered cubic crystal or the [110] face of the body-centered cubic crystal is preferentially oriented in the direction parallel to the interface between the antiferromagnetic layer 26 and the seed layer 25 in the seed layer 25, the [111] face of the antiferromagnetic layer 26 formed on the seed layer 25, and the [111] face of each layer formed on the antiferromagnetic layer 26 may be preferentially oriented in the direction parallel to the interface, which allows the crystal grain diameter to be increased while improving the rate of change of resistance (ΔGMR).

A pinned magnetic layer 27 is preferably formed with a thickness of about 20 Å or more and 60 Å or less. A nonmagnetic conductive layer 28 is formed with a thickness of about 25 Å. A free magnetic layer 29 preferably has a thickness of 20 Å or more and 40 Å or less. The free magnetic layer 29 has a bilayer structure, and a Co layer is preferably formed at the side opposed to the nonmagnetic conductive layer 28. This layer structure prevents metal elements from diffusing at the interface between the nonmagnetic conductive layer 28 and free magnetic layer 29, thereby enabling the rate of change of resistance to be increased. A protective layer 30 on the free magnetic layer 29 is formed of Ta and the like with a thickness of about 30 Å.

Both side faces 20a and 20a of projections 20c of a resistive multilayer 20 in the track width direction (X-direction) comprising each layer from the seed layer 25 through the protective layer 30 comprise continuous inclined faces elongating from the protective layer 30 to a position halfway of the antiferromagnetic layer 26. The both side faces 20a and 20a are also formed as continuous inclined faces elongating from the protective layer 30 to the upper face or to the position halfway of the seed layer 25.

Each layer of the resistive multilayer 20 is at first deposited on the deposition surface α, and a lift-off resist layer is formed only at the center of the resistive multilayer 20 as described in the first embodiment, followed by removing the both side areas of the resistive multilayer 20, which are not covered with the resist layer, by etching.

The both side areas of the resistive multilayer 20 are not so deeply etched as to expose the deposition surface α, and a part of the seed layer 25 is left behind, or a part of the antiferromagnetic layer 26 is left behind.

An amorphous layer 32, a bias underlayer 33, a hard bias layer 34, an electrode layer 36 and a protective layer 37 are formed from the bottom in this order in each side area of the resistive multilayer 20 as described in the first embodiment.

While the amorphous layer 32 is formed on the antiferromagnetic layer 26 or on the seed layer 25 in each side area of the resistive multilayer 20, the edge 32a of the amorphous layer 32 at the resistive multilayer 20 side is formed to be in contact with each face (inclined faces) 20a of the projections 20c of the resistive multilayer 20. The hard bias layer 34 formed on the amorphous layer 32 with interposition of the bias underlayer 33 is formed with an elevation within each side area 20a of the projection 20c of the resistive multilayer 20, and faces each side of the free magnetic layer 29 with a sufficient volume.

The amorphous layer 32 is preferably formed on the antiferromagnetic layer 26 or on the seed layer 25 with a thickness of 60 Å or more and 300 Å or less. The bias underlayer 33 preferably has a thickness of 35 Å or more and 75 Å or less.

The amorphous layer 32 is deposited by sputtering by ion irradiation from the direction approximately perpendicular to the deposition surface α. While a part of the lift-up amorphous layer 32 is formed on each side face of the projection 20c of the resistive multilayer 20, this part is removed by etching.

The upper face 32b of the amorphous layer 32 is preferably located above the lower face 27c of the pinned magnetic layer 27, thereby enabling the hard bias layer 34 to be formed at a higher position in each side area of the resistive multilayer 20 with a sufficient volume of the hard bias layer facing each side of the free magnetic layer 29.

The amorphous layer 32 is formed in this embodiment under the bias underlayer 33 formed in each side area of the projection 20c of the resistive multilayer 20, and the antiferromagnetic layer 26 and seed layer 25 are formed under the amorphous layer. Consequently, the bias underlayer 33 is not affected by the crystal orientation of the antiferromagnetic layer 26 and seed layer 25, enabling the coercive force of the hard bias layer 34 formed on the bias underlayer 33 to be increased. Moreover, since the amorphous layer 32 is formed as an underlayer of the bias underlayer 33 in order to lift up the bias underlayer 33 and hard bias layer 34, the volumes of these layers are prevented from decreasing due to tapering of the bias underlayer 33.

The bottom face 34a of the hard bias layer 34 on the planar portion of the bias underlayer 33 is preferably located to be lower (in the reversed direction to the Z-direction) than the lower face 29a of the free magnetic layer 29, and the upper face 34b of the hard bias layer 34 on the planar portion 33a is preferably located to be higher than the lower face 29a of the of the free magnetic layer 29.

In addition to the construction as described above, the upper face 34b of the hard bias layer 34 on the bias underlayer 33 is more preferably located to be flush with the upper face 29b of the free magnetic layer 29, or to be higher (in the z-direction) than the upper face 29b of the free magnetic layer 29. Suppose that virtual lines (not shown) are drawn from the lower face 29a and upper face 29b of the free magnetic layer 29 in the direction parallel to the deposition surface α. Since only the hard bias layer 34 is present within the area between two virtual lines in each side area of the resistive multilayer 20, a sufficient magnitude of the bias magnetic field can be supplied from the hard bias layer 34 to the free magnetic layer 29.

When the tapered and thin portion 33b of the tapered bias underlayer 33 interposes between the hard bias layer 34 and free magnetic layer 29, the bias magnetic field from the hard bias layer 34 is not so extremely reduced in this embodiment as in the foregoing embodiment, and a sufficient magnitude of the bias magnetic field can be supplied to the free magnetic layer 29.

The amorphous layer 32 is formed as an underlayer of the bias underlayer 33, and the antiferromagnetic layer 26 and seed layer 25 are formed under the amorphous layer in this embodiment. Accordingly, the crystal structure of the bias underlayer 33 can be properly aligned as a body-centered cubic (bcc) structure. The bias underlayer 33 is preferably formed of a metal layer having a body-centered cubic (bcc) crystal structure as in the foregoing embodiment, and crystals of the bias underlayer 33 are oriented in the [110], [200] and [211] faces.

The hard bias layer 34 in this embodiment is also formed of a Co—Pt alloy or Co—Pt—Cr alloy having a hexagonal close-packed (hcp) crystal structure.

The bias underlayer 33 comprising a metal layer having the bcc structure is related to the hcp structure of the Co—Pt based alloy constituting the hard bias layer 34. For example, the c-axis of the hard bias layer 34 having the hcp structure is oriented in the layer surface due to lattice matching with the bias underlayer 33. Since this orientation is advantageous as the hard bias layer 34 magnetized in the layer surface, the layer is able to have a large coercive force as well as a good squareness ratio.

Figure 6:
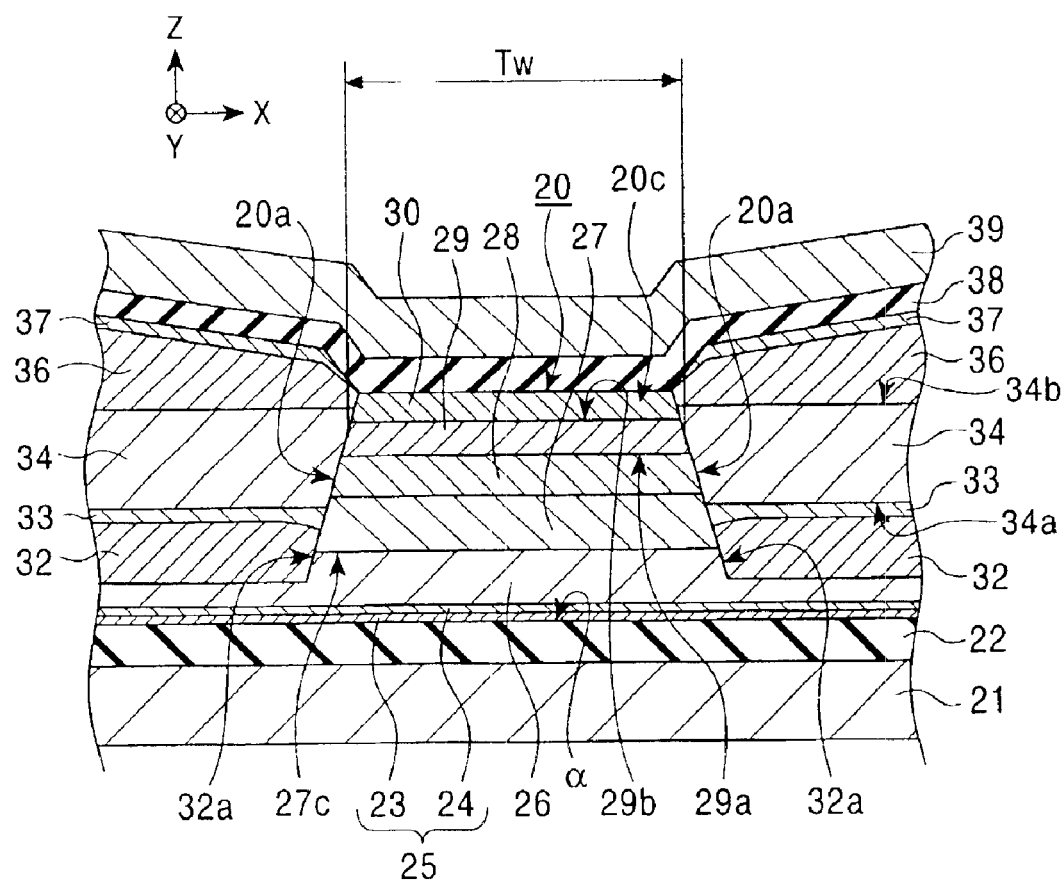
FIG. 6 is a partial cross section of a magnetic sensing element according to the third embodiment of the present invention viewed from an opposite face side, or an ABS face side, to a recording medium.

An upper gap layer 38 is also formed in this embodiment on the resistive multilayer 20 formed on the deposition surface α using an insulation material as shown in FIG. 6, and an upper shield layer 39 is formed on the upper gap layer 38 using a magnetic material.

According to the second embodiment, the crystal structure of the antiferromagnetic layer 26 is aligned by forming the seed layer 25 as the lowermost layer with the antiferromagnetic layer 26 thereon, thereby enabling the rate of change of resistance of the resistive multilayer 20 to be improved.

According to this embodiment, the amorphous layer 32 is formed under the bias underlayer 33 formed in each side of the resistive multilayer 20 with the seed layer 25 below the amorphous layer. Consequently, the bias underlayer 33 can be formed with a proper crystal structure and crystal orientation that enable the coercive force of the hard bias layer 34 formed on the bias underlayer 33 to be enhanced.

Figure 7:
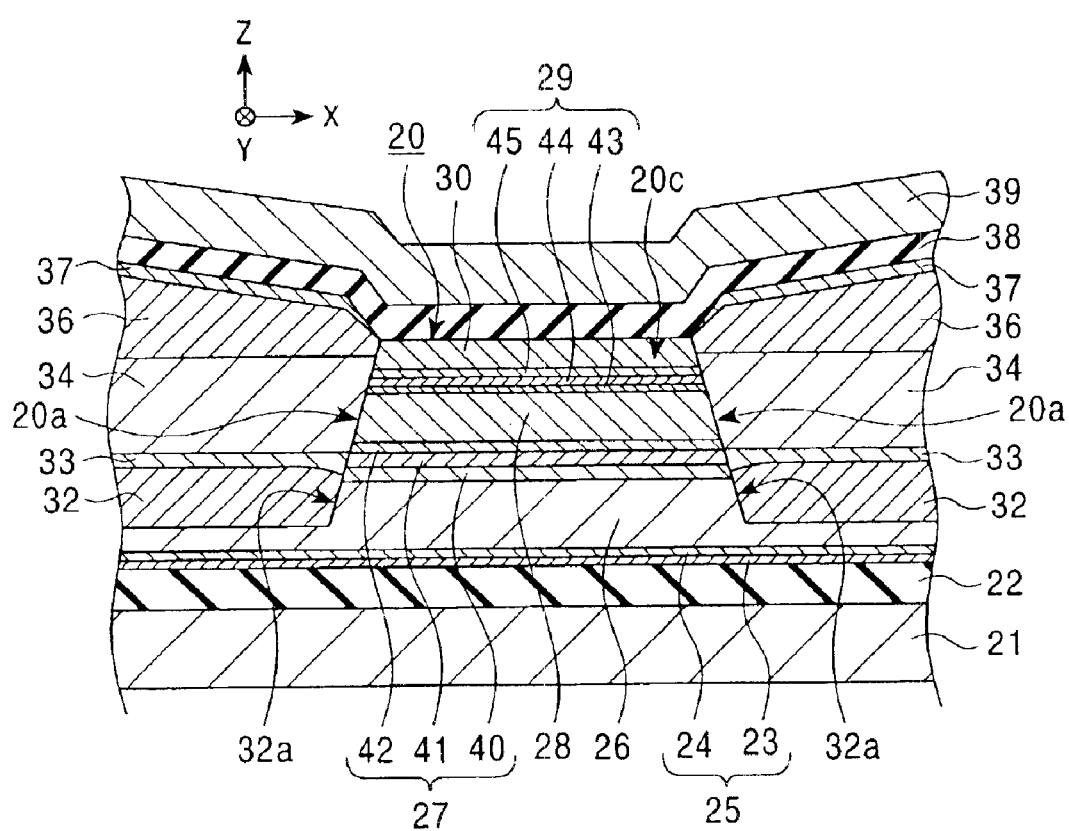
FIG. 7 is a partial cross section of a magnetic sensing element according to the fourth embodiment of the present invention viewed from an opposite face side, or an ABS side face, to a recording medium.

The third embodiment of the present invention will be described hereinafter with reference to FIG. 7. FIG. 7 is a partial cross section of a magnetic sensing element according to the third embodiment of the present invention viewed from an opposite face (ABS) side to a recording medium.

This magnetic sensing element is also used for a recording head for regenerating data recorded on a recording medium. While only the magnetic sensing element is shown in FIG. 7, an inductive type recording head may be formed on the magnetic head comprising the magnetic sensing element.

The third embodiment shown in FIG. 7 differs from the first embodiment shown in FIG. 1 in the structures of the pinned magnetic layer 27 and free magnetic layer 29. While each of the pinned magnetic layer 27 and free magnetic layer 29 comprises a monolayer in FIG. 1, the pinned magnetic layer 27 and free magnetic layer 29 in FIG. 7 comprise three layers.

The pinned magnetic layer 27 comprises a ferromagnetic layer 40, a nonmagnetic intermediate layer 41 and a ferromagnetic layer 42. The ferromagnetic layers 40 and 42 are formed of, for example, Co (cobalt), and the nonmagnetic intermediate layer 41 comprises a nonmagnetic layer formed of, for example, Ru (ruthenium). This three layer structure makes the magnetization directions of the ferromagnetic layers 40 and 42 to be antiparallel (reversed by 180°) with each other. This alignment is a so-called ferrimagnetic state, which stabilizes magnetization of the pinned magnetic layer 27 while increasing the bias magnetic field generated at the interface between the pinned magnetic layer 27 and antiferromagnetic layer 26.

The free magnetic layer 29 also comprises ferromagnetic layers 43 and 45 formed of Co and the like, and a nonmagnetic intermediate layer 44 formed of Ru and the like disposed between the ferromagnetic layers 43 and 45. This construction enables magnetization directions of the ferromagnetic layers 43 and 45 to be antiparallel (reversed by 180°) with each other to enable magnetization of the free magnetic layer 29 to be stably maintained while reducing the magnetic thickness of each ferromagnetic layer 43 and 45. Consequently, magnetization of the free magnetic layer 29 may be readily reversed while allowing the ferromagnetic layers 43 and 45 to maintain an antiparallel relation relative to an external magnetic field, thereby making it possible to improve regenerative sensitivity. The ferrimagnetic structure described above may be formed in either the pinned magnetic layer 27 or free magnetic layer 29.

Each of the ferromagnetic layers 40 and 42, and the ferromagnetic layers 43 and 45 is formed with a thickness of about 10 Å to 70 Å. Each of the nonmagnetic intermediate layers 41 and 44 is formed with a thickness of about 3 Å to 10 Å.

The seed layer 25 is formed as a lowermost layer of the resistive multilayer 20 in the third embodiment, both side faces 46a and 46a in the track width direction (X-direction) of the resistive multilayer 20 are formed as inclined faces continuously elongating from the upper face of the protective layer 30 through halfway of the antiferromagnetic layer 26. An amorphous layer 32 is formed under the bias underlayer 33, and the antiferromagnetic layer 26 and seed layer 25 are formed under the amorphous layer, thereby enabling a desired crystal orientation of the bias underlayer 33 to be maintained.

The hard bias layer 34 having a large coercive force can be formed at both sides of the free magnetic layer 29 so as face the free magnetic layer with a sufficient thickness. Since a thin bias underlayer 33 is formed by being interposed between the free magnetic layer 29 and hard bias layer 34, and a sufficient magnitude of a bias magnetic field may be supplied from the hard bias layer 34 to the free magnetic layer 29, enabling the free magnetic layer 29 to be readily put into a single magnetic domain state.

The amorphous layer 32 is desirably formed up to the upper face of the nonmagnetic intermediate layer 41 of the pinned magnetic layer 27. Since this structure allows the sense current flowing in the nonmagnetic intermediate layer 41 of the pinned magnetic layer 27, ferromagnetic layer 40 and antiferromagnetic layer 26 to be reduced, shunt loss is reduced to enable output voltage to be increased.

FIGS. 8 to 13 show cross sections illustrating the process for manufacturing the magnetic sensing element shown in FIG. 1 in the order of manufacturing steps. Each drawing shows a cross section viewed from the opposed face (ABS face) side to the recording medium.

Figure 8:
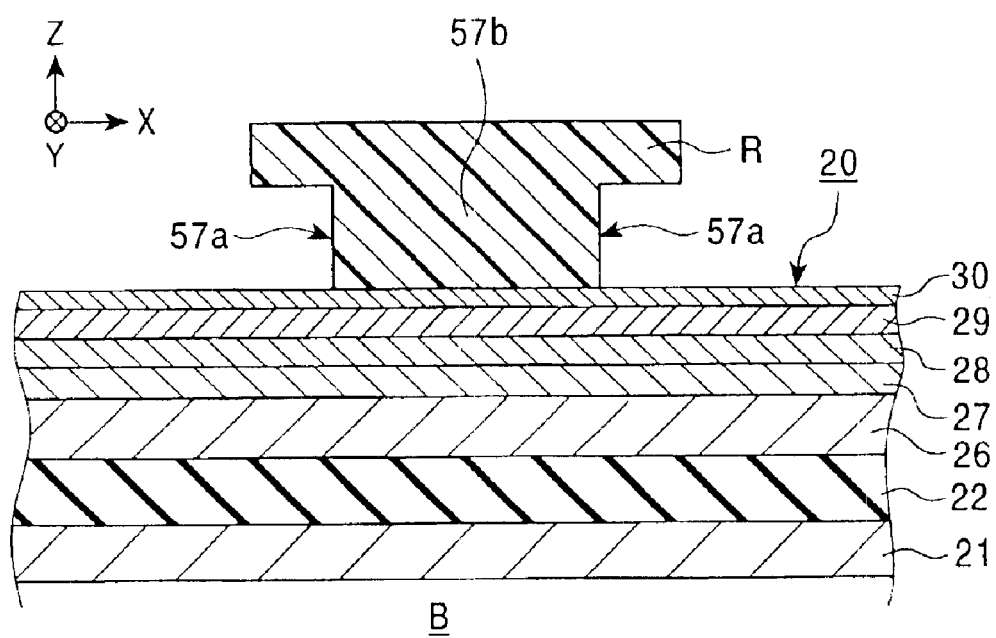
FIG. 8 shows a first step of the process for manufacturing the magnetic sensing element shown in FIG. 1.

In the step shown in FIG. 8, the lower shield layer 21 made of a magnetic material such as permalloy or sendust is formed on a substrate B, and the lower gap layer 22 made of an insulation material such as alumina is formed on the lower shield layer 21.

Then, each layer constituting the resistive multilayer 20 of the magnetic sensing element is deposited on the entire surface of the lower gap layer 22. At first, the antiferromagnetic layer 26 made of a Pt—Mn alloy is formed on the lower gap layer 22. Then, the pinned magnetic layer 27 made of a magnetic material such as a Ni—Fe alloy, the nonmagnetic conductive layer 28 made of Cu, the free magnetic layer 29 made of a Ni—Fe alloy, and the protective layer 30 made of Ta are sequentially formed on the antiferromagnetic layer 26.

For forming the seed layer 25 shown in FIGS. 6 and 7, the seed layer 25 comprising the underlayer 23 made of Ta and the nonmagnetic layer 24 made of a Ni—Fe—Cr alloy are formed on the lower gap layer 22. Then, the antiferromagnetic layer 26 made of the Pt—Mn alloy is formed on the seed layer 25. For forming the resistive multilayer 20 shown in FIG. 7, the pinned magnetic layer 27 and free magnetic layer 29 are formed to be in a ferrimagnetic state with each other.

Figure 9:
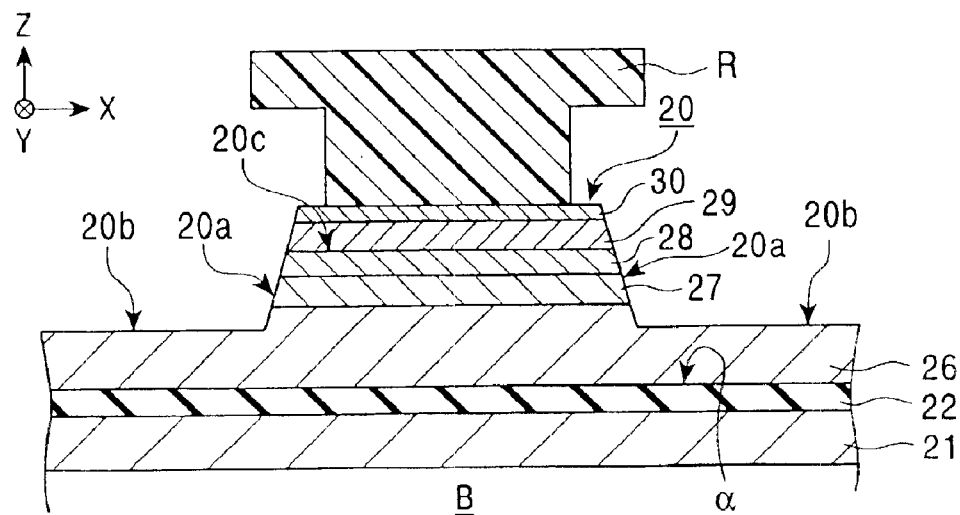
FIG. 9 shows a second step of the process for manufacturing the magnetic sensing element shown in FIG. 1.

In the next step shown in FIG. 9, a lift-off resist R is formed at the central portion of the protective layer 30 by patterning through coating and exposure steps. Excised portions 57a and 57a are formed under the lower faces 57b of the resist R as shown in FIG. 8.

The resistive multilayer 20 is formed into a projected trapezoid-like shape in the step shown in FIG. 9 by removing by etching the both side areas 20b and 20b in the track width direction (X-direction) of the resistive multilayer 20 not covered with the resist R, and continuous inclined faces (20a) are formed in both side face areas of the projection 20c of the resistive multilayer 20.

Both side areas 20b and 20b of the resistive multilayer 20 are shaved off by over-etching including a part of the antiferromagnetic layer 26 to a depth not to expose the upper face (the deposition surface α of the magnetoresistive element) of the lower gap layer 22 in this embodiment. The both side faces 20a and 20a of the projection 20c of the remaining resistive multilayer 20 after shaving form continuous inclined faces (20a and 20a) continuously elongating from the upper face of the antiferromagnetic layer 26 to the upper face of the protective layer 30, and the resistive multilayer 20 is formed into a trapezoid-like shape.

Then, the amorphous layers 32 are deposited by sputtering on both sides (particularly on the etched portions) of the trapezoid-like antiferromagnetic layer 26 as shown in FIG. 10. The side faces 32a of the amorphous layers 32 at the resistive multilayer 20 side is made to contact the both side faces 20a of the resistive multilayer 20.

The amorphous layer 32 is deposited by sputtering with an incident angle θ1 of the first sputtering particles relative to the vertical direction (Z-direction) to the deposition surface α. The incident angle θ1 of the first sputtering particles is preferably set to be larger than 0° and 10° or smaller. The same material layer 32' as the amorphous layer 32 adheres on the resist R.

The amorphous layer 32 is deposited by sputtering from an approximately perpendicular direction to the deposition surface α (with an incident angle of the sputtering particles of 0° or larger and 10° or smaller). Practically preferable methods include a long-throw sputtering (LTS) method, ion-beam sputtering (IBD) method and collimation sputtering method.

The amorphous layers 32 adhered on the inclined face 20a at both side areas of the projection 20c of the resistive multilayer 20 are then removed by etching. While a complete removal of the amorphous layer 32 by etching is ideal, a small amount of the amorphous layer 32 is of no problem so long as the layer is conductive, since the remaining layer does not block the sense current from flowing through the free magnetic layer 29. This process enables the resistive multilayer 20 to be protected from being etched by shortening the etching time.

The upper face 32b of the amorphous layer 32 is preferably formed to be located at an elevated position from the lower face 27c of the pinned magnetic layer 27 by controlling the thickness of the amorphous layer 32. The amorphous layer 32 preferably has a thickness of 60 Å to 300 Å.

Preferably, the bias underlayer 33, the hard bias layer 34, the electrode layer 36 and the protective layer 37 are deposited by sputtering as described above.

The bias underlayer 33 preferably comprises a metal layer having a bcc crystal structure. While the materials for use in the metal layer comprise at least one of the elements selected from Cr, W, Mo, V, Mn, Nb and Ta, the bias underlayer 33 is preferably deposited by sputtering Cr in this embodiment.

The bias underlayer 33 is deposited by sputtering from the upper face 32b of the amorphous layer 32 up to a level approximately flush with the resistive multilayer 20 in the step shown in FIG. 11. While the bias underlayer 33 is deposited with an incident angle θ2 of the second sputtering particles relative to the perpendicular direction (Z-direction) to the deposition surface α as shown in FIG. 11, the incident angle θ2 of the second sputtering particles is preferably larger than the incident angle θ1 of the first sputtering particles. The bias underlayer 33 having the bcc crystal structure is deposited by controlling the deposition angle so that at least the [211] face or [200] face is preferentially oriented in the direction perpendicular to the layer surface in the step for depositing the bias underlayer 33. However, a layer 33' comprising the same material as the bias underlayer 33 is deposited on the resist R. The incident angle θ2 of the second sputtering particles is preferably 15° or more and 70° or less, more preferably 30° or more and 60° or less.

The bias underlayer 33 is deposited by sputtering from a direction more tilted from the vertical direction to the deposition surface α as compared with the sputtering angle for forming the amorphous layer 32. Accordingly, the bias underlayer 33 is liable to be deposited not only on the amorphous layer 32 but also on the inclined faces 20a at both side areas of the projection 20c of the resistive multilayer 20 as shown in FIG. 11. While it is preferable for the bias underlayer 33 to be formed by creeping up each side face of the free magnetic layer 29 when the bias underlayer 33 is formed by creeping up the inclined face 20a of the projection 20c of the resistive multilayer 20, the bias underlayer 33 may be formed merely by creeping up to the lower end of each side face of the free magnetic layer 29. Alternatively, the bias underlayer 33 may be formed merely on the amorphous layer 32 without creeping up the inclined face 20a of the projection 20c of the resistive multilayer 20.

The bias underlayer 33 may be removed to the height halfway of the inclined face 20a of the projection 20c of the resistive multilayer 20 in the step for forming the bias underlayer 34 as described above, wherein the tapered portion of the bias underlayer 33b formed by creeping up the inclined face 20a of the projection 20c of the resistive multilayer 20 is completely removed by controlling the deposition angle of the bias underlayer 33 as shown in FIGS. 1 and 2. Otherwise, the bias underlayer 33 is removed to a depth halfway of the inclined face 20a of the projection 20c of the resistive multilayer 20 by removing a part of the tapered bias underlayer 33b formed by creeping up the inclined face 20a of the projection 20c of the resistive multilayer 20 by controlling the deposition angle of the bias underlayer 33 as shown in FIG. 3.

It is also preferable to deposit the bias underlayer 33 by properly controlling the thickness of the amorphous layer 32 in the step shown in FIG. 10 and the thickness of the bias underlayer 33 in the step shown in FIG. 11, so that the upper face 33b of the bias underlayer 33 on the deposition surface α is located at a level lower than the lower face 29a of the free magnetic layer 29. This configuration permits the hard bias layer 34 to face each side of the free magnetic layer 29 with a sufficient volume.

It is preferable in this embodiment to form the bias underlayer 33 using the metal layer having the bcc crystal structure as described previously. The metal layer comprises at least an element selected from Cr, W, Mo, V, Mn, Nb and Ta. The bias underlayer 33 is preferably comprises the Cr layer, because the Cr layer readily makes the hard bias layer 34 to be formed in the succeeding step to have a hcp crystal structure, which enables the coercive force of the hard bias layer 34 to be large.

Figure 12A:
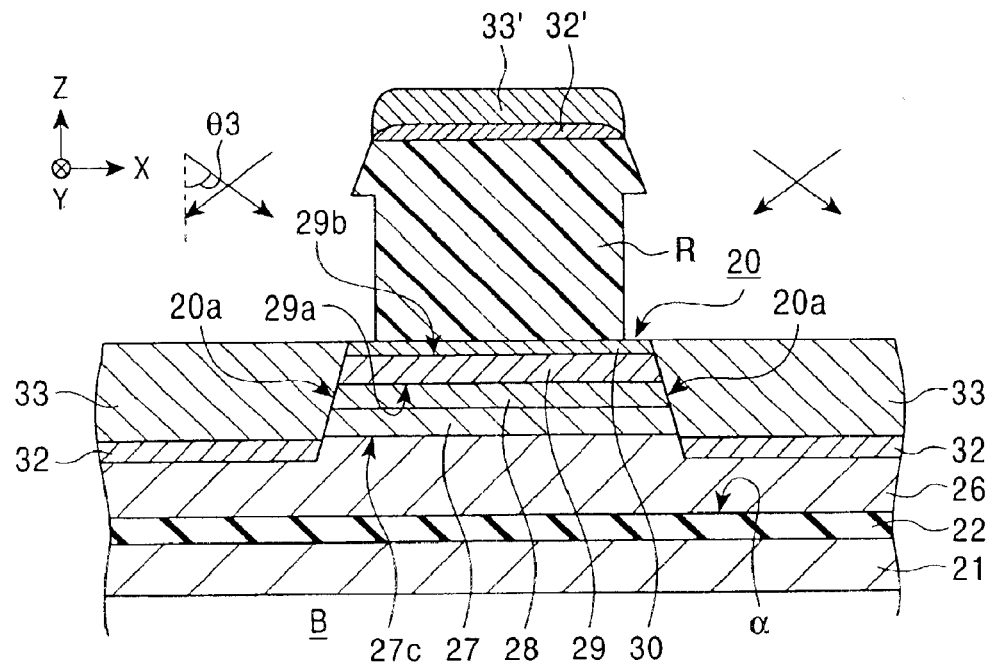
FIG. 12A shows a fifth step of the process for manufacturing the magnetic sensing element shown in FIG. 1.
Figure 12B:
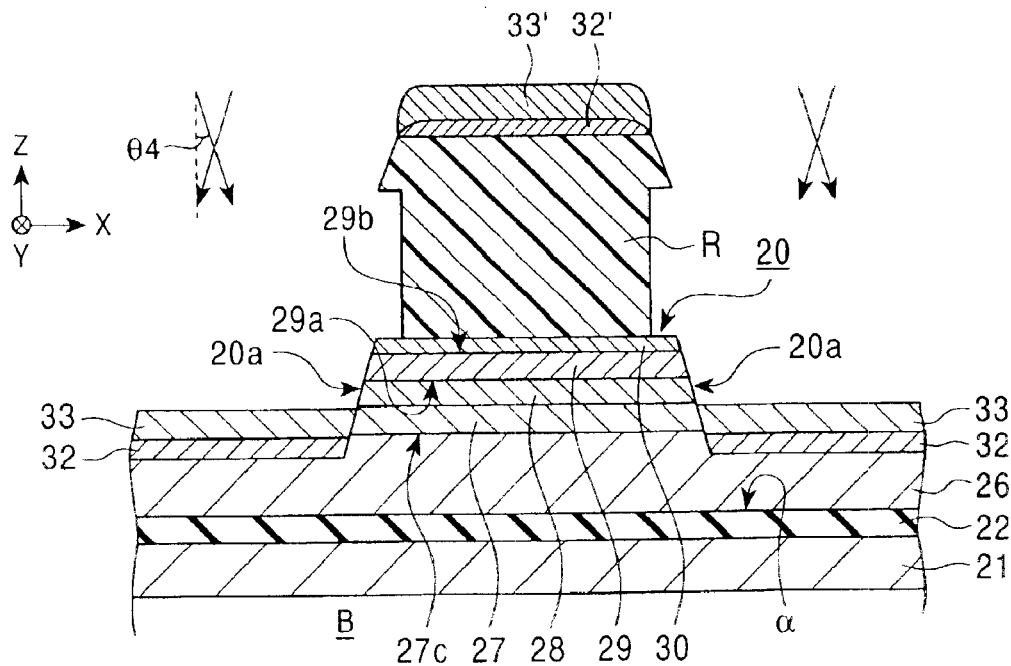
FIG. 12B shows a modified fifth step of the process for manufacturing the magnetic sensing element shown in FIG. 1.

The width of the resist R is reduced by ion-milling at an angle θ3, particularly at an angle of 70 to 80°, in the step shown in FIG. 12A. Then, the bias underlayer 33 is removed by ion-milling at an deposition angle θ4, or at an angle of 3 to 7°, to a depth halfway of the inclined face 20a of the resistive multilayer 20 in the step shown in FIG. 12B while leaving the resistive multilayer 20 to be masked with the resist R.

Figure 13:
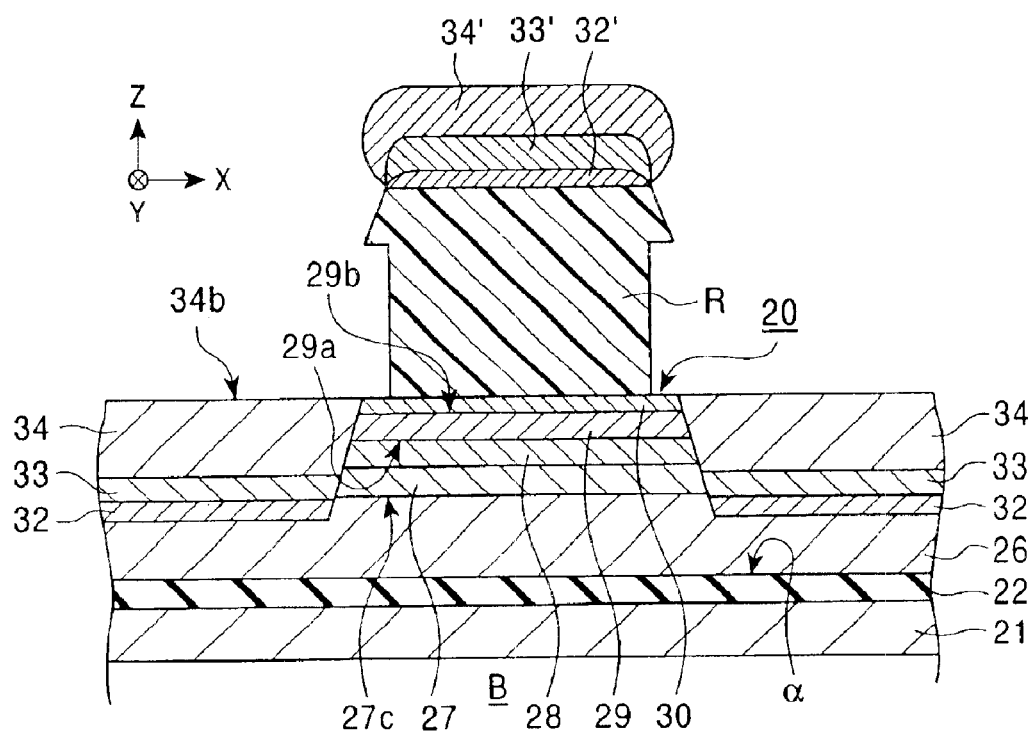
FIG. 13 shows a sixth step of the process for manufacturing the magnetic sensing element shown in FIG. 1.

Subsequently, the entire lower face 34a of the hard bias layer 34 is made to contact the bias underlayer 33 with the thick portion of the hard bias layer 34 to face the free magnetic layer 29 by laminating the hard bias layer 34 on the remaining bias underlayer 33 as shown in FIG. 13. The hard bias layer 34 is deposited by controlling the deposition angle of the hard bias layer 34 in the step for forming the hard bias layer 34, so that at least the [100] face is preferentially oriented in the direction perpendicular to the layer surface. A layer 34' comprising the same material as the hard bias layer 34 is also formed on the resist R.

The bias layer 34 is deposited by sputtering as a hard bias layer 34 using the Co—Pt alloy or Co—Pt—Cr alloy in this embodiment.

Since the amorphous layers 32 are formed at both sides of the projected antiferromagnetic layer 26 in this embodiment, the hard bias layer 34 formed on the amorphous layer 32 with interposition of the bias underlayer 33 may be made to face each side of the free magnetic layer 29 with a sufficient volume.

According to the magnetic sensing element formed by the manufacturing process in this embodiment, the bias magnetic field can be properly supplied to the free magnetic layer 29 from the hard bias layer 34 while enabling magnetization of the free magnetic layer 29 to be put in a single magnetic domain state.

Crystal orientation of the bias underlayer 33 can be properly aligned due to no direct contact of the antiferromagnetic layer 26 in this embodiment, since the amorphous layer 32 is formed as an underlayer of the bias underlayer 33, enabling the coercive force of the hard bias layer 34 formed on the bias underlayer 33 to be enhanced.

Figure 14:
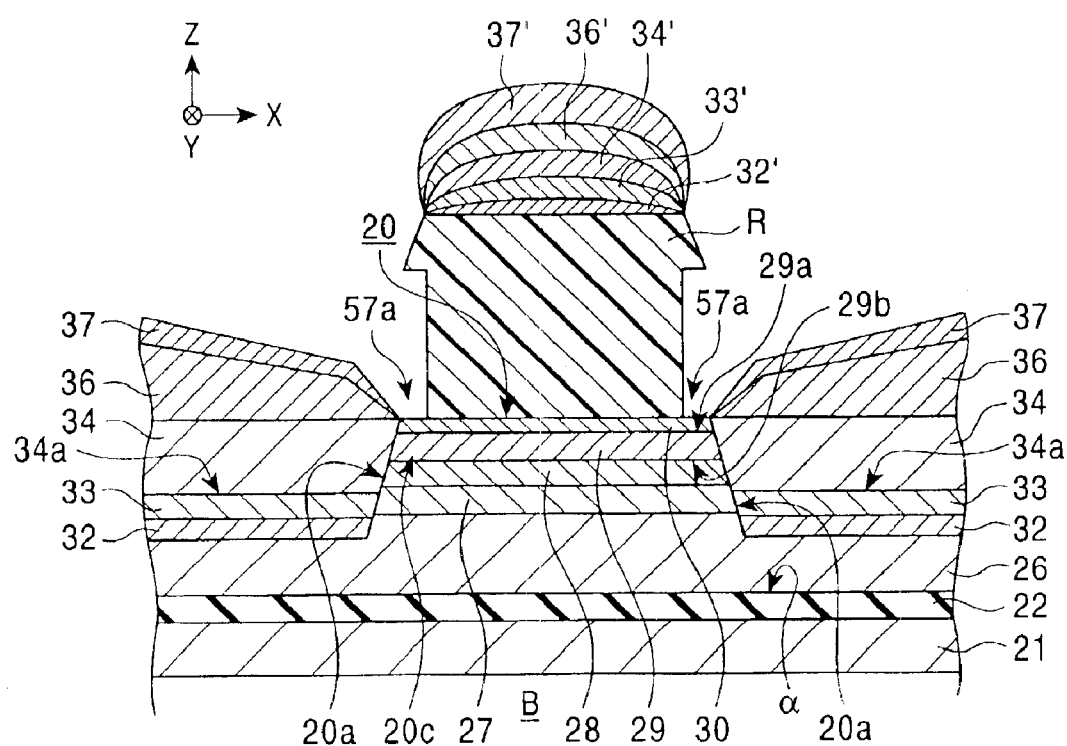
FIG. 14 shows a seventh step of the process for manufacturing the magnetic sensing element shown in FIG. 1.

In the step shown in FIG. 14 in this embodiment, the hard bias layer 34 is preferably deposited so that the upper face 34b of the hard bias layer 34 is located at a level higher than the upper face 29b of the free magnetic layer 29.

A more sufficient magnitude of the bias magnetic field may be supplied from the hard bias layer 34 to the free magnetic layer 29 when the lower face 34a of the hard bias layer 34 is located to be lower than the lower face 29a of the free magnetic layer 29, because only the hard bias layer 34 faces each side of the free magnetic layer 29 with interposition of the bias underlayer 33 within an area of thickness of the free magnetic layer 29 in the direction parallel to the deposition surface α, thereby accelerating magnetization of the free magnetic layer 29 to be more properly put in a single magnetic domain state.

The protective layer 37 made of Ta is deposited by sputtering in the next step shown in FIG. 14 after depositing the electrode layer 36 made of Cr or Au on the hard bias layer 34. A layer 36' comprising the same material as the electrode layer 36, and a layer 37' comprising the same material as the protective layer 37 are laminated on the resist R.

The magnetic sensing element as shown in FIG. 1 is completed by removing the lift-off resist R shown in FIG. 14, followed by forming the upper gap layer 38 and upper shield layer 39 as shown in FIG. 1.

The etching step of the both side areas of the resistive multilayer 20 as well as deposition of the amorphous layer 32, bias underlayer 33, hard bias layer 34, electrode layer 36 and protective layer 37 by sputtering can be continuously proceeded in this embodiment by using only one lift-off resist R on the resistive multilayer 20. Consequently, the magnetic sensing element according to this embodiment may be readily manufactured using the manufacturing process as described above.

The amorphous layer 32 and bias underlayer 33 can be readily formed with prescribed shapes in this embodiment by making the incident angle θ1 of the first sputtering particles for depositing the amorphous layer 32 to be smaller than the incident angle θ2 of the second sputtering particles for forming the bias underlayer 33. Moreover, the hard bias layer 34 may readily face each side of the free magnetic layer 29 with a sufficient volume according to the manufacturing process in this embodiment.

Figure 15:
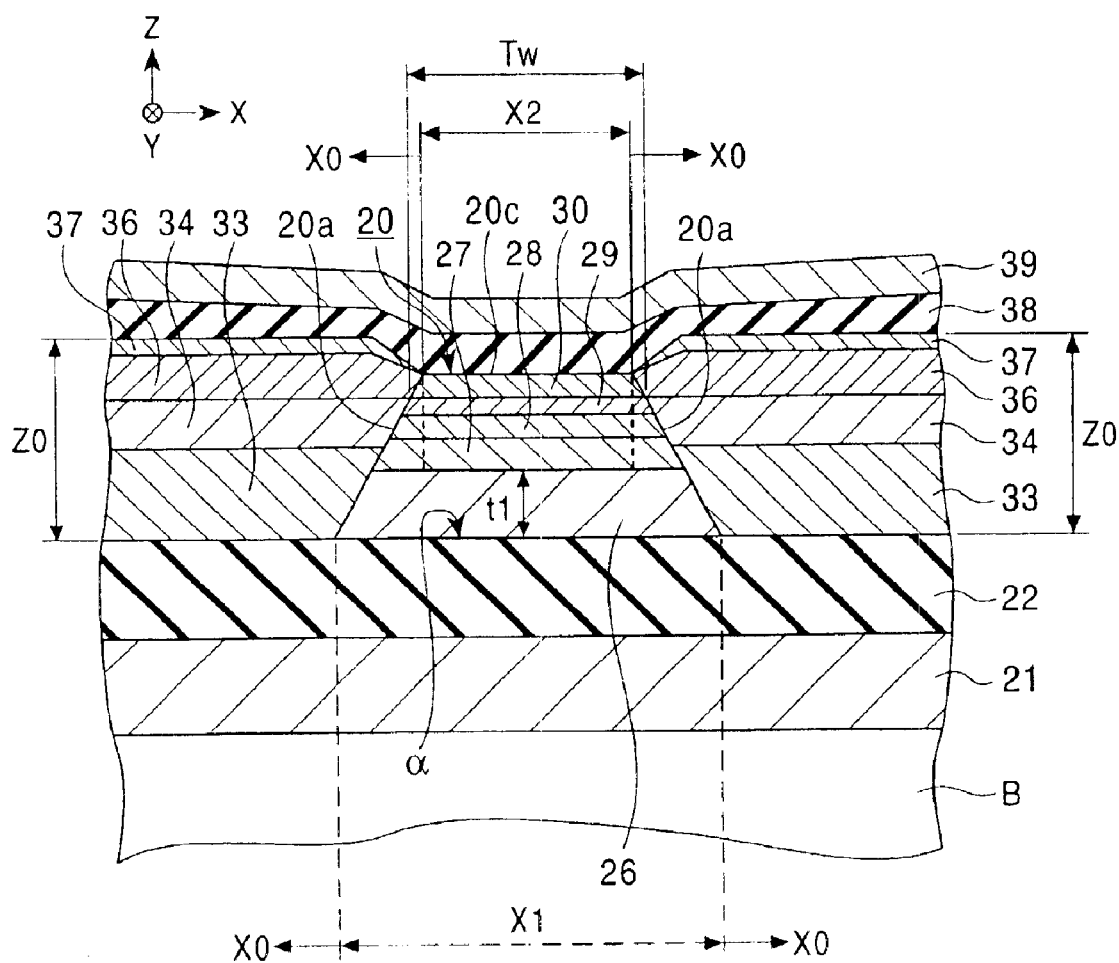
FIG. 15 is a partial cross section of a magnetic sensing element according to the fourth embodiment of the present invention viewed from an opposed face side, or an ABS face side, to a recording medium.
Figure 16:
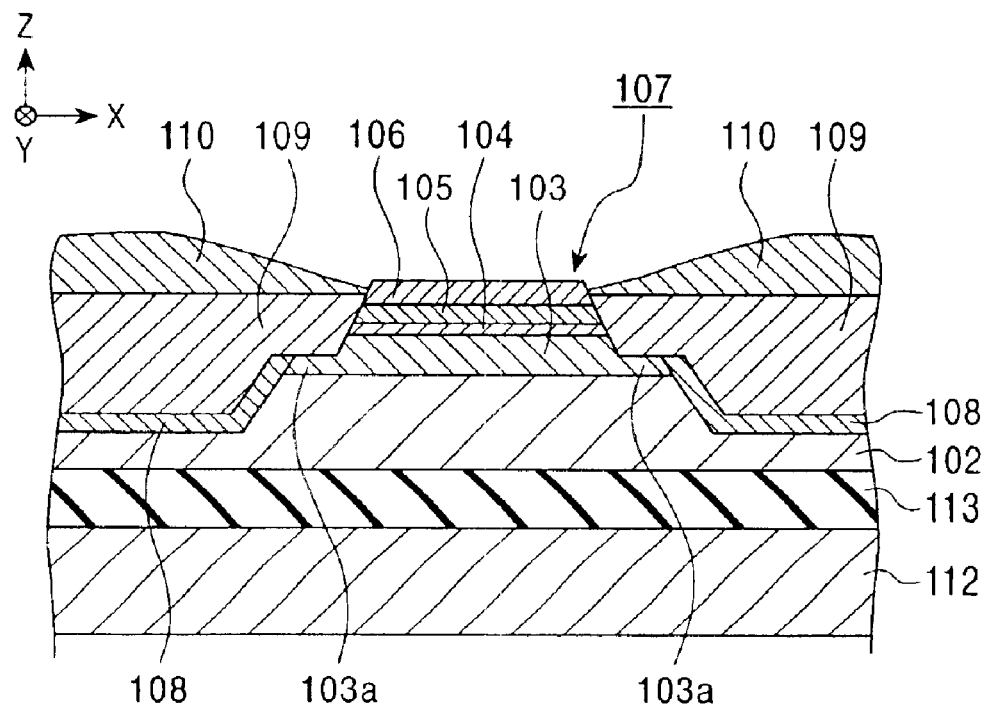
FIG. 16 is a partial cross section of a magnetic sensing element according to an related art viewed from an opposed face side, or an ABS face side, to a recording medium.

FIG. 15 is a cross section showing the fourth embodiment of the present invention. While the amorphous layer 32 was disposed under the bias underlayer 33 in the embodiments as hitherto described, no amorphous layer 32 is disposed under the bias underlayer 33 in this embodiment. Instead, both side areas of the resistive multilayer 20 are formed as continuous inclined faces 20a from near the elevation of the lower gap layer 22 through near the elevation of the protective layer 30, and the upper face of the lower gap layer 22 outside of the inclined face 20a of the projection 20c of the resistive multilayer 20 is exposed.

The bias underlayer 33 is deposited by sputtering from the upper face of the exposed lower gap layer 22 through the position approximately flush with the resistive multilayer 20. This bias underlayer 33 is formed of Cr and the like. Then, the bias underlayer 33 is removed to a depth halfway of the inclined face 20a of the projection 20c of the resistive multilayer 20. Subsequently, the bias layer 34 is deposited by sputtering on the remaining bias underlayer 33 up to the same elevation as the resistive multilayer 20. This bias layer 34 is formed of the Pt—Co alloy. The other constructions are the same as in the embodiments as hitherto described.

The coercive force (Hc) of the bias layer 34 can be increased, for example to 158 KA/m, according to this embodiment, because the both side faces of the projection 20c of the resistive multilayer 20 are formed as continuous inclined faces 20a, the bias underlayer 33 is formed just under the bias layer 34 when the bias layer 34 is laminated on the bias underlayer 33, and the entire surface of the lower face of the bias layer 34 contacts the upper face of the bias underlayer 33. In addition, since the bias underlayer 33 and bias layer 34 are laminated along the continuous inclined face 20a, the bias underlayer 33 is always formed just under the bias layer 34. Consequently, the manufacturing process may be simplified by eliminating the need of providing the amorphous layer, thereby reducing the manufacturing cost. Furthermore, since the bias layer 34 makes direct contact with the free magnetic layer 29 by being lifted up with the bias underlayer 33, a sufficient bias magnetic field may be applied from the bias layer 34 to the free magnetic layer 29.

Although the magnetic sensing element according to the present invention was used for the magnetic head, the application field is not restricted thereto, and the present invention may be applied to magnetic sensors as well.

According to the present invention as hitherto described, the bias magnetic field may be efficiently applied by allowing the bias layer to directly contact the free magnetic layer without providing any terraces on the pinned magnetic layer, thereby enabling magnetic properties of the bias layer to be improved at the portion in direct contact with the free magnetic layer.

Figure 17:
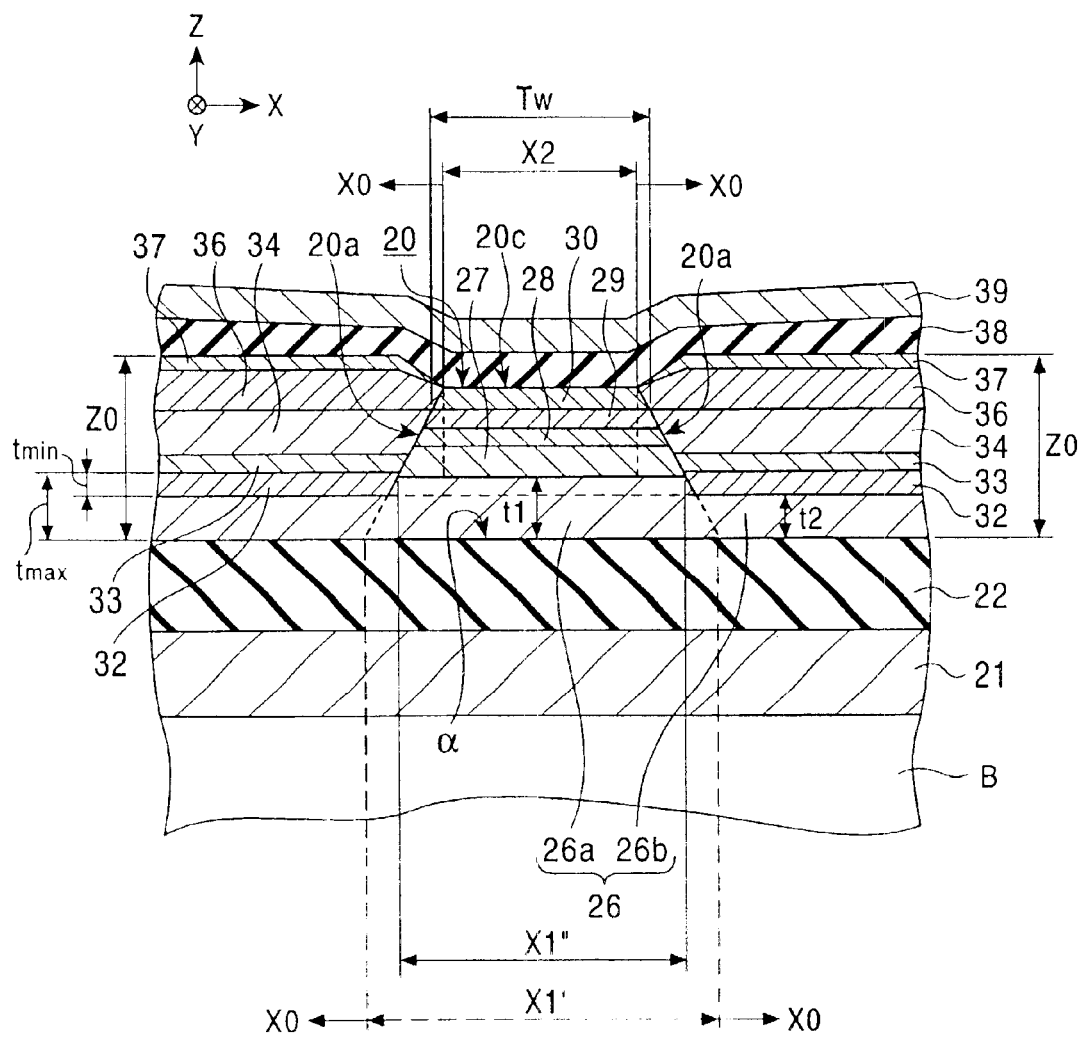
FIG. 17 is a partial cross section of a magnetic sensing element according to the fifth embodiment of the present invention viewed from an opposed face side to a recording medium.
Figure 18:
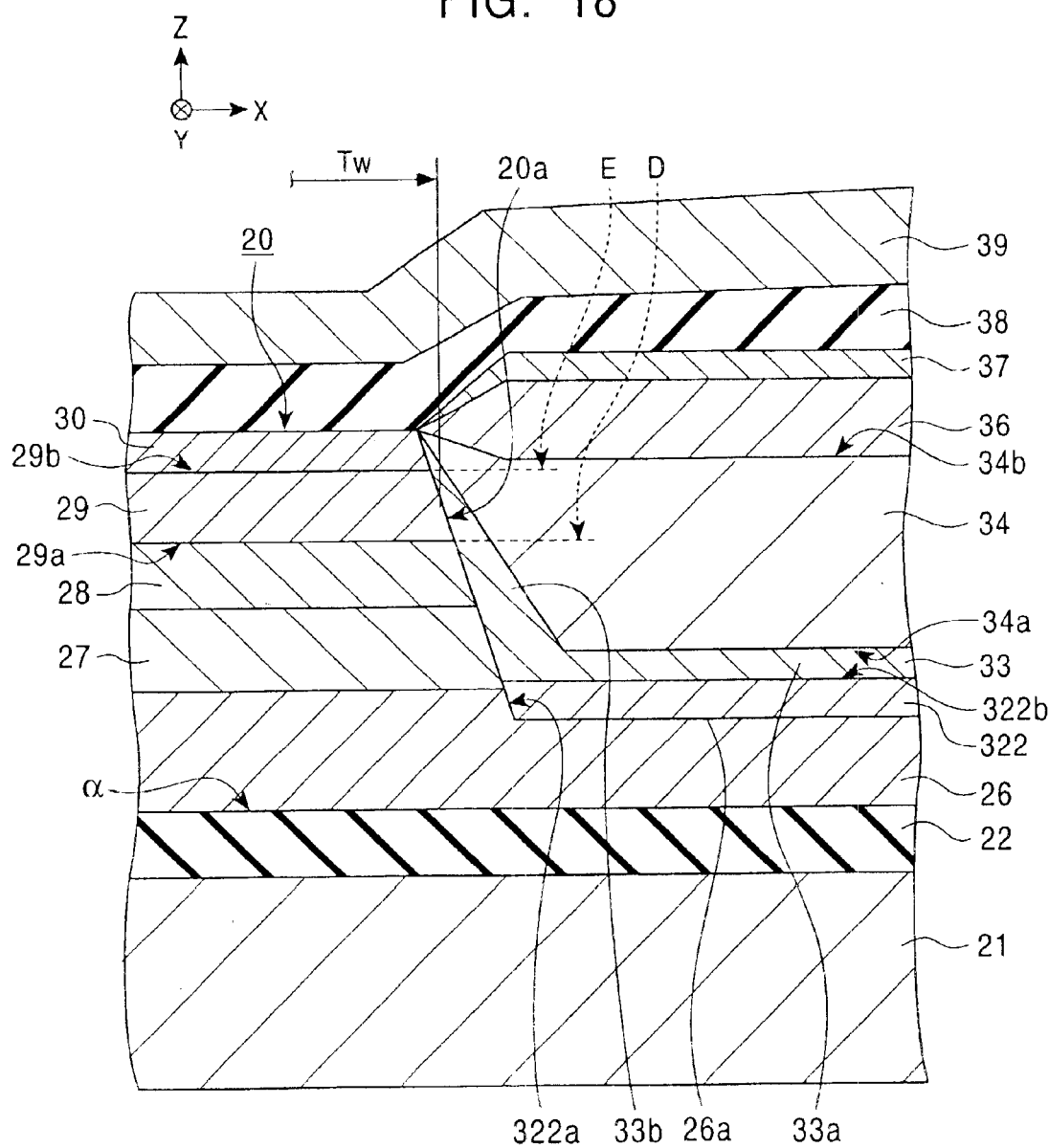
FIG. 18 is a magnified partial cross section at the right side of the magnetic sensing element shown in FIG. 17.

FIG. 17 is a partial cross section of a magnetic sensing element according to the fifth embodiment of the present invention viewed from an opposed face side to a recording medium, and FIG. 18 is a magnified partial cross section at the right side of the magnetic sensing element shown in FIG. 17.

The magnetic sensing element according to the fifth embodiment is a giant magnetoresistive element for data regeneration recorded on a recording medium. This magnetic sensing element is used for regenerative magnetic head in which electrical resistance changes in accordance with signal magnetic fields from the magnetic recording medium, and the recorded data are regenerated by taking advantage of resistance changes.

While only the magnetic sensing element to be used for the regenerative magnetic head is disclosed in FIG. 17, a recording inductive head may be laminated on the resistive multilayer 20 (in the Z-direction) of the magnetic sensing element. The inductive head comprises a core layer made of a magnetic material and a coil layer wound on the core layer, and data are written on the recording medium by taking advantage of the magnetic field generated in the core layer by flowing a recording current through the coil layer.

The magnetic sensing element to be used for the regenerative magnetic head in FIG. 17 is provided at the trailing side edge of a slider made of, for example, alumina-titanium carbide ($Al_2O_3$—TiC). This slider is bonded to a flexibly deformable suspension made of stainless steel on the back face of the opposed face to the recording medium to construct a magnetic head.

The magnetic sensing element comprises a lower shield layer 21 made of a magnetic material such as a Ni—Fe alloy or sendust is formed on a substrate B, an lower gap layer 22 made of an insulating material such as $Al_2O_3$ and $SiO_2$ formed on the lower shield layer 21, and a resistive multilayer 20 formed on the deposition surface α of the lower gap layer 22.

This resistive multilayer 20 is a so-called spin-valve type resistive multilayer. Each layer constituting the resistive multilayer 20 will be described hereinafter.

An antiferromagnetic layer 26 is formed on the deposition surface α located on the upper surface of the lower gap layer 22. The antiferromagnetic layer 26 is formed, for example, of an antiferromagnetic material comprising an element X (X represents at least one of Pt, Pd, Ir, Rh, Ru and Os) and Mn, or elements X and X' (X' represents at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare earth elements) and Mn. The antiferromagnetic layer 26 is usually formed of a Pt—Mn (platinum-manganese) alloy. Both side areas 26b of the antiferromagnetic layer 26 is formed with a smaller thickness t2 than the thickness t1 of the track width region 26a, and the antiferromagnetic layer 26 is formed as a projection on the lower gap layer 22.

The antiferromagnetic materials have an excellent corrosion resistance with a high blocking temperature, and a large exchange coupling magnetic field is generated at the interface between the antiferromagnetic layer 26 and a pinned magnetic layer 27 formed thereon.

The pinned magnetic layer 27 is formed on the antiferromagnetic layer 26. This pinned magnetic layer 27 is formed of a Ni—Fe alloy, Co—Fe alloy, Co or Co—Ni—Fe alloy. Magnetization of the pinned magnetic layer 27 is fixed in the height direction (Y-direction) by the exchange coupling magnetic field generated at the interface between the pinned magnetic layer 27 and antiferromagnetic layer 26, by annealing in a magnetic field in the height direction (Y-direction) after forming the pinned magnetic layer 27 on the antiferromagnetic layer 26. This pinned magnetic layer has a thickness of, for example, about 20 Å or more and 60 Å or less.

A nonmagnetic conductive layer 28 is formed on the pinned magnetic layer 27. The nonmagnetic conductive layer 28 is formed of a conductive material having a low electrical resistance such as, for example, Cu. The nonmagnetic conductive layer 28 is formed with a thickness of, for example, about 25 Å.

A free magnetic layer 29 is formed on the nonmagnetic conductive layer 28. This free magnetic layer 29 is formed of a Ni—Fe alloy, a Co—Fe alloy, Co or a Co—Ni—Fe alloy. The width of the free magnetic layer 29 in the X-direction is adjusted to be the track width Tw corresponding to the area for magnetic regeneration. The free magnetic layer 29 is formed with a thickness of about 20 Å or more and 40 Å or less. A Cr or Co—Fe alloy layer may be formed on the opposed side to the nonmagnetic conductive layer 28 on the free magnetic layer 29, in order to prevent metal elements from diffusing at the interface between the nonmagnetic conductive layer 28 and free magnetic layer 29 for enabling the rate of change of resistance (ΔGMR) to be increased.

The protective layer 30 is formed on the free magnetic layer 29 with Ta and the like with a thickness of about 30 Å.

The both side faces 20a and 20a of the resistive multilayer 20 comprising each layer from the antiferromagnetic layer 26 through the protective layer 30, or in the area having a trapezoid-like cross section viewed from the ABS face direction, or particularly the area of each layer (referred to as a track area) having widths from X1 (the bottom side) to X2 (upper side), are formed as inclined faces continuously extending from the upper face side of the antiferromagnetic layer 26 through the upper face of the protective layer 30. The dimension of the track width area may change depending on the amount of over-etching of the antiferromagnetic layer 26. For example, the thickness of an amorphous conductive layer 322 becomes its maximum ($t_{max}$) when the amount of etching of the antiferromagnetic layer 26 is maximum with a maximum dimension X1 of the track with region. When the amount of over-etching of the antiferromagnetic layer 26 is minimum, on the other hand, the thickness of the amorphous conductive layer 322 to be described hereinafter becomes its minimum ($t_{min}$) with a minimum dimension X1' of the track width region. Consequently, the antiferromagnetic layer 26 is formed by being elongated in both track width directions of the free magnetic layer 29. It has been technically confirmed that the rate of change of resistance of the resistive multilayer 20 tends to be increased by increasing the amount of over-etching of the antiferromagnetic layer 26 to be as large as possible.

The resistive multilayer 20 is removed by etching such as ion-milling of both side areas of the resistive multilayer 20 not covered with a resist after depositing each layer on the deposition surface α of the lower gap layer 22, followed by forming the lift-off resist (see FIG. 22) only at the central portion of the resistive multilayer 20. The both aide faces of the resistive multilayer 20 are formed etched into inclined faces by etching.

All of each layer located at outside of both side faces 20a and 20a of the resistive multilayer 20—or each layer extending from outside of the track area to the track area in the track width direction, and in the area simultaneously satisfying X0 and Z0 in the drawing—are removed except a part of the antiferromagnetic layer 26, and the resistive multilayer 20 is formed as a trapezoid-like shape as shown in FIG. 17. The track area of the antiferromagnetic layer 26 is formed as a projection by over-etching, and the amorphous conductive layers 322 is formed at the portion of over-etching at both sides of the projection of the antiferromagnetic layer 26.

The amorphous conductive layers 322, bias underlayers 33, hard bias layers 34, electrode layers 36 and protective layers 37 are formed from the bottom in this order at both sides of the trapezoid-like resistive multilayer 20 shown in FIG. 17. Each layer will be described hereinafter mainly with reference to FIG. 18.

FIG. 18 is a magnified partial cross section at the right side of the magnetic sensing element shown in FIG. 17. As shown in FIG. 18, the amorphous conductive layer 322 is formed at each side of the projected antiferromagnetic layer 26 of the resistive multilayer 20, particularly in the over-etched region. The side face 322a at each side of the resistive multilayer 20 of the amorphous conductive layer 322 is formed to be in contact with each side face 20a of the resistive multilayer 20. The amorphous conductive layer 322 is formed on each side area 26b having a smaller thickness t2 than the thickness t1 of the antiferromagnetic layer 26 in the track area 26a to maintain a desired thickness. The thickness of the amorphous conductive layer 322 is desirably 60 Å or more and 300 Å or less.

The amorphous conductive layer 322 is provided so that crystal orientations of the bias underlayer 33 and hard bias layer 34 formed on the amorphous conductive layer are not adversely affected by the crystal orientation of the antiferromagnetic layer 26 located just under the amorphous conductive layer 322. In other words, interposition of the amorphous conductive layer 322 in which the crystal structure is not ordered functions so that the crystal orientation of the antiferromagnetic layer 26 does not adversely affect the crystal orientation of the bias underlayer 33.

The amorphous conductive layer 322 also serves as a material for lifting up the bias underlayer 33 and hard bias layer 34. The hard bias layer 34 formed with interposition of the amorphous conductive layer is lifted up at a higher level within each side area of the resistive multilayer 20 in order to allow the hard bias layer 34 to face each side of the free magnetic layer 29 with a sufficient volume. The amorphous conductive layer 322 is formed with a thickness in the range of 60 to 300 Å so that it does not adversely affect crystal orientation of the bias underlayer 33.

The amorphous conductive layer 322 is deposited by sputtering of ion irradiation from a direction approximately perpendicular to the vertical direction against the antiferromagnetic layer 26 on the deposition surface α. In particular, the amorphous conductive layer 322 is deposited by ion-beam sputtering, long-throw sputtering or collimation sputtering. Since a part of the sputtered particles for deposition of the amorphous conductive layer 322 are adhered on the inclined face 20a of the resistive multilayer 20, the excess amorphous conductive layer 322 adhered on the inclined face 20a of the resistive multilayer 20 is removed by etching.

The upper face 322b of the amorphous conductive layer 322 is preferably located at a higher level (Z-direction) than the lower face 26a of the projected antiferromagnetic layer 26, since the hard bias layer 34 may be formed at a higher level in each side area of the resistive multilayer 20 to enable the hard bias layer 34 to face each side of the free magnetic layer 29 with a sufficient volume.

The bias underlayer 33 is formed on the amorphous conductive layer 322. The bias underlayer 33 comprises a planar portion 33a on the amorphous conductive layer 322, and an elongated portion 33b on each side face 20a of the conductive multilayer 20. In addition, the bias underlayer 33 has a bcc crystal structure, and at least the [211] face and [200] face are oriented in a direction perpendicular to the layer surface.

The incident angle of the sputtering particles against a vertical direction to the deposition surface α for forming the bias underlayer 33 is larger than the incident angle of the sputtering particles for forming the amorphous conductive layer 322. This sputtering angle permits the bias underlayer 33 to be formed not only on the amorphous conductive layer 322 but also on each side face 20a of the conductive multilayer 20. Since at least the [211] face or [200] face of the bias underlayer 33 is oriented in the direction perpendicular to the layer surface, the magnetic properties of the hard bias layer 34 facing the free magnetic layer 29 are improved by forming the bias underlayer 33. This fact will be verified in examples to be described hereinafter.

The amorphous conductive layer 322 is formed under the bias underlayer 33 in each side area of the resistive multilayer 20, and the antiferromagnetic layer 26 is not in direct contact with the bias underlayer. Therefore, the bias underlayer 33 is not strongly affected by crystal orientation of the antiferromagnetic layer 26, enabling the coercive force of the hard bias layer 34 formed on the bias underlayer 33 to be increased.

The amorphous conductive layer 322 formed on the deposition surface α of the antiferromagnetic layer 26 functions to lift up the bias underlayer 33 on the deposition surface α. Consequently, the hard bias layer 34 formed on the bias underlayer 33 may be elevated at a position corresponding to the level of the free magnetic layer 29 of the resistive multilayer 20, thereby enabling the hard bias layer 34 to face each side of the free magnetic layer 29 with more sufficient volume.

The hard bias layer 34 is formed on the bias underlayer 33. It is preferable that the position interposed with the amorphous conductive layer 322 and bias underlayer 33 on the over-etched surface of the antiferromagnetic layer 26, or the lower face 34a of the hard bias layer 34 on the planar portion 33a of the bias underlayer 33 is located at a lower level (in a reversed direction in the Z-direction) than the lower face 29a of the free magnetic layer 29, and the upper face 34b of the hard bias layer 34 over the planar portion 33a is located at a higher level (in the Z-direction) than the lower face 29a of the free magnetic layer 29. This construction permits the hard bias layer 34 to face each side of the free magnetic layer 29 with a sufficient volume. The hard bias layer 34 comprises a magnetic material in which at least the [100] face is preferentially oriented in the direction perpendicular to the layer surface. The magnetic properties of the hard bias layer 34 are improved by allowing the hard bias layer 34 to orient with at least its [100] face in the direction perpendicular to the layer surface, by allowing the bias underlayer 33 to orient with at least its [211] face or [200] face in the direction perpendicular to the layer surface, and by eliminating the effect of the antiferromagnetic layer 26 on these layers by the amorphous conductive layer 322, thereby enabling the coercive force (Hc) of the hard bias layer 34 to be a practical value of 160 KA/m or more while obtaining a squareness ratio of 0.8 or more. These results are verified in examples.

It is preferable that the upper face 34b of the hard bias layer 34 over the planar portion 33a of the bias underlayer 33 is approximately flush with the upper face 29b of the free magnetic layer 29, or at a higher level (in the Z-direction) than the upper face 29b of the free magnetic layer 29. This construction permits only the elongated portion 33b of the bias underlayer 33 and the hard bias layer 34 to be present within the area between two virtual lines D and E in each side area of the resistive multilayer 20 when the virtual lines D and E are drawn from the lower face 29a and upper face 29b, respectively, of the free magnetic layer 29 in the direction parallel to the deposition surface α. Consequently, a sufficient magnitude of the bias magnetic field can be supplied from the hard bias layer 34 to the free magnetic layer 29.

When a tapered and thin elongated portion 33b of the bias underlayer 33 interposes between the hard bias layer 34 and free magnetic layer 29, the bias magnetic field from the hard bias layer 34 is prevented from decreasing to enable a sufficient magnitude of the bias magnetic field to be supplied to the free magnetic layer 29.

The construction above permits a proper magnitude of the bias magnetic field to be supplied from the hard bias layer 34 to the free magnetic layer 29, thereby enabling magnetization of the free magnetic layer 29 to be properly put into a single magnetic domain state in the X-direction.

The electrode layer 36 is formed on the hard bias layer 34, and the protective layer 37 made of Ta and the like is formed on the electrode layer 36.

The material for forming the amorphous conductive layer 322 and bias underlayer 33 will be described hereinafter.

As hitherto described, the amorphous conductive layer 322, which is formed of a nonmagnetic material, functions to block the effect of orientation of the antiferromagnetic layer 26 due to its amorphous characteristics even when the antiferromagnetic layer is formed just under the amorphous conductive layer 32.

When the amorphous conductive layer 322 is formed of a Co—T—Z alloy, T represents at least one element comprising Zr and Hf, and Z represents at least one element comprising Ta and Nb. When the amorphous conductive layer 322 is formed of a Ni—X alloy, X is an element comprising at least P. The amorphous conductive layer 322 is formed with a thickness in the range of 60 Å or more and 300 Å or less.

The bias underlayer 33 is desirably formed of a metal layer having a bcc crystal structure. The bias underlayer 33 is deposited by controlling the deposition direction so that at least the [211] face or [200] face is oriented in the direction perpendicular to the layer surface.

Since the amorphous conductive layer 322 is formed under the bias underlayer 33 without forming the antiferromagnetic layer 26 just under the bias underlayer, the crystal structure of the bias underlayer may be properly adjusted to be a body-centered cubic (bcc) structure. The bias underlayer 33 is formed with a metal layer having the crystal structure and crystal orientation as described above in order to enhance the coercive force (Hc) and squareness ratio (S) of the hard bias layer 34 formed on the bias underlayer 33.

The hard bias layer 34 is formed of the Co—Pt alloy or Co—Pt—Cr alloy. These alloys have a hexagonal close-packed (hcp) crystal structure. The hard bias layer 34 is deposited so that the [100] face is oriented in the direction perpendicular to the layer surface.

The bias underlayer 33 comprising a metal layer having the bcc structure is related to the hcp structure of the Co—Pt based alloy constituting the hard bias layer 34. For example, the c-axis of the hard bias layer 34 having the hcp structure is oriented in the layer surface due to lattice matching with the bias underlayer 33. Since this orientation is advantageous as the hard bias layer 34 magnetized in the layer surface, the layer is able to have a large coercive force as well as a good squareness ratio.

While it is preferable to form the metal layer for the bias underlayer 33 having the body-centered cubic (bcc) structure using at least one element comprising Cr, W, Mo, V, Mn, Nb and Ta, the Cr layer is most preferable among them. The Cr layer has an excellent function for aligning crystal orientation of the hard bias layer 34, and is able to properly increase the coercive force of the hard bias layer 34.

The upper gap layer 38 made of an insulation material is formed on the resistive multilayer 20 formed on the deposition surface α as shown in FIG. 17, and the upper shield layer 39 made of a magnetic material is formed on the gap layer 38.

Figure 19:
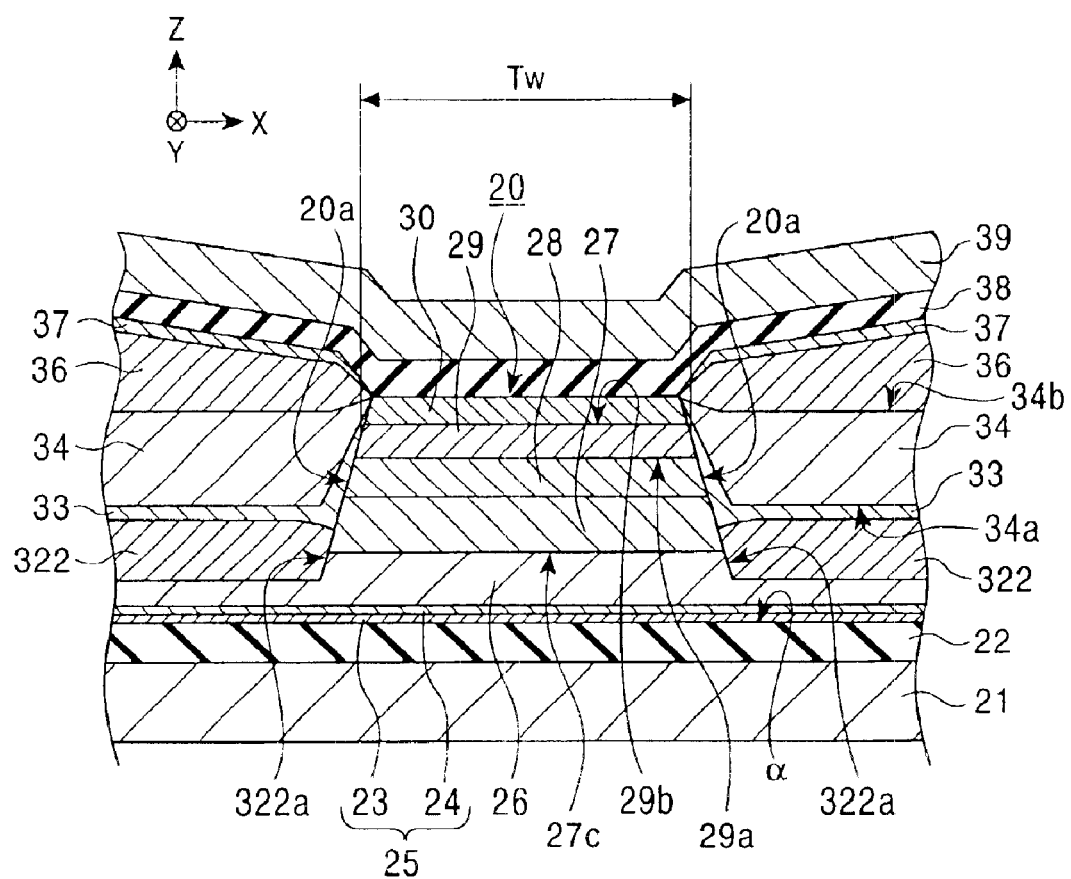
FIG. 19 is a magnified partial cross section at the right side of the magnetic sensing element according to the sixth embodiment of the present invention.

The sixth embodiment of the present invention will be described with reference to FIG. 19. The magnetic sensing element in this embodiment may be also used for a magnetic head for regenerating date recorded on a recording medium. While only the magnetic sensing element is illustrated in FIG. 19, a recording inductive head may be formed on the magnetic head comprising the magnetic sensing element as in the fifth embodiment.

The sixth embodiment differs from the fifth embodiment in that a seed layer 25 is provided between the antiferromagnetic layer 26 and gap layer 22 of the resistive multilayer 20. In other words, the seed layer 25 is formed on the lower gap layer 22 formed on the lower shield layer 21.

The seed layer 25 comprises an underlayer 23 and an orientation layer 24 formed of a nonmagnetic or magnetic material in which the [111] face of the face-centered cubic crystal or the [110] face of the body-centered cubic crystal is preferentially oriented in the direction parallel to the interface between the antiferromagnetic layer 26 and the orientation layer 24.

While the seed layer 25 may comprise only the orientation layer 24 made of monolayer of the nonmagnetic or magnetic material, the underlayer 23 is preferably formed for aligning crystal orientation of the orientation layer 24.

The underlayer 23 is preferably formed of at least one element of Ta (tantalum), Hf (hafnium), Nb (niobium), Zr (zirconium), Ti (titanium), Mo (molybdenum) and W (tungsten). While the orientation layer 24 is formed of the magnetic or nonmagnetic material as described above, the material preferably has a high resistivity. For example, the orientation layer 24 is preferably formed of a Ni—Fe—Y alloy (Y is at least one element selected from Cr, Rh, Ta, Hf, Nb, Zr and Ti). More preferably, the orientation film is formed of a Ni—Fe—Cr alloy, because the [111] face of the orientation layer 24 may be more properly and preferentially oriented in the direction parallel to the interface between the antiferromagnetic layer 26 and orientation layer 24 with a high resistivity.

The sense current flowing from an electrode layer 36 to be described hereinafter can be suppressed from shunting into the seed layer 25 when the orientation layer 24 has a high resistivity. This configuration allows the rate of change of resistance (ΔMR) to be improved to allow the Barkhausen noise to be decreased. The seed layer 25 may comprise a monolayer of Cr. Since each crystal grain grows with a uniform height due to good wettability of the Cr monolayer, the layer surface becomes free from undulation and symmetry of output signals may be improved.

The underlayer 23 in the seed layer 25 is formed with a thickness of more than 0 Å and about 50 Å or less, and the orientation layer 24 is formed with a thickness of about 10 Å or more and about 100 Å or less.

The antiferromagnetic layer 26 is formed on the seed layer 25 as in the first embodiment. The antiferromagnetic layer 26 has an excellent corrosion resistance and high blocking temperature, and is able to generate a large exchange coupling magnetic field at the interface between the pinned magnetic layer 27 and antiferromagnetic layer. The antiferromagnetic layer 26 is preferably formed with a thickness of 50 Å or more and 250 Å or less.

The [111] face of the face-centered cubic crystal or the [110] face of the body-centered cubic crystal of the seed layer 25 is preferentially oriented in the direction parallel to the interface between the antiferromagnetic layer 26 and seed layer. Consequently, the seed layer 24 may be preferentially oriented in the direction parallel to the [111] face of the antiferromagnetic layer 26 formed on the seed layer 25, the [111] face of each layer formed over the antiferromagnetic layer 26, and the [111] face of each layer formed on the antiferromagnetic layer 26. As a result, the crystal grain diameter may be increased to enable the rate of change of resistance (ΔGMR) to be improved.

The pinned magnetic layer 27 is preferably formed with a thickness of about 20 Å or more and 60 Å or less. The nonmagnetic conductive layer 28 is formed, for example, with a thickness of about 25 Å. The free magnetic layer 29 is preferably formed with a thickness of 20 Å or more and 40 Å or less. The free magnetic layer 29 comprises a bilayer structure, and the side thereof opposed to the nonmagnetic conductive layer 28 is formed of a Co layer. This layer structure can prevent metal elements from diffusing at the interface between the nonmagnetic conductive layer 28 and the free magnetic layer 29, thereby enabling the rate of change of resistance (ΔGMR) to be increased. The protective layer 30 on the free magnetic layer 29 is formed of Ta and the like with a thickness of about 30 Å.

Both side faces 20a and 20a of the resistive multilayer 20 comprising each layer from the seed layer 25 trough the protective layer 30 in the track with direction (the X-direction) also form continuous inclined faces from the lower face of the seed layer 25 through the upper face of the protective layer 30 in the sixth embodiment.

A lift-off resist layer is formed only the central portion of the resistive multilayer 20 after depositing each layer on the deposition surface α, followed by removing both side faces of the resistive multilayer 20 not covered with the resist layer in this embodiment as in the preceding fifth embodiment.

Both side areas of the resistive multilayer 20 is not so deeply etched as to expose the deposition surface α, and a part of the seed layer 25 or a part of the antiferromagnetic layer 26 is left behind.

The amorphous conductive layer 322, bias underlayer 33, hard bias layer 34, electrode layer 36 and protective layer 37 are formed from the bottom in this order in each side area of the resistive multilayer 20 as in the preceding fifth embodiment.

While the amorphous conductive layer 322 is formed on the deposition surface α in each side area of the resistive multilayer 20, the side face 322a of the amorphous conductive layer 322 is formed in contact with each side face 20a of the resistive multilayer 20. The hard bias layer 34 formed on the amorphous conductive layer 322 with interposition of the bias underlayer 33 is formed at a higher level in each side area of the resistive multilayer 20 with a sufficient volume in each side of the free magnetic layer 29.

The amorphous conductive layer 322 is preferably formed on the deposition surface α with a thickness of 60 Å or more and 300 Å or less. The bias underlayer 33 preferably has a thickness of 35 Å or more and 75 Å or less.

The amorphous conductive layer 322 is also deposited by sputtering by ion irradiation from a direction approximately perpendicular to the deposition surface α. While a part of the lift-up amorphous conductive layer 322 is formed on each side face 20a of the resistive multilayer 20, this part is removed by etching.

The upper face 322b of the amorphous conductive layer 322 is preferably located at a higher level (in the Z-direction) than the lower face 26a of the antiferromagnetic layer 26. This construction permits the hard bias layer 34 to be formed at a higher level in each side area of the resistive multilayer 20, thereby enabling the hard bias layer 34 to face each side of the free magnetic layer 29 with a sufficient volume.

The amorphous conductive layer 322 is formed under the bias underlayer 33 formed in each side area of the resistive multilayer 20, and the seed layer 25 and antiferromagnetic layer 26 are formed under the amorphous conductive layer. Consequently, the bias underlayer 33 is not affected by crystal orientation of the seed layer 25 and antiferromagnetic layer 26, thereby enabling the coercive force of the hard bias layer 34 formed on the bias underlayer 33 to be increased. Since side areas of the amorphous conductive layer 322 and antiferromagnetic layer 26 are allowed to interpose under the bias underlayer 33 in order to lift-up the bias underlayer 33 and hard bias layer 34, the problems of reducing the volumes of these layers due to tapered shape of the bias underlayer 33 may be solved.

Preferably, the lower face 34a of the hard bias layer 34 on the planar portion 33a of the bias underlayer 33 is located at a lower level than the lower face 29a of the free magnetic layer 29 (in the reversed direction of the Z-direction), and the upper face 34b of the hard bias layer 34 over the planar portion 33a is located at a higher level (in the Z-direction) than the lower face 29a of the free magnetic layer 29.

It is more preferable that, in addition to the construction above, the upper face 34b of the hard bias layer 34 on the planar portion 33a of the bias underlayer 33 is located to be flush with the upper face 29b of the free magnetic layer 29, or at the higher level (in the Z-direction) than the upper face 29b of the free magnetic layer 29. Since only the elongated portion 33b of the bias underlayer 33 and hard bias layer 34 are included within the area between two virtual lines in each side of the resistive multilayer 33 when the virtual lines are drawn in the direction parallel to the deposition surface α, more sufficient magnitude of the bias magnetic field can be supplied from the hard bias layer 34 to the free magnetic layer 29.

Since the tapered and thin elongated portion 33b of the bias underlayer 33 is interposed between the hard bias layer 34 and free magnetic layer 29 in this embodiment as in the preceding embodiment, the bias magnetic field from the hard bias layer 34 is not so extremely reduced to enable a sufficient magnitude of the free magnetic field to be supplied to the free magnetic layer 29.

The amorphous conductive layer 322 is formed under the bias underlayer 33, and the seed layer 25 and antiferromagnetic layer 26 are formed below the amorphous conductive layer in this embodiment. Consequently, the crystal structure of the bias underlayer 33 can be properly aligned into the body-centered cubic (bcc) structure. It is also preferable in this embodiment, as in the preceding embodiment, that the bias underlayer 33 comprises a metal layer having the body-centered cubic (bcc) crystal structure, and the crystal of the bias underlayer 33 is oriented in the [200] and [211] faces.

The hard bias layer 34 in this embodiment is also formed of the Co—Pt alloy or Co—Pt—Cr alloy having the hexagonal close-packed (hcp) crystal structure.

The bias underlayer 33 comprising a metal layer having the bcc structure is also related to the hcp structure of the Co—Pt based alloy constituting the hard bias layer 34 in this embodiment. For example, the c-axis of the hard bias layer 34 having the hcp structure is oriented in the layer surface due to lattice matching with the bias underlayer 33. Since this orientation is advantageous as the hard bias layer 34 magnetized in the layer surface, the layer is able to have a large coercive force as well as a good squareness ratio.

As shown in FIG. 19, the upper gap layer 38 comprising an insulation material is also formed on the resistive multilayer 20 formed on the deposition surface α, and the upper shield layer 39 comprising a magnetic material is also formed on the upper gap layer 38 in this embodiment.

According to the second embodiment, crystal orientation of the antiferromagnetic layer 26 is aligned to improve the rate of change of resistance of the resistive multilayer 20, by forming the seed layer 25 at the lowermost layer with the antiferromagnetic layer 26 formed thereon.

Since the amorphous conductive layer 322 is also formed under the bias layer 33 formed in each side of the resistive multilayer 20 with the seed layer 25 below the amorphous conductive layer in this embodiment, the bias underlayer 33 may be formed with an appropriate crystal structure and crystal orientation. This configuration permits the coercive force of the hard bis layer 34 formed on the bias underlayer 33 to be enhanced.

Figure 20:
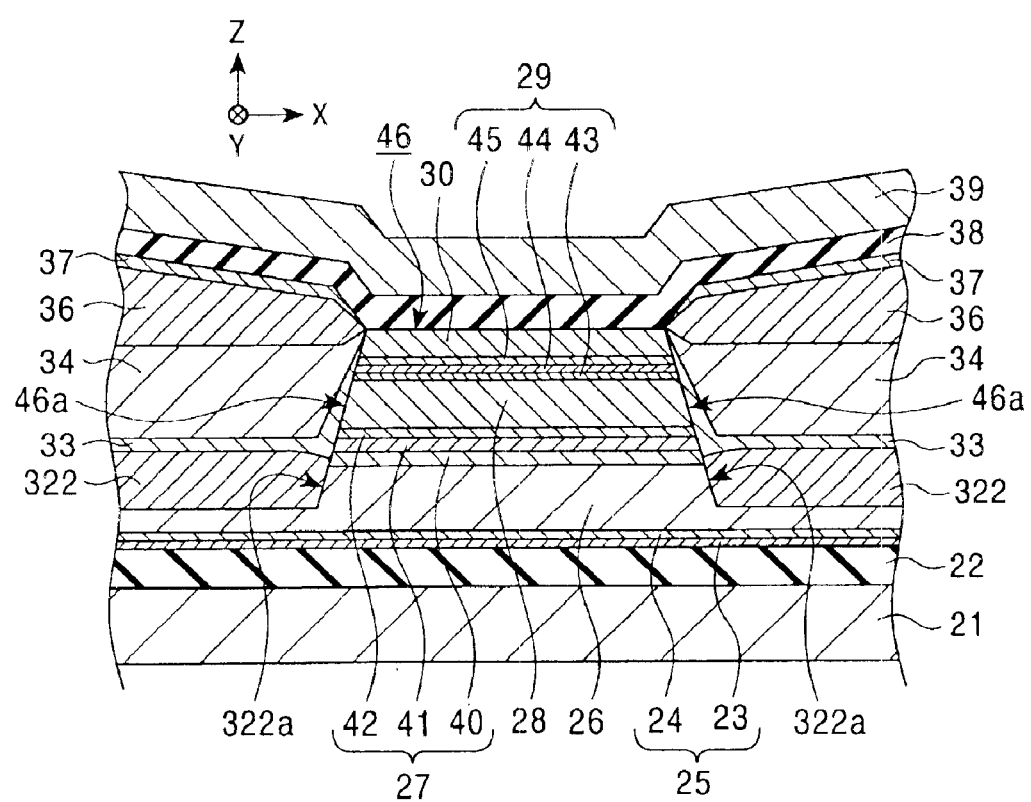
FIG. 20 is a partial cross section of a magnetic sensing element according to the seventh embodiment of the present invention viewed from an opposed face side to a recording medium.

The seventh embodiment of the present invention will be described hereinafter with reference to FIG. 20. FIG. 20 is a partial cross section of a magnetic sensing element according to the seventh embodiment of the present invention viewed from an opposed face (ABS side) side to a recording medium.

This magnetic sensing element is also used for the magnetic head for regenerating recorded data on a magnetic recording medium. While FIG. 20 illustrates only the magnetic sensing element, a recording inductive head may be formed on the magnetic head comprising the magnetic sensing element.

The embodiment illustrated in FIG. 20 differs from the embodiment in FIG. 17 in the structure of the pinned magnetic layer 27 and free magnetic layer 29. While each of the pinned magnetic layer 27 and free magnetic layer 29 comprises a monolayer in FIG. 17, each of the pinned magnetic layer 27 and free magnetic layer 29 in FIG. 20 comprises three layers.

The pinned magnetic layer 27 is composed of a ferromagnetic layer 40, a nonmagnetic intermediate layer 41 and a ferromagnetic layer 42. The ferromagnetic layers 40 and 42 are formed of Co (cobalt), and the nonmagnetic intermediate layer 41 is formed of Ru (ruthenium). This three layer structure makes the magnetization directions of the ferromagnetic layers 40 and 42 to be in an antiparallel relation with each other. This structure is called as a ferrimagnetic state, which enables magnetization of the pinned magnetic layer 27 to be stabilized while enabling the exchange coupling magnetic field generated at the interface between the pinned magnetic layer 27 and antiferromagnetic layer 26 to be increased.

The free magnetic layer 29 also comprises ferromagnetic layers 43 and 45 formed of Co, and a nonmagnetic intermediate layer 44 made of Ru interposed between the ferromagnetic layers 43 and 45. This arrangement permits the free magnetic layer 29 to be maintained in a more stable state, and magnetic thickness of each of the ferromagnetic layers 43 and 45 to be reduced. Consequently, magnetization of the free magnetic layer 29 can be readily rotated while maintaining an antiparallel relation to the external magnetic field, thereby improving regenerative characteristics. This ferrimagnetic structure may be formed in either the pinned magnetic layer 27 or free magnetic layer 29.

Each of the ferromagnetic layers 40 and 42, and ferromagnetic layers 43 and 45 are formed with a thickness of 10 to 70 Å. The nonmagnetic intermediate layers 41 and 44 are formed with a thickness of about 3 Å to 10 Å.

The lowermost layer of the resistive multilayer 46 is also the seed layer 25 in this seventh embodiment, and both side faces 46a and 46a of the resistive multilayer 46 in the track width direction (X-direction) are formed as continuous inclined faces from the bottom face of the seed layer 25 through the upper face of the protective layer 30. Since an amorphous conductive layer 322 is formed under the bias underlayer 33, and the seed layer 25 and antiferromagnetic layer 26 are formed below the amorphous conductive layer, a prescribed crystal orientation may be maintained in the bias underlayer 33.

In addition, a hard bias layer 34 having a high coercive force can face each side of the free magnetic layer 29 with a sufficient thickness, by forming the amorphous conductive layer 322 on each side (particularly on the over-etched portion) of the projected antiferromagnetic layer 26 of the resistive multilayer 46. Since the bias underlayer 33 interposed between the free magnetic layer 29 and hard bias layer 34 may be formed with a small thickness, a sufficient magnitude of the bias magnetic field may be supplied from the hard bias layer 34 to the free magnetic layer 29 to enable the free magnetic layer 29 to be promptly put into a single magnetic domain state.

Desirably, the amorphous conductive layer 322 is formed up to the upper face of the intermediate layer 41 of the pinned magnetic layer 27, since a shunt loss may be reduced to increase output voltages by reducing the amount of the sense current flowing into the intermediate layer 41 of the pinned magnetic layer 27, magnetic layer 40 and antiferromagnetic layer 26.

FIGS. 21 to 26 are cross sections illustrating a manufacturing process of the magnetic sensing element shown in FIG. 17 in the order of the manufacturing steps. Each drawing denotes a partial cross section viewed from an opposed (ABS) face to the recording medium.

Figure 21:
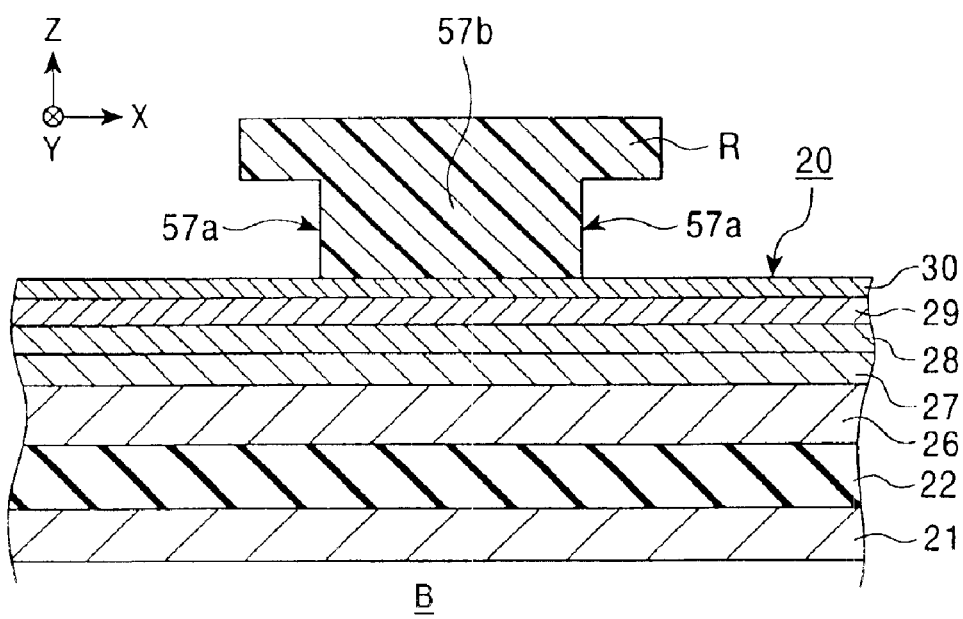
FIG. 21 is a cross section showing a first step of the process for manufacturing the magnetic sensing element shown in FIG. 17.

In the step shown in FIG. 21, a lower shield layer 21 is formed on a substrate B with a magnetic material such as permalloy or sendust, and a lower gap layer 22 made of an insulation material such as alumina is formed on the lower shield layer 21.

Then, each layer constituting the resistive multilayer 20 as the magnetic sensing element is formed over the lower gap layer 22. The antiferromagnetic layer 26 made of the Pt—Mn alloy is formed on the lower gap layer 22 at first. The pinned magnetic layer 27 made of a magnetic material such as the Ni—Fe alloy, the nonmagnetic conductive layer 28 made of Cu, the free magnetic layer 29 made of the Ni—Fe alloy, and the protective layer 30 made of Ta are further formed on the antiferromagnetic layer 26.

For forming the seed layer 25 shown in FIG. 19, the seed layer 25 comprising the underlayer 23 made of Ta and the nonmagnetic layer 24 made of the Ni—Fe—Cr alloy is formed on the lower gap layer 22 at first. Then, the antiferromagnetic layer 26 made of the Pt—Mn alloy is formed on the seed layer 25. For depositing the resistive multilayer 46 shown in FIG. 20, the pinned magnetic layer 27 and free magnetic layer 29 are put in a ferrimagnetic state.

As shown in FIG. 21, the lift-off resist R formed at the central portion of the protective layer 30 is patterned by coating, exposure and development steps. Excised portions 57a and 57a are provided under the lower face 57a of the resist R.

Figure 22:
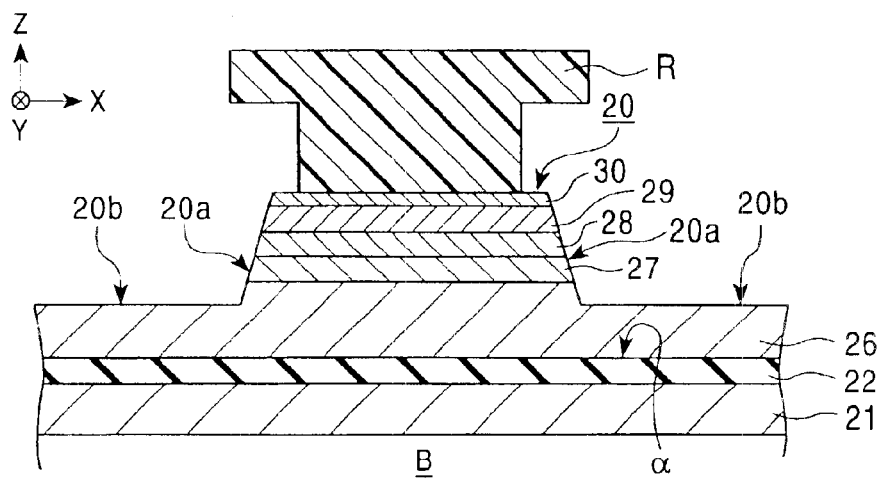
FIG. 22 is a cross section showing a second step of the process for manufacturing the magnetic sensing element shown in FIG. 17.

In the next step shown in FIG. 22, both side areas 20b and 20b of the resistive multilayer 20 in the track width direction (X-direction) not covered with the resist R are removed by etching.

The side areas 20b and 20b of the resistive multilayer 20 is shaved-off to the antiferromagnetic layer 26 to a depth not to expose the upper face (the deposition surface α of the magnetoresistive element) of the lower gap layer 22 in this embodiment. As a result, the remaining side faces 20a and 20a of the resistive multilayer 20 form continuous inclined faces from the upper face of the antiferromagnetic layer 26 through the upper face of the protective layer 30, and the resistive multilayer 20 is formed into a trapezoid-like shape.

Figure 23:
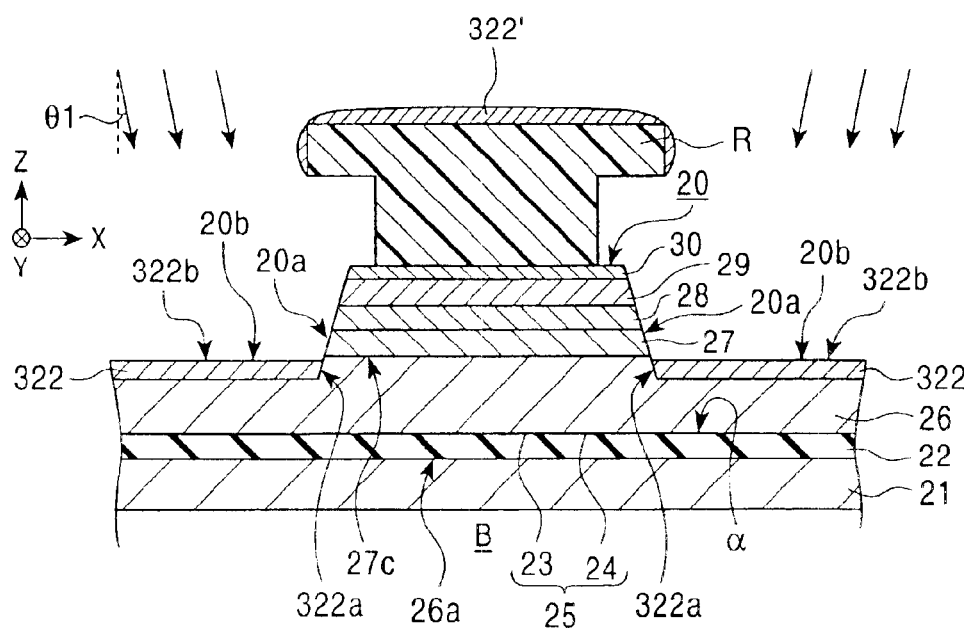
FIG. 23 is a cross section showing a third step of the process for manufacturing the magnetic sensing element shown in FIG. 17.

Then, the amorphous conductive layer 322 is deposited by sputtering on each side of the projected antiferromagnetic layer 26 (particularly the over-etched portion) as shown in FIG. 23. The end face 322a of the amorphous conductive layer 322 at the conductive multilayer 20 side is made to contact each side face 20a of the conductive multilayer 20.

As shown in FIG. 23, the amorphous conductive layer 322 is deposited by sputtering with an incident angle θ1 of the first sputtering particles relative to the vertical direction (Z-direction) to the deposition surface α. It is particularly preferable that the incident angle θ1 of the first sputtering particles is 0° or more and 10° or less. A layer 322' comprising the same material as that of the amorphous conductive layer 322 adheres on the resist R.

The amorphous conductive layer 322 is deposited by sputtering from a direction approximately perpendicular to the deposition surface α. Long-throw sputtering (LTS), ion-beam sputtering (IBD) or collimation sputtering is preferably used for layer deposition.

Then, the amorphous conductive layer 322 adhered on each side area 20a of the resistive multilayer 20 is removed by etching. Although the amorphous conductive layer should be completely removed, a small amount of the residual amorphous layer is of no problem since conductivity of the amorphous conductive layer 322 does not prevent the sense current from flowing through the free magnetic layer 29. Allowing a small amount of the amorphous layer to be left behind enables the etching time to be shortened to protect the resistive multilayer 20 from being etched.

The amorphous conductive layer 322 is deposited by controlling its thickness, in order to locate the upper face 322b of the amorphous conductive layer 322 at a higher level than the lower face 26a of the antiferromagnetic layer 26. The amorphous conductive layer 322 preferably has a thickness within a range of 60 Å to 300 Å.

It is also preferable that the bias underlayer 33, hard bias layer 34, electrode layer 36 and protective layer 37 to be deposited in the succeeding steps are deposited by sputtering.

The bias underlayer 33 preferably comprises a metal layer with a bcc crystal structure in this embodiment. While the metal layer comprises Cr, W, Mo, V, Mn, Nb or Ta, the bias layer 33 is particularly deposited by sputtering using Cr.

Figure 24:
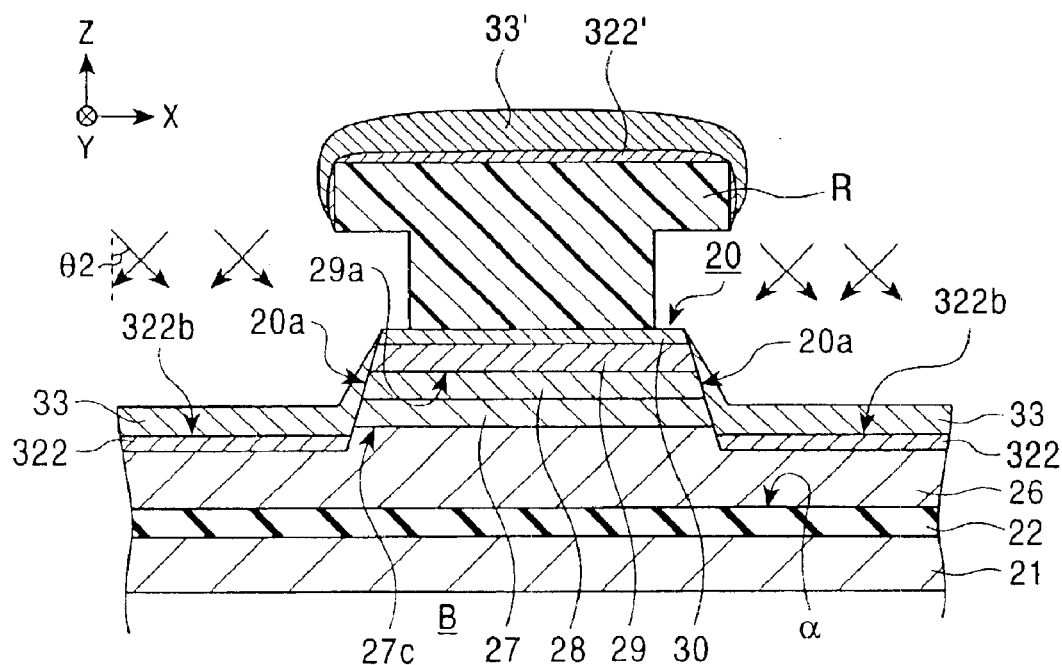
FIG. 24 is a cross section showing a fourth step of the process for manufacturing the magnetic sensing element shown in FIG. 17.

In the next step shown in FIG. 24, the bias underlayer 33 is deposited by sputtering from the upper face 322b of the amorphous conductive layer 322 through each side face 20a of the resistive multilayer 20. As shown in the drawing, while the bias underlayer 33 is deposited by sputtering with an incident angle θ2 of the second sputtering particles relative to the vertical direction (Z-direction) to the deposition surface α, the incident angle θ2 of the second sputtering particles is preferably larger than the incident angle θ1 of the first sputtering particles. The preferable incident angle θ2 of the second sputtering particles is preferably 15° or more and 60° or less, more preferably 30° or more and 60° or less. A layer 33' comprising the same material as in the bias underlayer 33 is also formed on the resist R.

The bias layer 33 is deposited by sputtering in the direction more inclined to the direction perpendicular to the deposition surface α than depositing the amorphous conductive layer 322. Consequently, the bias layer 33 is liable to be deposited not only on the amorphous conductive layer 322 but also on each side face 20a of the resistive multilayer 20 as shown in the drawing. While it is preferable to form the bias underlayer 33 onto each side face of the free magnetic layer 29 when the bias underlayer 33 is formed by being elongated on each side face 20a of the resistive multilayer 20, the bias underlayer 33 may be elongated only to the lower side of each side face of the free magnetic layer 29. Alternatively, the bias underlayer 33 may be formed only on the amorphous conductive layer 322 without being elongated to each side face of the resistive multilayer 20.

Figure 25:
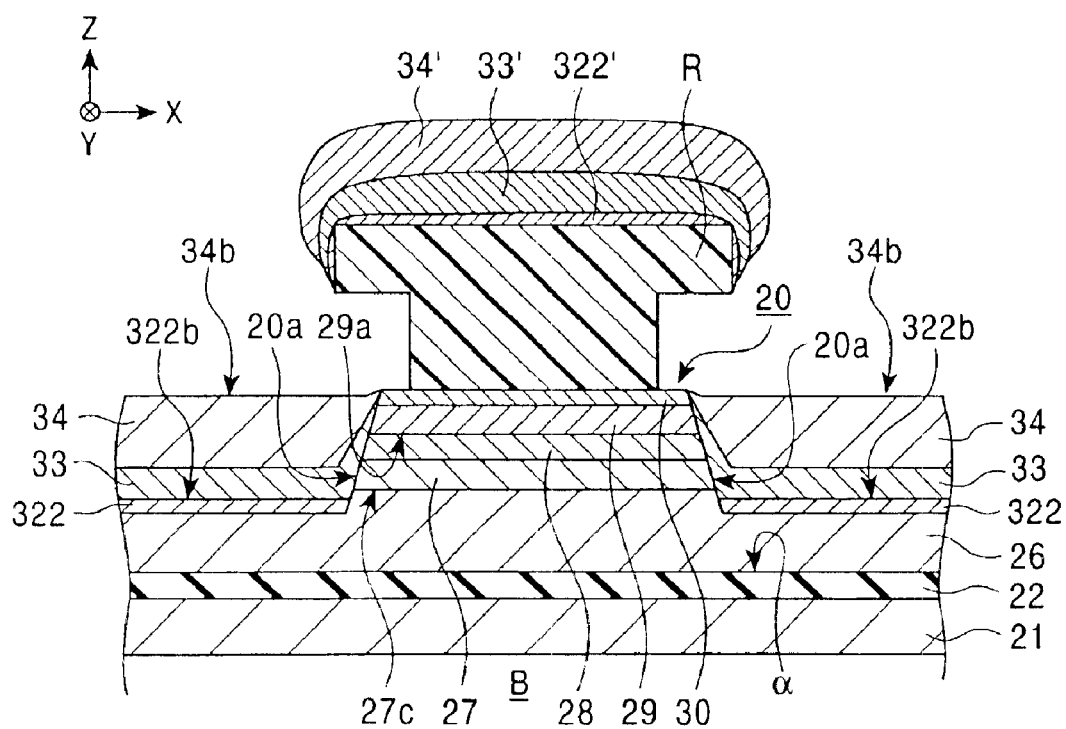
FIG. 25 is a cross section showing a fifth step of the process for manufacturing the magnetic sensing element shown in FIG. 17.

Preferably, the bias underlayer 33 and the amorphous conductive layer 322 are deposited by sputtering by appropriately controlling each thickness in the steps for forming these layers as shown in FIGS. 24 and 25, respectively, so that the upper face 33c of the bias underlayer 33 on the deposition surface α is located at a level lower than the lower face 29a of the free magnetic layer 29. This configuration permits the hard bias layer 34 to face each side of the free magnetic layer 29 with a sufficient volume.

The bias layer 33 preferably comprises a metal layer having the bcc crystal structure in this embodiment as hitherto described, and the metal layer may comprise at least one element selected from Cr, W, Mo, V, Mn, Nb and Ta. Preferably, the bias underlayer 33 comprises Cr among the elements, because the Cr layer tends to form the hard bias layer 34 having the hcp crystal structure in the next step, thereby enabling the coercive force of the hard bias layer 34 to be increased.

In the next step shown in FIG. 25, the hard bias layer 34 comprising the Co—Pt—Cr alloy is deposited by sputtering on the bias underlayer 33. A layer 34' comprising the same material as in the hard bias layer 34 is also deposited on the resist R. Since the amorphous conductive layer 322 is formed at each side of the projected antiferromagnetic layer 26 in this embodiment as described above, the hard bias layer 34 formed on the amorphous conductive layer 32 with interposition of the bias underlayer 33 between them may face the free magnetic layer 29 with a sufficient volume in each side.

According to the magnetic sensing element manufactured by the method in this embodiment, the bias magnetic field is properly supplied to the free magnetic layer 29 from the hard bias layer 34 to enable the free magnetic layer 29 to be properly put into a single magnetic domain state.

Since the amorphous conductive layer 322 is formed under the bias underlayer 33 in this embodiment without forming the antiferromagnetic layer 26 just under the bias underlayer, the crystal orientation of the bias underlayer 33 may be properly aligned to enable the coercive force of the hard bias layer 34 formed on the bias underlayer 33 to be enhanced.

It is also preferable in this embodiment to deposit the hard bias layer 34 so that the upper face 34b of the hard bias layer 34 is located at a higher level than the upper face 29b of the free magnetic layer 29.

A more sufficient magnitude of the bias magnetic field may be supplied from the hard bias layer 34 to the free magnetic layer 29 when the lower face 34a of the hard bias layer 34 is located at a lower level than the lower face 29a of the free magnetic layer 29, because the hard bias layer 34 faces each side of the free magnetic layer 29 with interposition of the bias underlayer 33 within the area of the thickness of the free magnetic layer 29 in the direction parallel to the deposition surface α, thereby facilitating magnetization of the free magnetic layer 29 to be more properly put into a single magnetic domain state.

Figure 26:
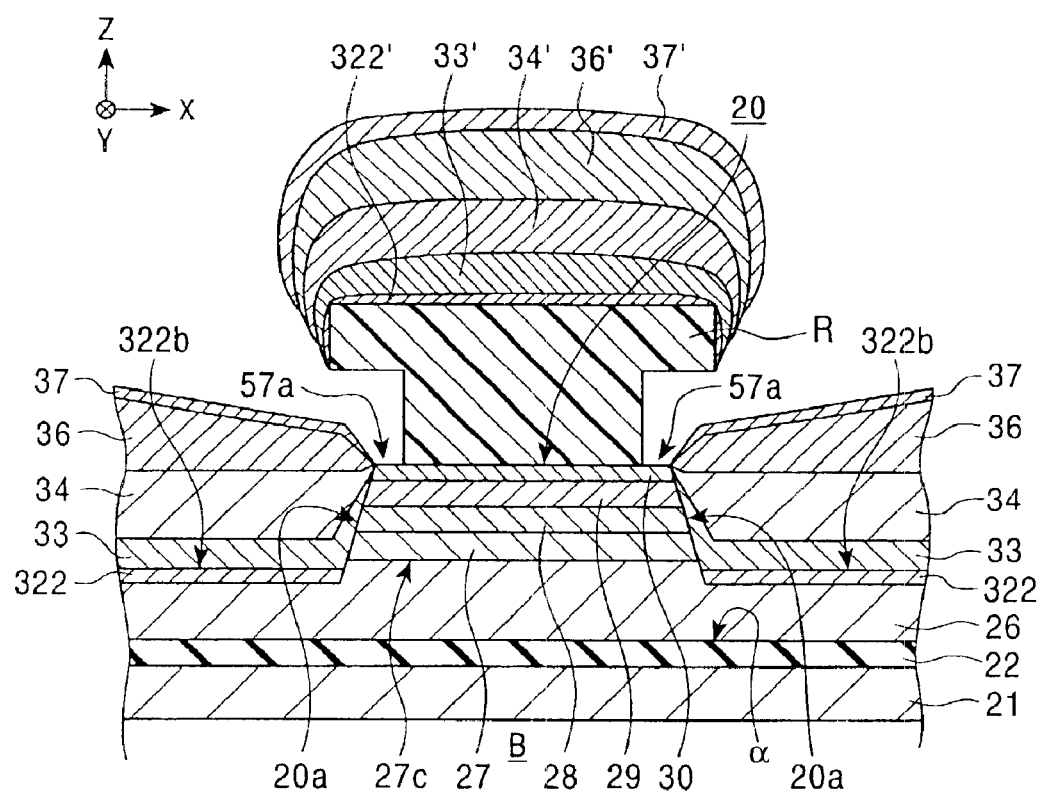
FIG. 26 is a cross section showing a sixth step of the process for manufacturing the magnetic sensing element shown in FIG. 17.

In the step shown in FIG. 26, the protective layer 37 made of Ta and the like is deposited by sputtering on the electrode layer 36 after depositing the Cr or Au electrode layer 36 on the hard bias layer 34. A layer 36' comprising the same material as in the electrode layer 36, and a layer 37' comprising the same material as in the protective layer 37 are laminated on the resist R.

The magnetic sensing element as shown in FIG. 17 is completed by removing the lift-off resist R shown in FIG. 26, followed by forming the upper gap layer 38 and lower shield layer 39 (not shown) on the resistive multilayer 20.

As hitherto described, the etching step of each side area of the resistive multilayer 20, and deposition steps of the amorphous conductive layer 322, bias underlayer 33, hard bias layer 34, electrode layer 36 and protective layer 37 by sputtering are continuously applied by forming the lift-off resist R on the resistive multilayer 20. Consequently, the magnetic sensing element according to this embodiment may be readily prepared using the manufacturing process as hitherto described.

The amorphous conductive layer 322 and bias underlayer 33 can be readily formed into a prescribed shape in this embodiment by adjusting the incident angle θ1 of the first sputtering particles for forming the amorphous conductive layer 322 to be smaller than the incident angle θ2 of the second sputtering particles for forming the bias underlayer 33. Furthermore, the hard bias layer 34 may readily face each side of the free magnetic layer 29 with a sufficient volume according to the manufacturing process in this embodiment.

EXAMPLE

The effects of the deposition angle of the bias underlayer 33 on the X-ray diffraction (XRD) peak ratio of the hard bias layer were experimentally confirmed, wherein the amorphous metal layer 322 is formed as an underlayer of the bias underlayer 33, the bias underlayer 33 and hard bias layer 34 are sequentially formed on the amorphous metal layer 322, and the bias underlayer 33 and hard bias layer 34 comprise the Cr layer and Co—Pt alloy layer, respectively.

Figure 28A:
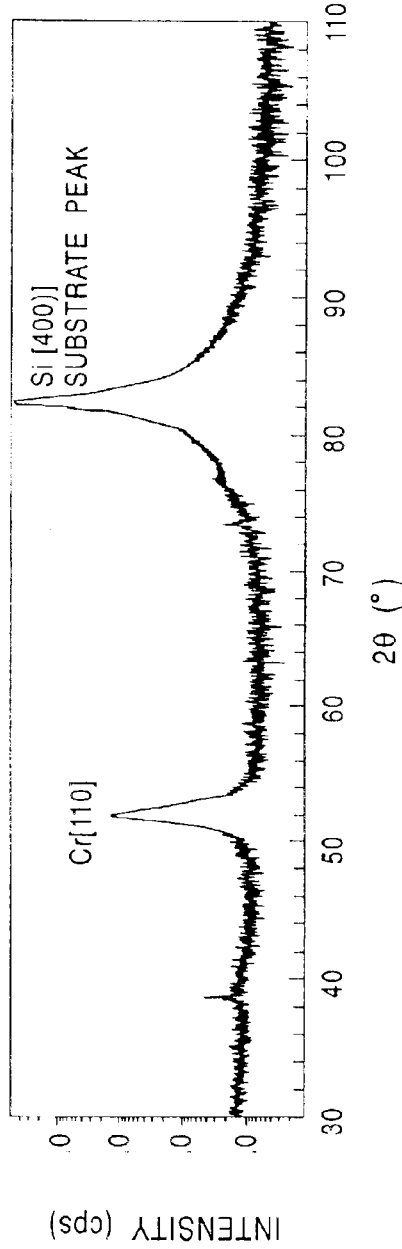
FIG. 28A is a X-ray diffraction diagram showing an orientation of a Cr layer deposited at an angle of 20°.
Figure 28B:
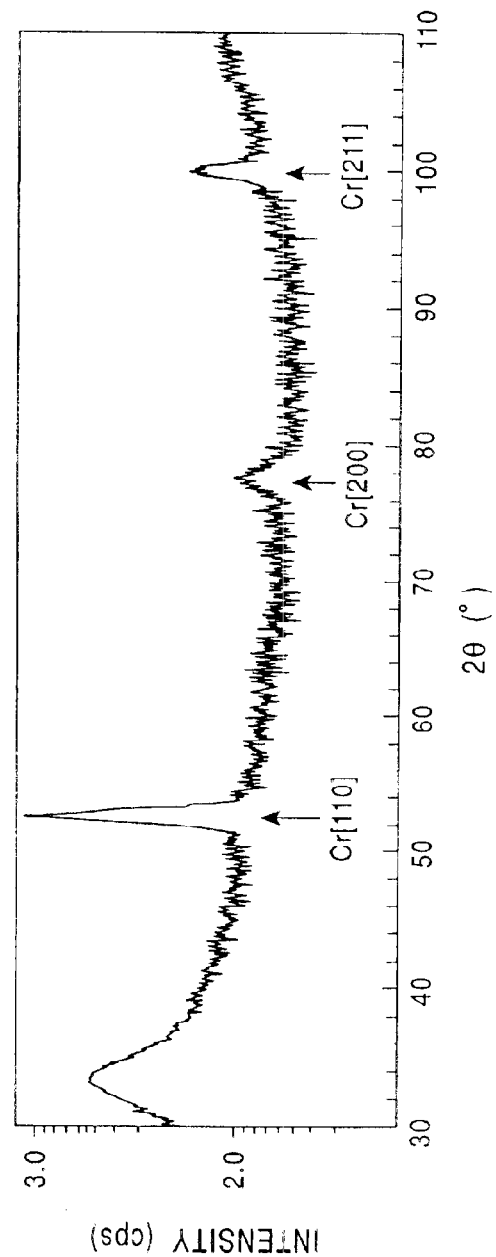
FIG. 28B is a X-ray diffraction diagram showing an orientation of a Cr layer deposited at an angle of 50°.
Figure 28C:
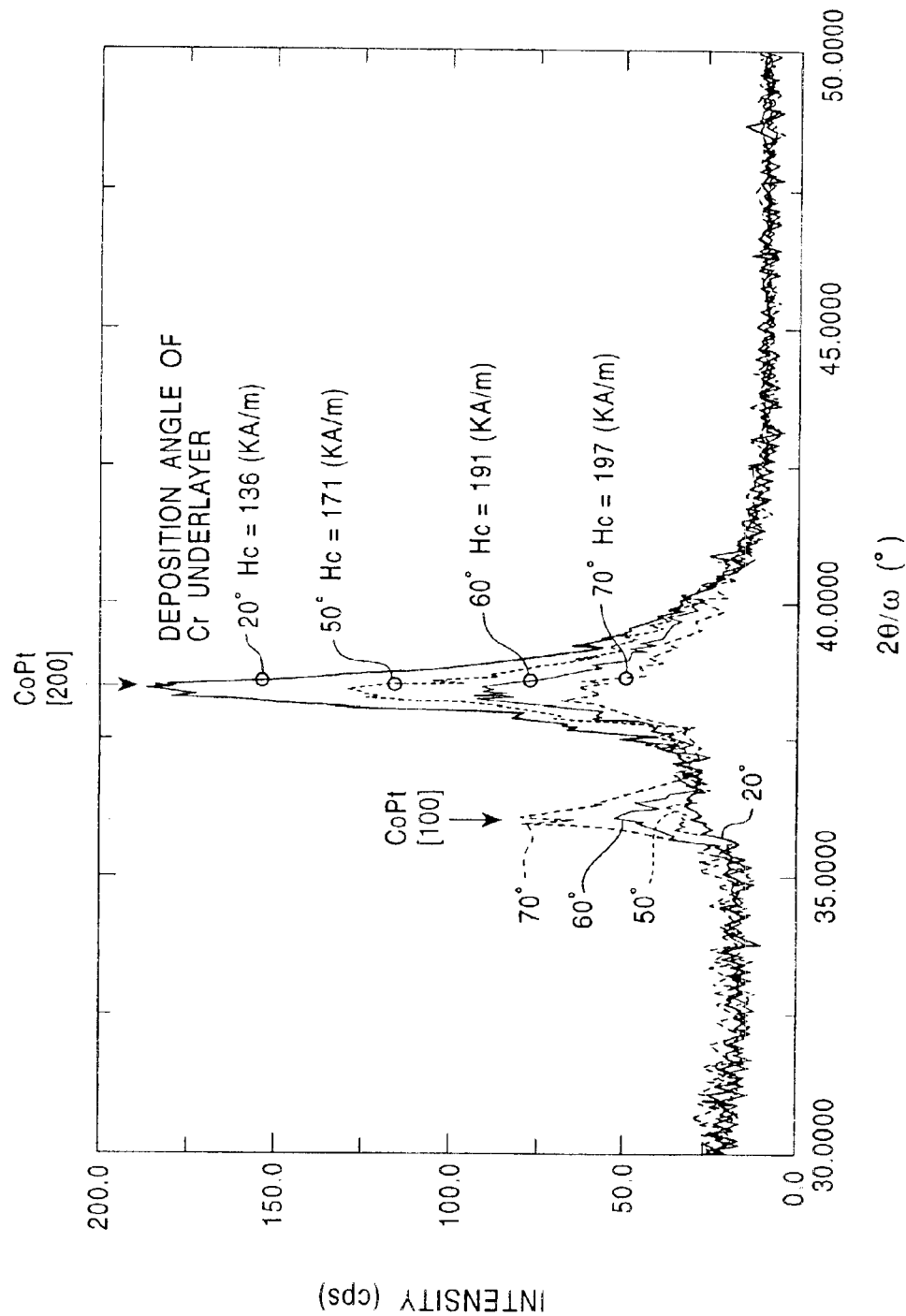
FIG. 28C is a multi-recording X-ray diffraction diagram showing orientations and coercive forces of Co—Pt alloy layers dependent on deposition angles of Cr.
Figure 29:
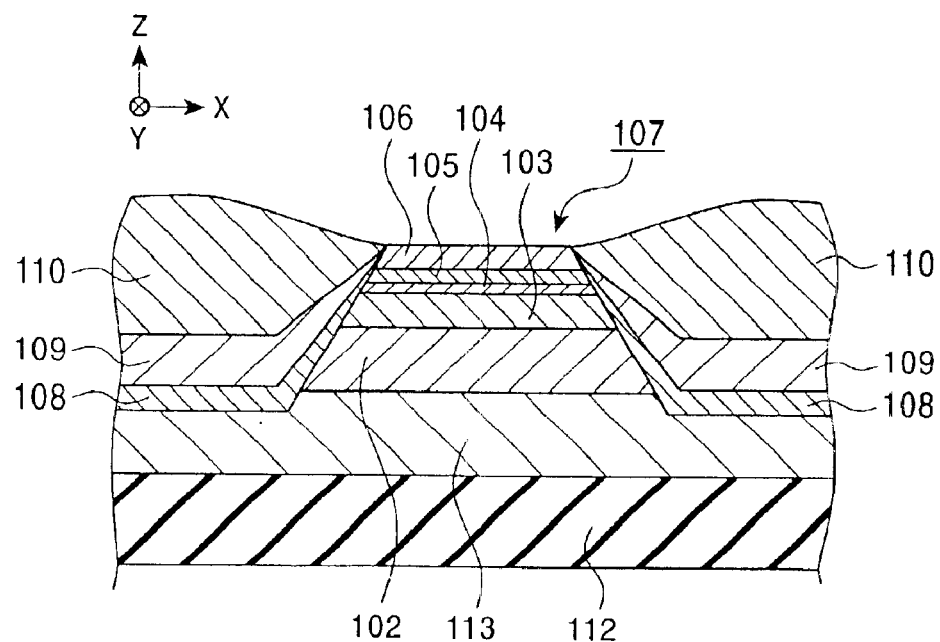
FIG. 29 is a partial cross section of a conventional magnetic sensing element viewed from an opposed face to a recording medium.
Figure 30:
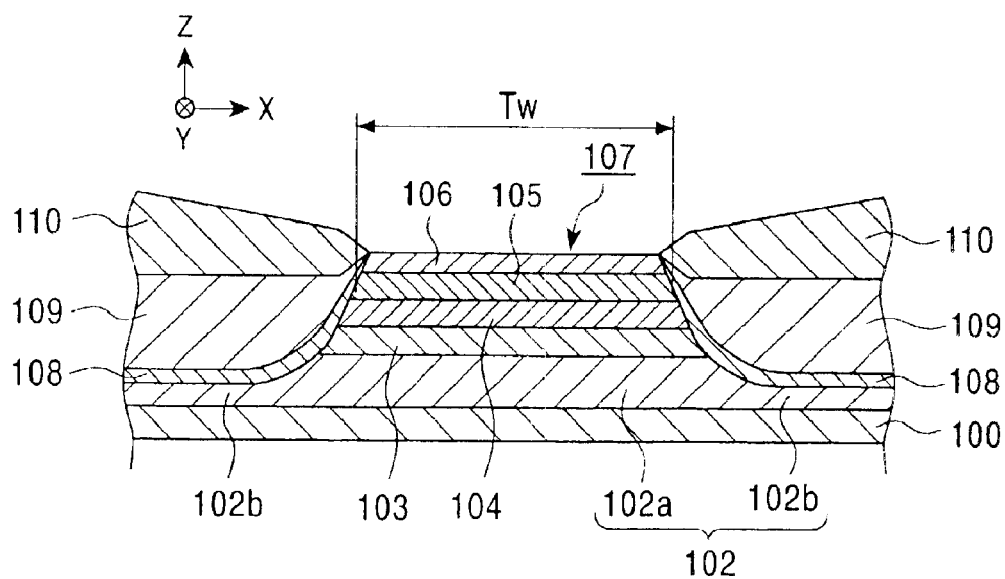
FIG. 30 is a partial cross section of another conventional magnetic sensing element viewed from an opposed face to a recording medium.

FIG. 27A is a table showing numerical relations between deposition angles of the Cr bias underlayer 33 and the X-ray diffraction (XRD) peak ratios of the [200] and [100] faces of the Co—Pt alloy layer used as the hard bias layer 34. FIG. 27B is a graphic representation of the numeral relations shown in FIG. 27A. FIG. 27C is a table showing numerical relations between the XRD peak ratios of the Co—Pt alloy layer used as the hard bias layer 34 and the coercive force (Hc) of the hard bias layer comprising the Co—Pt alloy. FIG. 27D is a graphic representation of the numeral relations shown in FIG. 27C. FIG. 28A shows the orientation of the Cr layer deposited at an angle of 20°. FIG. 28B shows an orientation of the Cr layer deposited at an angle of 50°. FIG. 28C is a multi-recording X-ray diffraction diagram showing the orientation and coercive forces of the Co—Pt alloy layer dependent on deposition angles of Cr.

The deposition angle of the bias underlayer 33 comprising the Cr layer, and the deposition angle of the hard bias layer 34 comprising the Co—Pt alloy layer are determined to be the incident angles (corresponding to θ1 and θ2 in FIG. 23, respectively) of the sputtering particles relative to the direction perpendicular to the substrate B. The deposition angle of the Co—Pt alloy layer is fixed at 20°.

When the deposition angle of Cr is 20° as shown in FIGS. 27 and 28, the Cr layer is only preferentially oriented with the [110] face in the direction perpendicular to the layer surface, besides the Co—Pt alloy layer has a small peak ratio (I([100]/[200])) between the [100] and [200] faces with a small coercive force (Hc; 136 KA/m) of the Co—Pt alloy layer.

When the deposition angle of the Cr layer is set at 50°, or when the incident angle of the Cr particles is inclined toward the substrate B side (horizontal side), the [200] and [211] faces in addition to the [110] face of the Cr layer are preferentially oriented. Consequently, the peak ratio between the [100] and [211] faces is increased to 0.15, thereby increasing the coercive force (Hc) of the Co—Pt alloy layer to 171 KA/m.

When the deposition angle of the Cr layer as the bias underlayer 33 is adjusted to 60° to incline the incident angle of the Cr particles toward the substrate B side (horizontal side), the [200] and [211] faces in addition to the [110] face of the Cr layer are preferentially oriented to increase the peak ratio (I([100]/[200])) between the [100] and [200] faces of the Co—Pt alloy layer, thereby increasing the coercive force (Hc) of the Co—Pt alloy layer to 191 KA/m.

When the deposition angle of the Cr layer is adjusted to 70° to incline the incident angle of the Cr particles toward the substrate B side (horizontal side), the [200] and [211] faces in addition to the [110] face of the Cr layer are also preferentially oriented to increase the peak ratio (I([100]/[200])) between the [100] and [200] faces of the Co—Pt alloy layer, thereby increasing the coercive force (Hc) of the Co—Pt alloy layer to 197 KA/m.

The Co—Pt alloy layer with a coercive force (Hc) of 160 KA/m or more is sufficient for practical use as the bias layer 34. It can be understood that the coercive force of the Co—Pt layer (hard bias layer 34) may be improved to a level enough for practical applications by controlling orientation states of the crystals in the Cr layer as well as in the Co—Pt alloy layer. The peak ratio (I([100]/[200])) between the [100] and [200] faces of the Co—Pt alloy layer is preferably 0.5 or more in the present invention, because a stable coercive force (Hc) of 190 KA/m or more may be obtained when the peak ratio is 0.5 or more. The deposition angle of the bias underlayer is preferably 61° or more. More preferably, the peak ratio (I([100]/[200])) is 1.0 or more. The [100] face may be preferentially oriented to the [200] face when the peak ratio is 1.0 or more to enable a large and stable coercive force of abut 195 KA/m to be obtained. The deposition angle is preferably 67° or more in this case.

The same results have been obtained by using a W (tungsten) layer as the bias underlayer 33 in place of the Cr layer, confirming that the same characteristics may be obtained so long as a layer having the bcc crystal structure is used as the bias underlayer 33. The Co—Cr—Pt alloy layer used as the hard bias layer 34 in place of the Co—Pt layer is also confirmed to exhibit similar characteristics. It is also confirmed that the favorable deposition angle of the hard bias layer is around 20°.

While the magnetic sensing element according to the present invention has been applied to the magnetic head, it is not restricted thereto, and may be applied for magnetic sensors as well.

Since the bias underlayer and bias layer are formed on the gap layer or antiferromagnetic layer in each side area of the resistive multilayer with interposition of the amorphous conductive layer without forming the bias underlayer just above the antiferromagnetic layer, the amorphous conductive layer can prevent the strong orientation characteristics of the antiferromagnetic layer from directly affecting the bias underlayer. Consequently, good characteristics of the bias layer (for example, Hc≧160 KA/m, S≧0.8) can be obtained with the bias layer having no tapered shape, thereby enabling the bias layer to comply with a narrow track width with good stability.

The bias underlayer and bias layer are laminated with interposition of the amorphous conductive layer. Since the amorphous conductive layer serves for lifting up the bias underlayer and bias layer, the bias layer formed on the bias underlayer may be elevated at a higher level in each side area of the resistive multilayer particularly in the bottom-type spin-valve magnetic sensing element, thereby enabling the bias layer to face each side of the free magnetic layer with a sufficient volume.

Even when the amorphous conductive layer is left behind on the interfaces between the resistive multilayer and bias underlayer, and between the resistive multilayer and bias layer, the remaining conductive layer does not deteriorate the characteristics of the magnetic head with no increase of junction resistance due to its conductivity.

Since the sense current flows in the vicinity of the free magnetic layer/nonmagnetic layer/pinned magnetic layer of the resistive multilayer, the output of the element can be improved without arising shunt loss.

The amorphous conductive layer is not required to be completely removed even when the amorphous conductive layer is adhered in the area where the bias underlayer and bias layer is in contact with each side area of the resistive multilayer in the process for depositing the amorphous conductive layer. Therefore, the resistive multilayer is prevented from being damaged by the etching treatment.

What is claimed is:

1. A magnetic sensing element comprising a gap layer formed on a substrate; at least an antiferromagnetic layer, a pinned magnetic layer, a nonmagnetic conductive layer and a free magnetic layer constituting a trapezoid-shaped resistive multilayer laminated on a deposition surface of the gap layer; and a bias underlayer and a bias layer laminated in each side area at an inclined face side continuously formed on each side face of the trapezoid-shaped resistive multilayer from the bottom in this order, wherein the bias underlayer comprising a bcc crystal structure is formed at a level halfway of an elevation of an inclined face of the resistive multilayer with a preferential orientation of at least one of a [211] face and [200] face in a direction perpendicular to the layer surface, and wherein an entire surface of lower face of the bias layer is in contact with the bias underlayer, the bias layer being formed with an elevation at a level of the free magnetic layer on the bias underlayer.

2. The magnetic sensing element according to claim 1, wherein the bias layer comprises a magnetic material in which a [100] face thereof is preferentially oriented in a direction perpendicular to the bias layer surface.

3. The magnetic sensing element according to claim 2, wherein the [100] face of the bias layer is preferentially oriented to the [002] face thereof.

4. The magnetic sensing element according to claim 3, wherein an X-ray diffraction peak ratio of [100]/[002] faces of the bias layer is at least 0.5.

5. The magnetic sensing element according to claim 1, wherein a thick portion of the bias layer is formed in direct contact with the free magnetic layer.

6. The magnetic sensing element according to claim 1, wherein a tapered bias underlayer creeping up each inclined face of the resistive multilayer interposes between a thick portion of the bias layer and free magnetic layer.

7. The magnetic sensing element according to claim 1, wherein the antiferromagnetic layer comprises side areas elongating in at least both sides in a track width direction of the resistive multilayer, wherein an amorphous layer is formed on each side area of the antiferromagnetic layer with the bias underlayer and bias layer sequentially formed on the amorphous layer, and wherein the bias layer is formed at a level of the free magnetic layer by being lifted up by the two layers of the amorphous layer and bias underlayer formed under the bias layer.

8. The magnetic sensing element according to claim 1, wherein each side area of the antiferromagnetic layer is formed with a thickness larger than a thickness of a track width area, and an amorphous layer is formed with a desired thickness on each side area of the antiferromagnetic layer.

9. The magnetic sensing element according to claim 1, wherein the resistive multilayer comprises the antiferromagnetic layer, pinned magnetic layer, nonmagnetic conductive layer and free magnetic layer formed from the bottom in this order, and wherein the pinned magnetic layer comprises a pair of ferromagnetic layers formed with interposition of a nonmagnetic intermediate layer, magnetic directions of a pair of the ferromagnetic layers being in an antiparallel relation with each other.

10. The magnetic sensing element according to claim 1, wherein the resistive multilayer comprises the antiferromagnetic layer, pinned magnetic layer, nonmagnetic conductive layer and free magnetic layer formed from the bottom in this order, wherein the free magnetic layer comprises a pair of ferromagnetic layers formed with interposition of a nonmagnetic intermediate layer, and wherein magnetic directions of a pair of the ferromagnetic layers are in an antiparallel relation with each other.

11. The magnetic sensing element according to claim 1, wherein a seed layer is formed between the gap layer and antiferromagnetic layer.

12. A process for manufacturing a magnetic sensing element comprising at least:

forming a resistive multilayer comprising at least an antiferromagnetic layer a pinned magnetic layer, a nonmagnetic conductive layer and a free magnetic layer on a gap layer of a substrate;

patterning the resistive multilayer into a trapezoid shape having continuous inclined faces from the antiferromagnetic layer through the free magnetic layer;

forming a bias underlayer on each side area in a track width direction of the patterned resistive multilayer having the trapezoid shape;

removing the bias underlayer to a depth halfway of the inclined face of the resistive multilayer by masking the resistive multilayer thereby leaving a residual bias underlayer; and allowing an entire surface of a lower face of a bias layer to contact the bias underlayer by laminating the bias layer on the residual bias underlayer, a thick portion of the bias layer being formed to face the free magnetic layer.

13. The process for manufacturing the magnetic sensing element according to claim 12, wherein the bias underlayer is deposited by controlling a deposition angle of the bias underlayer comprising a bcc crystal structure to an angle for preferentially orienting at least one of a [211] face and [200] face in a direction perpendicular to a surface of the bias underlayer in the process for forming the bias underlayer.

14. The process for manufacturing the magnetic sensing element according to claim 13, wherein the bias underlayer is deposited at an angle of at least 62°.

15. The process for manufacturing the magnetic sensing element according to claim 12, wherein a tapered portion of the bias underlayer formed by creeping up the inclined face of the resistive multilayer by controlling a deposition angle of the bias underlayer is completely removed in the process for forming the bias underlayer, thereby removing the bias underlayer to a depth halfway of the inclined face of the resistive multilayer.

16. The process for manufacturing the magnetic sensing element according to claim 12, wherein a tapered portion of the bias underlayer formed by creeping up the inclined face of the resistive multilayer by controlling the deposition angle of the bias underlayer is partially removed in the process for forming the bias underlayer, thereby removing the bias underlayer to a depth halfway of the inclined face of the resistive multilayer.

17. The process for manufacturing the magnetic sensing element according to claim 12, wherein the bias layer is deposited by controlling a deposition angle of the bias layer at an angle for preferentially orienting at least the [100] face in a direction perpendicular to a surface of the bias layer.

18. A magnetic sensing element comprising: a gap layer formed on a substrate; at least an antiferromagnetic layer, a pinned magnetic layer, a nonmagnetic conductive layer and a free magnetic layer constituting a resistive multilayer formed on the substrate; and bias underlayers and bias layers formed on both sides of the free magnetic layer, nonmagnetic conductive layer and pinned magnetic layer of the resistive multilayer in a track width direction, wherein the antiferromagnetic layer comprises both side areas elongating to both sides of at least the free magnetic layer, nonmagnetic conductive layer and pinned magnetic layer of the resistive multilayer in the track width direction;

wherein amorphous conductive layers are formed on both side areas of the antiferromagnetic layer, a bias underlayer of the bias underlayers and a bias layer of the bias levers being formed on each amorphous conductive layer from the bottom in this order; and the bias layer is formed at an elevation of the free magnetic layer by being lifted up by each side area of the antiferromagnetic layer, amorphous conductive layer and bias underlayer.

19. The magnetic sensing element according to claim 18, wherein the bias underlayer comprises a bcc crystal structure, at least [211] and [200] faces being oriented in a direction perpendicular to a surface of the bias underlayer.

20. The magnetic sensing element according to claim 18, wherein the bias layer comprises a magnetic material in which at least a [100] face is preferentially oriented in a direction perpendicular to a surface of the bias underlayer.

21. The magnetic sensing element according to claim 19, wherein the bias underlayer interposes between the bias layer and free magnetic layer.

22. The magnetic sensing element according to claim 18, wherein the amorphous layer comprises a nonmagnetic material.

23. The magnetic sensing element according to claim 18, wherein the amorphous conductive layer comprises a Co—T—Z alloy, wherein T is an element comprising at least Zr and Hf, and Z is an element comprising at least Ta and Nb.

24. The magnetic sensing element according to claim 18, wherein the amorphous conductive layer comprises a Ni—X alloy, wherein X is an element comprising at least P.

25. The magnetic sensing element according to claim 18, wherein each side area of the antiferromagnetic layer has a thickness smaller than the thickness of the track width area, the amorphous conductive layer being formed with a desired thickness on each side area of the antiferromagnetic layer.

26. The magnetic sensing element according to claim 25, wherein the amorphous conductive layer has a thickness of at least 60 Å and at least 300 Å.

27. The magnetic sensing element according to claim 18, wherein the resistive multilayer comprises the antiferromagnetic layer, pinned magnetic layer, nonmagnetic conductive layer and free magnetic layer from the bottom in this order, and wherein the pinned magnetic layer comprises a pair of ferromagnetic layers formed with interposition of a nonmagnetic intermediate layer, magnetization directions of the pair of the ferromagnetic layers are in an antiparallel relation with each other.

28. The magnetic sensing element according to claim 18, wherein a seed layer is formed between the gap layer and antiferromagnetic layer.

29. The magnetic sensing element according to claim 18, wherein the resistive multilayer comprises the antiferromagnetic layer, pinned magnetic layer, nonmagnetic conductive layer and free magnetic layer, and wherein the free magnetic layer comprises a pair of ferromagnetic layers formed with interposition of nonmagnetic intermediate layers, magnetization directions of the pair of the ferromagnetic layers being in an antiparallel relation with each other.

* * * * *

UNITED STATES PATENT AND TRADEMARK OFFICE
CERTIFICATE OF CORRECTION

PATENT NO. : 6,888,706 B2
DATED : May 3, 2005
INVENTOR(S) : Masahiro Ooshima

It is certified that error appears in the above-identified patent and that said Letters Patent is hereby corrected as shown below:

<u>Column 43,</u>
Line 7, before "being formed on each" delete "levers" and substitute -- layers --.

Signed and Sealed this

Sixth Day of June, 2006

JON W. DUDAS
*Director of the United States Patent and Trademark Office*